(12) United States Patent
Fukui et al.

(10) Patent No.: US 7,591,921 B2
(45) Date of Patent: Sep. 22, 2009

(54) HEAT-DECAYING MATERIALS, TRANSFER SHEET USING THE SAME, AND PATTERNING METHOD

(75) Inventors: Hiroji Fukui, Osaka (JP); Toshio Enami, Osaka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 672 days.

(21) Appl. No.: 10/532,747

(22) PCT Filed: Nov. 26, 2003

(86) PCT No.: PCT/JP03/15104

§ 371 (c)(1),
(2), (4) Date: Apr. 26, 2005

(87) PCT Pub. No.: WO2004/050762

PCT Pub. Date: Jun. 17, 2004

(65) Prior Publication Data

US 2005/0276934 A1   Dec. 15, 2005

(30) Foreign Application Priority Data

| Nov. 29, 2002 | (JP) | ............................. 2002-349192 |
| Nov. 29, 2002 | (JP) | ............................. 2002-349194 |
| Nov. 29, 2002 | (JP) | ............................. 2002-349195 |
| Feb. 3, 2003 | (JP) | ............................. 2003-026330 |
| Feb. 26, 2003 | (JP) | ............................. 2003-049842 |
| Nov. 25, 2003 | (JP) | ............................. 2003-394620 |

(51) Int. Cl.
*B29C 63/00* (2006.01)
*B41M 5/00* (2006.01)
*B44C 1/17* (2006.01)
*G03G 7/00* (2006.01)

(52) U.S. Cl. .................. 156/344; 428/32.6; 428/195.1; 428/343

(58) Field of Classification Search ................. 156/344; 428/32.6, 195.1, 343
See application file for complete search history.

(56) References Cited

U.S. PATENT DOCUMENTS 7,195,720 B2 * 3/2007 Sakaguchi .................. 252/500

FOREIGN PATENT DOCUMENTS

JP    9-77966 A    3/1997

(Continued)

OTHER PUBLICATIONS

JP 2001-302936 A, Shunji et al., (Sekisui Chemical Company Ltd.), Oct. 31, 2001—Machine Translation of Abstract section.*

(Continued)

*Primary Examiner*—Bruce H Hess
*Assistant Examiner*—David J Joy
(74) *Attorney, Agent, or Firm*—Sughrue Mion, PLLC

(57) ABSTRACT

Provided is a heat-decaying material that hardly deteriorates and decomposed at ordinary service temperatures, but decays within a short period of time when heated at relatively low temperatures. This comprises a polyoxyalkylene resin as the principal ingredient thereof, and has an oxygen atom content of from 15 to 55% by mass. When heated at a predetermined temperature falling between 150 and 350° C., at least 95% by mass of the material decays within 10 minutes. The heat-decaying material has many applications for production of porous materials, conductive particles transfer sheets, transfer sheets for circuit formation, pattern formation, etc.

33 Claims, 17 Drawing Sheets

FOREIGN PATENT DOCUMENTS

| | | |
|---|---|---|
| JP | 9-194548 A | 7/1997 |
| JP | 10-178255 A | 6/1998 |
| JP | 11-168123 A | 6/1999 |
| JP | 11-217458 A | 8/1999 |
| JP | 11-293207 A | 10/1999 |
| JP | 2000-355618 A | 12/2000 |
| JP | 2001-247849 A | 9/2001 |
| JP | 2001-302936 A | 10/2001 |
| JP | 2002-76203 A | 3/2002 |
| JP | 2002-88267 A | 3/2002 |
| JP | 2002-236357 A | 8/2002 |
| JP | 2003-89742 A | 3/2003 |
| JP | 2003-206584 A | 7/2003 |
| JP | 2003-313443 A | 11/2003 |
| JP | 2004-2549 A | 1/2004 |

OTHER PUBLICATIONS

JP 2001-302936 A, Shunji et al., (Sekisui Chemical Company Ltd.), Oct. 31, 2001—Machine Translation of Written Description section.*

JP 2001-302936 A, Shunji et al., (Sekisui Chemical Company Ltd.), Oct. 31, 2001—Machine Translation of Claims section.*

International Search Report dated Feb. 24, 2004.

* cited by examiner (a)

(b)

(c)

(d)

HEAT-DECAYING MATERIALS, TRANSFER SHEET USING THE SAME, AND PATTERNING METHOD

TECHNICAL FIELD

The present invention relates to a heat-decaying material, a transfer sheet using the same, and a patterning method. In particular, the invention relates to a heat-decaying material that hardly deteriorates and decomposes at ordinary service temperatures but can decay within a short period of time when heated at relatively low temperature, and to its use.

BACKGROUND ART

Heretofore, adhesive tapes are stuck to surfaces for temporary fixation in predetermined positions of parts to be bonded together or parts to be bonded to housings or parts to be bonded to substrates in assembly processes, or for protection of surfaces that are readily scratched during working or conveyance. However, when adhesive tapes are used for such temporary fixation or surface protection, there are some problems in that peeling them is often difficult and, when they are peeled, the objects may be scratched or paste may remain on the objects.

Recently, vehicles, electric appliances for household use and building materials have become recycled, and structures bonded with adhesive are also desired to be recycled. In general, resin adhesives may readily melt or decompose when heated at 400° C. or higher, and the structures bonded with them may be thereby readily dismantled. However, when heated at such high temperatures, the structures themselves would be deteriorated and denatured, and it causes a problem in that the dismantled structures could not be recycled.

A transfer sheet with an adhesive sheet is utilized as an efficient transfer method, since multiple parts disposed on the sheet may be transferred all at a time. In addition, the adhesive sheet acts also as a reinforcing material for the parts to be transferred, and, for example, it enables transfer of even brittle parts such as ultra-thin semiconductor wafers and semiconductor chips with no damage thereto. In this, the transfer sheet must have a high adhesive force to objects before they are transferred, and must readily release them when they are transferred.

To that effect, adhesive sheets that have a high adhesive force for the necessary period of time but, on the other hand, may be readily peeled from objects when the objects are to be released from them are needed in many applications.

As the adhesive sheets of the type, those capable of reducing their adhesive force when some stimulation is applied to the adhesive matter thereof are known, and they include, for example, heat-foaming adhesive sheets, thermosetting adhesive sheets, photocurable adhesive sheets. However, even when these adhesive sheets are used, their adhesive force that may be reduced is limited, and, in fact, some adhesive sheets could not have a sufficiently high adhesive force before transfer, or some others could not sufficiently reduce their adhesive force in transfer.

Patent Reference 1 discloses a heat-decaying adhesive sheet that may decay by at least 95% of the sheet weight when heated at 700° C. or lower for 30 minutes or shorter. When the heat-decaying adhesive sheet is used, then the sheet itself may be removed when heated. However, Patent Reference 1 says that the heat-decaying adhesive sheet is resistant to explosion-proofing treatment of Brawn tubes, and does not decay even when heated at 450 to 550° C. for a short period of time. From this, it is considered that the sheet may take ten and a few minutes before it decays at a temperature of 450° C. or lower. It is considered that the long-term heating at such high temperatures may cause deterioration and denaturation of objects.

Further, Patent Reference 2 discloses a binder for ceramic shaping, which comprises a water-soluble polyalkylene glycol, a novel combed hydrophobic diol and a polyisocyanate, and which is such that its heat generation in degreasing is slow, the amount of its heat generation is small and the degree of carbon residue from it is small. However, the binder resin disclosed in Patent Reference 2 is an urethane resin obtained through reaction of diol and isocyanate, and, therefore, its decomposition residue may be small but it is problematic in that it leaves an yellowed residue that may be an oxide derived from the urethane bond. Accordingly, clean surfaces are often difficult to obtain in some cases.

Heretofore, various porous films are used for forming interlayer insulating films in semiconductor devices and multi-level wiring boards. For shortening the signal transmission delay time, it is desired that the interlayer insulating films of the type are formed of an insulating material having a low dielectric constant. To satisfy the requirement, Patent Reference 3 to be mentioned below discloses a method for producing a porous film by thermally processing a film of a uniformly-dissolved composite material that comprises a partially-hydrolyzed condensate of an alkoxysilane and a fluororesin having a carboxylic acid group in the molecule and having a fluorine-containing aliphatic cyclic structure or a fluorine-containing aliphatic structure in the backbone chain thereof, at a temperature not lower than the thermal decomposition-initiating temperature of the fluororesin.

However, according to the production method described in Patent Reference 3, a large number of pores are formed through the thermal treatment effected at a temperature not lower than the thermal decomposition-initiating temperature of the above-mentioned specific fluororesin, and the porous film is thereby produced. Accordingly, an $SiO_2$-based porous material having such a large number of holes formed therein is obtained, and it is said that the film obtained has a low dielectric constant.

When the size of the pores in a porous film is enlarged in some degree, then the dielectric constant of the film may be further lowered. However, according to the method described in Patent Reference 3, it is difficult to form uniform pores. In addition, there is still another problem in that, when the fluororesin is thermally decomposed, it gives a residue, and therefore the dielectric constant of the film could not be fully reduced.

In addition, since the film has a large number of pores, its mechanical strength is significantly problematic.

Further, regarding the formation of interlayer insulating films in semiconductor devices, they are formed after the formation of elements on semiconductor substrates, and therefore, when the semiconductor substrates with elements thereon are exposed to high temperatures for a long period of time, then the elements may be deteriorated. Accordingly, it is desired to develop interlayer insulating films capable of being formed at low temperatures.

Recent ICs and LSIs are to have much more increased degree of integration and are to be much more micropatterned, and more than these, high-density packaging techniques are greatly developing. In addition, electronic system integration techniques are much desired, which are for integrating and systemizing various functional blocks such as optical devices and high-frequency devices that comprise multiple LSIs and compound semiconductors, for example, for system-in-packages.

Heretofore, for connecting semiconductor chips of IC or LSI on an electronic circuit boards, employed is a method of covering the semiconductor chip with a resin package and soldering the tip of the lead that runs from the resin package, on a printed board. In this method, however, all leads must be soldered one by one and the production efficiency is not good. In addition, the lead runs out from the side of the resin package, and the method is therefore unsuitable to high-density packaging. To solve these problems, a technique of BGA (ball grid array) has been developed, which comprises bonding semiconductor chips to a wiring board by conductive fine particles such as solder balls or bumps. According to this technique, chips are bonded to a substrate while the conductive fine particles bonded to the chips or the electrodes of the substrate are melted at high temperatures, and therefore electronic circuits may be constructed while satisfying both increased producibility and increased bonding reliability.

For bonding such conductive fine particles to electrodes, heretofore employed is a method of making multiple conductive fine particles sucked by a suction pad having multiple vacuum suction nozzles, and putting the conductive fine particles on multiple electrodes all at a time, and bonding them to the electrodes. In this case, in general, the electrode face of the electronic parts is previously coated with an organic acid ester. The organic acid ester is effective for removing the spontaneous oxide film formed on the electrode surface and for facilitating the capture of the conductive fine particles. However, the conductive fine particles thus put on the electrode are still problematic in that they may shift from the electrode while conveyed to the next step.

In the method of disposing conductive fine particles by the use of vacuum suction nozzles, the conductive fine particles must be sucked by all the vacuum suction nozzles, but suction failures may occur and the method is not always a sure method. In addition, since the conductive fine particles are only sucked, they may drop off if the operation speed is increased. Further, since the electrode position for electronic parts differs for every electronic part, and the method has still another problem in that vacuum suction nozzles corresponding to all electronic parts must be developed.

Different from this, another method has been proposed, which comprises disposing conductive fine particles on electrodes by the use of a conductive particles transfer sheet that has conductive fine particles previously disposed on an adhesive sheet. Concretely, the method comprises applying a conductive particles transfer sheet to electronic parts in such a manner that the position of the conductive fine particles corresponds to the position of the electrode, then melt-bonding the conductive fine particles to the electrode, and thereafter peeling the adhesive sheet. In this case, when the adhesive used in the adhesive sheet is a specific one capable of reducing its adhesive force by imparting specific energy thereto, then the adhesive sheet may be readily peeled off not breaking the connection of the conductive fine particles once melt-bonded to the electrodes. For the adhesive sheet of the type, for example, a heat-foaming adhesive sheet, a thermosetting adhesive sheet and a photocurable adhesive sheet have been proposed.

In fact, however, even when such an adhesive sheet is used, its adhesive force that may be reduced is limited, and the connection of some conductive fine particles may be broken when the adhesive sheet is peeled off, or an adhesive paste may remain on the surface of the conductive fine particles. In particular, when the peeling speed is increased so as to increase the working efficiency, then this tendency becomes remarkable. On the other hand, if the adhesive force of the adhesive sheet is made low, then this causes another problem in that the conductive fine particles may drop off.

On the other hand, there is proposed still another method of using an adhesive sheet with conductive fine particles embedded in the position opposite to the electrodes to be bonded, and disposing the conductive fine particles on the surface of the electrodes and bonding them (for example, see Patent Reference 4). However, when kept under severe conditions, for example, when kept in high-temperature high-humidity environments or dipped in solvent, the resin to constitute the adhesive sheet may be deteriorated or deformed and, as a result, the embedded electroconductive fine particles may receive some stress that acts to separate the particles from the electrode face. Accordingly, the method of not using the adhesive sheet is better in the current situation for ensuring high bonding reliability.

In such high-density packaging techniques, the most important elementary technique is a fine bonding technique. Heretofore, one typical bonding technique for it is a bump-bonding technique. With the development of the above-mentioned packaging technique, further increase in the accuracy in the bump bonding technique is to be an important theme in the art. However, the related art has various problems as mentioned above, and a technique of fully ensuring high producibility and high bonding reliability in bump formation on electrodes of electronic parts is now greatly desired.

With the recent development of portable information terminals and popularization of mobile computing of carrying and using portable computers, electronic appliances are further down-sized more and more. The circuit boards to be built in these electronic appliances are desired to be much more down-sized and thin-sized. In addition, with the popularization of electronic appliances that are required to satisfy high-speed operation, such as communication appliances, desired are circuit boards suitable to high-speed operation that enables accurate switching to high-frequency signals. In such circuit boards, it is desired to shorten the wiring length and to reduce the wiring width and the wiring distance for the purpose of shortening the time necessary for electric signal propagation. To that effect, circuit boards are desired to have an increased wiring density so as to attain high-density packaging thereon, in accordance with the recent tendency toward down-sized and high-speed-operable electronic appliances.

Various production methods have heretofore been proposed for circuit boards. One method recently proposed comprises pressure-bonding an adhesive tape prepared by forming a metal foil circuit pattern on the surface thereof (circuit transfer tape) to an insulating substrate to thereby embed the circuit pattern into the insulating substrate, and thereafter peeing the adhesive tape from the circuit pattern so as to transfer the circuit pattern onto the insulating substrate.

The above-mentioned production method is described with reference to FIG. 10. As in FIG. 10(a), a circuit transfer tape 2101 is prepared. The circuit transfer tape 2101 comprises an adhesive tape 2102 and a metal layer 2103 to form a circuit pattern on its surface. After this is positioned to an insulating substrate 2104, the two are bonded to each other. The insulating substrate 2104 is a semi-cured prepreg. In this case, the two are bonded in a mode of thermal pressure bonding, for example, under a pressure of 100 kg/cm² or so, and as in FIG. 10(b), a part or all of the metal layer 2103 is embedded and fixed in the insulating substrate 2104.

Next, as in FIG. 10(c), the adhesive tape 2102 is peeled from the insulating substrate 2104, whereby a metal layer 2103 having a circuit pattern is transferred onto the insulating substrate 2104 to form a single-layered circuit board. Further, if desired, the insulating substrate 2104 is completely cured.

A multi-layered circuit board may be formed by laminating the above-mentioned single-layered circuit boards.

However, when the metal layer 2103 is transferred onto the insulating substrate 2104, the adhesive component of the adhesive tape 2102 is contacted with the insulating substrate 2104 and the adhesive tape 2102 is often difficult to peel from the insulating substrate 2104. In particular, when a fine circuit pattern is transferred and when the adhesive tape 2102 strongly adheres to the insulating substrate 2104, then the semi-cured insulating substrate 2104 may be deformed while the adhesive tape 2102 is peeled off, whereby the wiring distance of the metal layer 2103 may be disordered and the wiring planarity may be lost, or that is, the circuit pattern may be disordered, and, in addition, the embedded metal layer 2103 may be peeled off along with the adhesive tape 2102.

To solve the problems as above, Patent Reference 5 discloses a method for producing a circuit board, which comprises using a circuit transfer tape with a layer of a photocrosslinkable adhesive component having high adhesiveness formed thereon, and in which the circuit transfer tape is exposed to light from the side of the circuit pattern thereof so as to lower the adhesive force of the tape on the side with no circuit pattern formed thereon, and therefore even when the adhesive component of the circuit transfer tape is contacted with an insulating substrate, it does not adhere to the insulating substrate and the circuit pattern can be thereby well transferred onto the insulating substrate with no pattern disturbance.

However, even when the photocrosslinkable adhesive is crosslinked through exposure to light as in Patent Reference 5, the reduction in the adhesive force owing to the light irradiation is limited, and when a microfine and high-density circuit pattern is transferred onto an insulating substrate, then the circuit pattern may be often broken when the transfer tape is peeled off. In addition, when a circuit pattern having an extremely narrow line width is transferred onto an insulating substrate, then the circuit transfer tape must be exposed to light from the side of the adhesive tape so as to lower the adhesive force between the metal foil and the photocrosslinkable adhesive. In this case, therefore, the light exposure step must be carried out many times repeatedly, and this is problematic in that the production efficiency (producibility) and the workability are thereby lowered.

At present, in production of semiconductor devices, a resist pattern is formed through photolithography, and various materials of conductor films, semiconductor films or insulator films for semiconductor devices are patterned through etching via the resist pattern serving as a mask (for example, see Non-Patent Reference 1). In addition, the resist pattern is used as a mask for plating, and a metal film of copper (Cu) or gold (Au) may be patterned. The patterning process through such photolithography is at present the most popular process in patterning not only for production of semiconductor devices but also for production of any other various display devices or micromachines.

Patterning through photolithography is described with reference to FIG. 16 and FIG. 17. FIG. 16 and FIG. 17 are cross-sectional views showing a process scheme of forming a resist pattern through photolithography and forming a pattern on an insulator film by the use of the resist pattern serving as an etching mask.

As in FIG. 6(*a*), an insulator film 3102 of silicon oxide is formed on a semiconductor substrate 3101 with various semiconductor elements (not shown) formed thereon, and a resist film 3103 is formed on the insulator film 3102 in a coating process of photolithography. In this, the resist film 3103 is formed of a photosensitive resin, and its formation is as follows: Concretely, a polymer of a photosensitive resin composition or the like is dissolved in a solvent to prepare a resist coating solution, and this is applied onto a semiconductor wafer, the insulator film 3102 formed on the semiconductor substrate 3101 in a mode of spin coating. After thus spin-coated, this is prebaked at a temperature not higher than 100° C. so as to vaporize away the unnecessary solvent. In that manner, the resist film 3103 is formed.

Next, as in FIG. 16(*b*), using a reticle 3106 that comprises a quartz glass substrate 3104 and a masking pattern 3105 formed on its surface, as a photomask for exposure in photolithography, the resist film 3103 is exposed to light 3107 in an ordinary reduction projection exposure manner for pattern exposure transfer to it. In that manner, an optical pattern transfer region 3103a is formed in a predetermined region of the resist film 3103. Next, this is heat-treatment for PEB (post exposure baking). The recent exposure light 3107 is an ArF excimer laser (wavelength: about 193 nm), and the resist film 3103 is a chemical amplification-type resist.

Next, for development in photolithography, the semiconductor substrate 3101 that is in a semiconductor wafer condition is dipped in a developer. If desired, this may be exposed to shower of a developer. In that manner, the optical pattern transfer region 3103a is removed through the development to form a resist pattern, as in FIG. 16(*c*). Further, this is post-baked at a temperature of 120° C. or so, thereby forming a resist mask 3108 on the insulator film 3102. This is a case where the resist is a positive resist. The other case where the resist is a negative resist is contrary to it, in which the optical pattern transfer region 3103a remains through the development and the other region is removed.

Next, using the resist mask 3108 as an etching mask, the insulator film 3102 is dry-etched by the use of plasma, as in FIG. 17. With that, an opening 3109 is formed in the insulator film 3102.

Next, the resist mask is stripped off. As in FIG. 17(*b*), the resist mask 3108 is ashed away in oxygen ($O_2$) plasma. In that manner, a pattern of the insulator film 3102 having the opening 3109 is formed. In this, the opening 3109 is generally to be a via-hole for wiring interconnection via the insulator film 3102 that serves as a wiring interlayer insulation film.

Recently, the pattern dimension in patterning semiconductor devices has become significantly micro-sized to a level of 100 nm or less. With the advanced micropatterning technology, semiconductor devices are therefore much more improved to have an increased degree of integration and to be multi-functional high-performance devices.

However, the above-mentioned micropatterning technique in the above-mentioned photolithography technology requires the above-mentioned high-level techniques of coating, exposure, development and stripping, and it increases the production costs in the process of patterning semiconductor devices.

Heretofore, the above-mentioned coating, exposure and development steps for resist mask formation through photolithography constitute the basis of photolithography, and even when the technique for these steps cold be improved individually, the basic constitution of the series of these techniques would not change. The same may apply also to the step of stripping a resist mask as above. Improving these techniques to higher-leveled ones inevitably brings about the increase in the cost for patterning. Accordingly, it is desired to develop a novel technique that basically differs from conventional techniques in that it satisfies both high-level micropatterning technology and reduced production costs.

| | |
|---|---|
| [Patent Reference 1] | JP-A 11-293207 |
| [Patent Reference 2] | JP-A 2000-355618 |
| [Patent Reference 3] | JP-A 11-217458 |
| [Patent Reference 4] | JP-A 11-168123 |
| [Patent Reference 5] | JP-A 10-178255 |

[Non-Patent Reference 1] *Semiconductor Handbook,* 2nd Ed., edited by Semiconductor Handbook Edition Association, published by Ohm, May, 25, 1994, pp. 198-199.

In consideration of the current situation as above, an object of the present invention is to provide a heat-decaying material which hardly deteriorates or decomposes at ordinary service temperatures but which may decay within a short period of time when heated at relatively low temperatures.

Another object of the invention is to solve the above-mentioned drawbacks in the related art and to provide a method for producing a porous film in which sufficiently large pores may be formed uniformly and the material to form the holes do not remain, and also to provide a porous film obtained according to the production method.

Further, the invention has been made in consideration of the current situation as above, and its object is to provide a transfer sheet that has the following advantages: Using it, conductive fine particles may be disposed on the electrodes of electronic parts not being shifted or dropped from it; or multiple conductive fine particles may be surely and readily melt-bonded to the electrodes of electronic parts, all at a time thereon. Even when the line width of circuit patterns is thinned, the circuit pattern may be transferred onto a semi-cured insulating substrate or a ceramic green sheet, not being disordered. Accordingly, using the transfer sheet makes it possible to obtain high-density and high-accuracy micropatterned wiring circuit boards.

Still another object of the invention is to provide a novel technique for patterning so as to provide a patterning method that makes it possible to simplify the above-mentioned series of techniques and to reduce the costs of the patterning technique.

DISCLOSURE OF THE INVENTION

Specifically, the invention is as follows:

(1) A heat-decaying material comprising a polyoxyalkylene resin as the principal ingredient thereof, which has an oxygen atom content of from 15 to 55% by mass and of which at least 95% by weight decays within 10 minutes when heated at a predetermined temperature falling between 150 and 350° C.

(2) The heat-decaying material of above (1), wherein the polyoxyalkylene resin is polyoxypropylene, polyoxyethylene, polyoxytetramethylene, or a mixed resin of polyoxypropylene, polyoxyethylene and/or polyoxytetramethylene.

(3) The heat-decaying material of above (2), wherein the polyoxypropylene content of the mixed resin is at least 50% by mass.

(4) The heat-decaying material of any of above (1) to (3), wherein the polyoxyalkylene resin has a number-average molecular weight of from 500 to 5,000,000.

(5) The heat-decaying material of any of above (1) to (4), which contains a decomposition promoter.

(6) The heat-decaying material of above (5), wherein the decomposition promoter is a peroxide.

(7) The heat-decaying material of above (5), wherein the decomposition promoter is an azo compound.

(8) The heat-decaying material of above (5), wherein the decomposition promoter is tin oxide.

(9) The heat-decaying material of any of above (1) to (4), which contains a decomposition retardant.

(10) The heat-decaying material of above (9), wherein the decomposition retardant is any of a mercapto compound, an amine compound, an organic tin, or an organic boron.

(11) The heat-decaying material of any of above (1) to (10), which decays when heated in an oxygen-containing atmosphere at a predetermined temperature falling between 150 and 300° C.

(12) The heat-decaying material of any of above (1) to (10), which decays when heated in an anaerobic atmosphere at a predetermined temperature falling between 150 and 350° C.

(13) The heat-decaying material of any of above (1) to (12), which decays when heated under reduced pressure within 5 minutes at a predetermined temperature falling between 150 and 350° C.

(14) A heat-decaying material of a heat-decaying sheet which is composed of the heat-decaying material of any of above (1) to (13) and which keeps its sheet form at a temperature of 100° C. or lower.

(15) The heat-decaying material of above (14), wherein the polyoxyalkylene resin is not crosslinked and has a number-average molecular weight of from 5000 to 5,000,000.

(16) The heat-decaying material of above (14), wherein the heat-decaying sheet contains a crosslinked polyoxyalkylene resin.

(17) The heat-decaying material of above (16), wherein the crosslinked polyoxyalkylene resin is formed by crosslinking a crosslinkable functional group-having polymer that contains segments of a crosslinkable functional group-having polyalkylene glycol or polyoxyalkylene, with a crosslinking agent.

(18) The heat-decaying material of above (14), wherein the heat-decaying sheet contains an uncrosslinked polymer that contains segments of an uncrosslinked polyalkylene glycol or polyoxyalkylene.

(19) The heat-decaying material of any of above (14) to (18), wherein the heat-decaying sheet is reinforced with a substrate.

(20) A heat-decaying material comprising the heat-decaying material of any of above (1) to (13), which contains a crosslinkable functional group-having polymer that contains segments of a crosslinkable functional group-having polyoxyalkylene glycol or polyoxyalkylene, and a crosslinking agent, and which has a viscosity at 20° C. of from 1 to 5,000,000 mPa•s.

(21) The heat-decaying material of above (20), which contains at most 30% by mass of a polymerizable unsaturated group-having compound.

(22) The heat-decaying material of above (20), which has a viscosity at 20° C. of from 1 to 100 mPa•s.

(23) The heat-decaying material of above (20), which has a viscosity at 20° C. of from 500 to 100,000 mPa•s.

(24) The heat-decaying material of above (20), which has a viscosity at 20° C. of from 20 to 1000 mPa•s.

(25) The heat-decaying material of above (17) or (20), wherein the crosslinkable functional group is at least one selected from a hydrolyzing silyl group, an isocyanate group, an epoxy group, an oxetanyl group, an acid anhydride group, a carboxyl group, a hydroxyl group, and a polymerizable unsaturated hydrocarbon group.

(26) The heat-decaying material of any of above (14) to (19), which decays in a temperature atmosphere falling between 150 and 220° C.

(27) The heat-decaying material of any of above (14) to (19), which decays in a temperature atmosphere falling between 220 and 280° C.

(28) The heat-decaying material of any of above (14) to (19), which decays in a temperature atmosphere falling between 280 and 350° C.

(29) The heat-decaying material of any of above (20) to (24), wherein the cured product of the material decays in a temperature atmosphere falling between 150 and 220° C.

(30) The heat-decaying material of any of above (20) to (24), wherein the cured product of the material decays in a temperature atmosphere falling between 220 and 280° C.

(31) The heat-decaying material of any of above (20) to (24), wherein the cured product of the material decays in a temperature atmosphere falling between 280 and 350° C.

(32) A method for producing a porous material, which comprises:

a step of preparing a precursor that contains a skeleton-forming crosslinkable material (a) and the heat-decaying material (b) of above (1) that comprises a polyoxyalkylene resin as the principal ingredient thereof and decomposes and evaporates when heated;

a step of heating the precursor at a temperature not lower than the temperature at which the heat-decaying material (b) decays under heat;

a step of crosslinking the crosslinkable material before or during the heating to form a skeleton phase, and in which the heat-decaying material (b) decays in the crosslinked material to give a porous material having a large number of pores surrounded by the skeleton phase.

The method for producing a porous material as above, wherein the heating is effected at a temperature falling between 150 and 350° C. for a heating time of 10 minutes or less.

The method for producing a porous material as above, wherein the crosslinkable material (a) for forming the skeleton is an alkoxysilane, and the step of crosslinking the crosslinkable material to form the skeleton phase comprises condensing the alkoxy silane to form an inorganic silane compound phase.

The method for producing a porous material as above, wherein the amount of the heat-decaying material (b) to be used is from 5 to 1000 parts by weight relative to 100 parts by weight of the skeleton-forming crosslinkable material (a).

The method for producing a porous material as above, wherein the precursor is a composite prepared through partial hydrolysis condensation of the skeleton-forming crosslinkable material (a), and the composite is applied onto the substrate to be processed and then this is heated.

The method for producing a porous material as above, wherein the substrate to be processed is a semiconductor substrate with semiconductor elements formed thereon, and the porous material is formed as an interlay insulating film between the wiring layers that connect the semiconductor elements.

The method for producing a porous material as above, wherein the heating of the precursor is effected in two stages, a first heating, and a second heating at a temperature higher than the temperature in the first heating.

A porous material obtained according to the production method as above.

An electronic part with the porous material as a porous film, in which the porous film serves as an interlayer insulating film.

(33) A transfer sheet constructed by adhering a transfer object on a heat-decaying adhesive resin layer that comprises the heat-decaying material of above (1).

The transfer sheet as a conductive particles transfer sheet, which has conductive fine particles adhered to and disposed on a heat-decaying adhesive resin sheet.

The conductive particles transfer sheet, wherein the conductive fine particles are embedded in the heat-decaying adhesive resin sheet from its top face toward its back face.

The conductive particles transfer sheet, wherein the conductive fine particles are for bump-bonding between electrodes of an electronic part, and are melt-bonded on the electrodes.

The conductive particles transfer sheet, wherein the electronic part is a semiconductor chip, a resin-encapsulated semiconductor device or a wiring board.

The conductive particles transfer sheet, wherein the conductive fine particles have solder at least on their surface.

The conductive particles transfer sheet, wherein the conductive fine particles are to form solder ball bumps in BGA packages.

The conductive particles transfer sheet, wherein the conductive fine particles are to from bumps on semiconductor chips.

A method for bonding conductive fine particles to the electrode face of electronic parts, which comprises attaching a conductive particles transfer sheet to electronic parts where conductive fine particles are disposed on the heat-decaying adhesive sheet comprising the heat-decaying material of above (1) in such a manner that the conductive fine particles could be in contact or in no contact with the position of the electrodes of the electronic parts, then melting and bonding the conductive fine particles to the electrodes of the electronic parts, and heating the resulting structure to decay the heat-decaying adhesive sheet.

A method for bonding conductive fine particles to electrodes, which comprises casting a paste of the heat-decaying material of above (1) on the surface of electronic parts with electrode face formed thereon, to thereby form a heat-decaying resin layer on them, disposing and bonding conductive fine particles to the electrode face via the heat-decaying resin layer, then melting and bonding the conductive fine particles to the electrodes of the electronic parts, and heating the resulting structure to decay the heat-decaying adhesive sheet.

A method for bonding conductive fine particles to electrodes, which comprises applying a solution that contains a composition of the heat-decaying material of above (1) to the surface of electronic parts with electrode face formed thereon, forming a heat-decaying resin layer from the coating film, disposing and bonding conductive fine particles to the electrode face via the heat-decaying resin layer, then melting and bonding the conductive fine particles to the electrodes of the electronic parts, and heating the resulting structure to decay the heat-decaying adhesive sheet.

The method for bonding conductive fine particles to electrodes as above, wherein a solution that contains the heat-decaying adhesive resin composition is applied to form the coating film, and then the coating film is exposed to UV ray to form the heat-decaying resin layer.

The method for bonding conductive fine particles to electrodes as above, wherein recesses are formed in a predetermined region of the heat-decaying adhesive sheet or the heat-decaying resin layer through exposure to laser rays, and the conductive fine particles are bonded to and disposed in the recesses.

The method for bonding conductive fine particles to electrodes as above, wherein the electronic parts are semiconductor chips, resin-encapsulated semiconductor devices or wiring boards.

The method for bonding conductive fine particles to electrodes as above, wherein the conductive fine particles have solder on at least their surface.

The method for bonding conductive fine particles to electrodes as above, wherein the conductive fine particles have solder on at least their surface, and the melt-bonding of the conductive fine particles and the decaying of the heat-decaying adhesive sheet or the heat-decaying adhesive resin are simultaneously effected under heat at a solder reflow temperature.

The transfer sheet as above, wherein the part to be transferred is an electrode pattern.

The transfer sheet as above, which is a transfer sheet for circuit formation and which comprises:

the heat-decaying material of above (1) that decomposes under heat, or an adhesive sheet formed of the heat-decaying material of above (1); and a circuit pattern formed on the surface of the adhesive sheet.

The transfer sheet as above, which is a transfer sheet for circuit formation and which comprises:

the heat-decaying material of above (1) that decomposes under heat, or an adhesive sheet formed of the heat-decaying material of above (1); and a metal foil or conductive paste layer formed on the surface of the adhesive sheet.

The transfer sheet for circuit formation as above, wherein the adhesive sheet loses its solid form through decomposition.

A transfer sheet for circuit formation, which comprises:

an adhesive sheet having a laminate structure of the heat-decaying material of above (1) that decomposes under heat and a non-heat-decaying resin not decomposing under heat; and a circuit pattern, a metal foil or a conductive paste layer formed on the surface of the heat-decaying material.

A transfer sheet for circuit formation, which comprises:

an adhesive sheet formed of a mixture of the heat-decaying material of above (1) that decomposes under heat and a non-heat-decaying resin not decomposing under heat; and a circuit pattern, a metal foil or a conductive paste layer formed on the surface of the adhesive sheet.

A transfer sheet for circuit formation, which comprises:

an adhesive sheet formed of a mixture of plural heat-decaying materials of above (1) that differ in point of the thermal decomposition temperature;

a circuit pattern, a metal foil or a conductive paste layer formed on the surface of the adhesive sheet.

The transfer sheet for circuit formation as above, wherein the solid form of the adhesive sheet changes under heat and the sheet thereby separates from the circuit pattern, the metal foil or the conductive paste layer.

The transfer sheet for circuit formation as above, wherein the heat-decaying material of above (1) further contains a crosslinkable resin component that crosslinks through energy stimulation thereto.

The transfer sheet for circuit formation as above, wherein the adhesive sheet is formed by crosslinking and curing the heat-decaying material component of above (1) through exposure to UV rays or electron rays.

A method for producing a circuit board by using the transfer sheet for circuit formation as above, which comprises:

a step of pressing an insulating substrate or a ceramic green sheet against the circuit pattern of the transfer sheet so as to bond or embed the circuit pattern to or in the insulating substrate or the ceramic green sheet; and a step of thermally decomposing the heat-decaying material to thereby transfer the circuit pattern onto the insulating substrate or the ceramic green sheet.

A method for producing a circuit board by using the transfer sheet for circuit formation as above, which comprises:

a step of patterning the metal foil or the conductive paste layer of the transfer sheet for circuit formation to form a circuit pattern;

a step of pressing an insulating substrate or a ceramic green sheet against the circuit pattern so as to bond or embed the circuit pattern to or in the insulating substrate or the ceramic green sheet; and a step of thermally decomposing the heat-decaying material to thereby transfer the circuit pattern onto the insulating substrate or the ceramic green sheet.

The method for producing a circuit board as above, wherein the heat-decaying material comprises a crosslinkable silyl group-having polyoxyalkylene resin, and the heating temperature is controlled to fall between 150° C. and 170° C.

The transfer sheet as above, wherein the transfer parts are electronic parts.

(34) A patterning method, which comprises a step of forming a heat-decaying resin film of the heat-decaying material of above (1) on the surface of a substrate to be processed, and a step of selectively applying thermal energy to the heat-decaying resin film so as to decay the heat-decaying resin film in the thermal energy-irradiated area to thereby form a pattern of the heat-decaying resin film.

The patterning method as above, wherein the selective thermal energy application to the heat-decaying resin film is effected according to a direct-patterning process with a laser beam or an electron beam.

(35) A patterning method, which comprises:

a step of forming a heat-decaying resin film of the heat-decaying material of above (1) on the surface of a substrate to be processed;

a step of transferring a pattern formed in a photomask to the heat-decaying resin material through exposure of the material to light; and a step of heating the heat-decaying resin film after the exposure transfer step for selectively decaying the heat-decaying resin film in the region not exposed to light in the previous exposure transfer step to thereby form a pattern of the heat-decaying resin film.

The patterning method as above, wherein the heat-decaying resin film in the region thereof exposed to light in the previous exposure transfer step is crosslinked and photocured.

The patterning method as above, wherein the temperature in the heat treatment is controlled to be higher than the temperature at which the heat-decaying resin film in the region thereof not exposed to light decomposes and decays, but lower than the temperature at which the heat-decaying resin film in the region thereof exposed to light decomposes and decays.

The patterning method as above, wherein the heat-decaying resin film comprises a crosslinkable silyl group-having polyoxyalkylene resin composition.

The patterning method as above, wherein the entire surface of the structure is exposed to light after the formation of the pattern of the heat-decaying resin film thereon.

The patterning method as above, wherein the substrate to be processed is selectively etched via the pattern of the heat-decaying resin material serving as an etching mask, and then this is heated so as to decompose and remove the pattern of the heat-decaying resin.

The patterning method as above, which includes:

a step of forming a conductor film on the entire surface over the pattern of the heat-decaying resin formed on the surface of the substrate to be processed, according to a sputtering process; and a step of decomposing and decaying the heat-decaying resin by heating it so as to lift off the conductor film to thereby form a conductor film pattern.

The patterning method as above, which includes:

a step of plating the surface of the substrate to be processed with a metal film via the pattern of the heat-decaying resin film serving as an electroplating mask; and a step of decomposing and decaying the heat-decaying resin by heating it so as to form a metal film pattern.

The patterning method as above, wherein the heat treatment is effected in an oxygen atmosphere at a temperature falling between 150° C. and 250° C.

The patterning method as above, wherein the heat treatment is effected in a nitrogen atmosphere at a temperature falling between 200° C. and 250° C.

The heat-decaying material of the invention hardly deteriorates and decomposes at room temperature, but may decay within a short period of time when heated at relatively low temperatures.

The polyoxyalkylene resin in the heat-decaying material of the invention may be polyoxypropylene, polyoxyethylene, polyoxytetramethylene, or a mixed resin of polyoxypropylene, polyoxyethylene and/or polyoxytetramethylene. Accordingly, for this, polyoxypropylene having a low cohesion force may be combined with polyoxyethylene and/or polyoxytetramethylene having a high cohesion force, and the cohesion force of the decaying material of the invention can be controlled in any desired manner according to the use and the application thereof.

In the heat-decaying material of the invention, the polyoxypropylene content of the mixed resin may be at least 50% by mass, and the decaying temperature and the decaying time of the material can be suitably controlled.

In the heat-decaying material of the invention, the polyoxyalkylene resin may have a number-average molecular weight of from 500 to 5,000,000. Therefore, the resin is not so much volatile, and the decaying material of the invention can be stably handled, and rapid decaying of the material could be more ensured.

The heat-decaying material of the invention may contain a decomposition promoter, and it can be decayed at lower temperatures within a shorter period of time.

The decomposition promoter that may be in the heat-decaying material of the invention may be a peroxide, and the decomposition residue from the decomposition promoter may be reduced.

The decomposition promoter that may be in the heat-decaying material of the invention may be an azo compound. In this case, the promoter may promote the decomposition and, in addition, the nitrogen gas to be generated through decomposition of the azo compound may promote the volatility of the decomposed products.

The heat-decaying material of the invention may contain a decomposition retardant, and the decaying time and the time may be controlled in accordance with various applications of the material.

In the heat-decaying material of the invention, the decomposition retardant may be any of a mercapto compound, an amine compound, an organic tin, or an organic boron. Accordingly, decomposition of the polyoxyalkylene that constitutes the heat-decaying material of the invention may be retarded.

The heat-decaying material of the invention may be decomposed more rapidly in an oxygen-containing atmosphere, and may be decomposed at lower temperatures, and, in addition, the decomposition residue may be reduced. Taking advantage of this property, the heat-decaying material may be decayed when heated at a temperature falling between 150 and 300° C. in an oxygen-containing atmosphere, if it could not be heated to its intrinsic decomposition temperature. Accordingly, the material may be applied in various fields.

The decomposition speed of the heat-decaying material of the invention lowers in an anaerobic atmosphere. Accordingly, when the material is used in formation of micropatterns, then high-accuracy micropatterns may be formed. In an anaerobic atmosphere, the decomposition temperature of the material may be high. When the material is heated and decayed at a predetermined temperature falling between 150 and 350° C. in an anaerobic atmosphere, then it does not decay at its intrinsic decomposition temperature, and its application ranges may be further broadened.

Specifically, when the oxygen concentration in an atmosphere is increased, then the heating temperature for the material may be lowered. In addition, when the oxygen concentration in an atmosphere is lowered, then the material does not decompose at a temperature at which it decomposes in air, and the material may be so controlled that it begins to decompose at a higher temperature. Accordingly, depending on the oxygen concentration in an atmosphere, the decomposition temperature of the heat-decaying material may be controlled in a broad range.

Under reduced pressure, the volatility of the decomposition residue from the heat-decaying material of the invention increases, and therefore the residue may be reduced. When the material is heated at a predetermined temperature falling between 150 and 350° C. under reduced pressure within 5 minutes, then the heating time for the material may be shortened. Accordingly, the invention is applicable to materials that may be readily damaged under heat.

In addition, the heat-decaying material of the invention may form a heat-decaying sheet having a sheet form at a temperature not higher than 100° C.

In the heat-decaying material of the invention, the polyoxyalkylene resin may be an uncrosslinked one having a number-average molecular weight of from 5000 to 5,000,000. Even when the resin therein is an uncrosslinked polyalkylene resin, the material may favorably keep its sheet form at room temperature.

The heat-decaying material of the invention may contain a crosslinked polyoxyalkylene resin. Even though not reinforced by a substrate, the material may favorably keep its sheet form at room temperature.

In the heat-decaying material of the invention, the crosslinked polyoxyalkylene resin may be formed by crosslinking a crosslinkable functional group-having polymer that contains segments of a crosslinkable functional group-having polyalkylene glycol or polyoxyalkylene, with a crosslinking agent. At ordinary service temperatures, the cohesion force of the material extremely increases and the material readily keeps its sheet of film form. Accordingly, the material may be readily handled as sheets or films.

When the heat-decaying material of the invention contains an uncrosslinked polymer that contains segments of an uncrosslinked polyalkylene glycol or polyoxyalkylene glycol, it may be reinforced with a substrate and it may favorably keep its sheet form at room temperature.

When the heat-decaying material of the invention is reinforced with a substrate, it may favorably keep its sheet form even at room temperature even when it contains an uncrosslinked polyoxyalkylene resin.

The heat-decaying material of the invention may contain a crosslinkable functional group-having polymer that contains segments of a crosslinkable functional group-having polyoxyalkylene glycol or polyoxyalkylene, and a crosslinking agent, and may have a viscosity at 20° C. of from 1 to 5,000,000 mPa•s. At ordinary service temperatures, the material hardly deteriorates or decomposes and may keep its paste form, and when exposed to light or the like, it is crosslinked into a cured product. When the cured product is heated at relatively low temperatures, it may readily decay within a short period of time.

The heat-decaying material of the invention may contain at most 30% by mass of a polymerizable unsaturated group-having compound. Maintaining the above-mentioned properties thereof, the heat-decaying material of the type may ensure more rapid curability.

The heat-decaying material of the invention may have a viscosity at 20° C. of from 1 to 100 mPa•s. Accordingly, it can be uniformly formed in any desired region according to a spin-coating process, a pulling-up process or a dipping process.

The heat-decaying material of the invention may have a viscosity at 20° C. of from 500 to 100,000 mPa•s. Accordingly it can be formed in any desired region according to a brush-coating process.

The heat-decaying material of the invention may have a viscosity at 20° C. of from 200 to 1000 mPa•s. Accordingly, it can be formed to have any desired pattern according to a screen-printing process.

In the heat-decaying material of the invention, the crosslinkable functional group may be at least one selected from a hydrolyzing silyl group, an isocyanate group, an epoxy group, an oxetanyl group, an acid anhydride group, a carboxyl group, a hydroxyl group, and a polymerizable unsaturated hydrocarbon group. Accordingly, any known crosslinking condition may be selected for the material, and the crosslinking reaction of the material may be readily controlled.

Specifically, when the group is a hydrolyzing silyl group, then a known crosslinking agent, for example, Lewis acids such as organic tin, organic aluminium, organic boron; inorganic acids such as hydrochloric acid; or triethylamine, ammonia or sodium hydroxide may be used.

When the group is an isocyanate group, then a known crosslinking agent such as polyalcohols, polyamines, organic tin, or compounds having plural acid anhydride structures in one molecule may be used.

When the group is an epoxy group, then a known crosslinking agent such as compounds having plural primary amino groups, tertiary amines, compounds having plural carboxyl groups, optical acid generators, optical amine generators, or compounds having plural acid anhydride structures in one molecule may be used.

When the group is an oxetanyl group, then a known crosslinking agent such as optical acid generators may be used.

When the group is an acid anhydride group, then a known crosslinking agent such as polyalcohols, or compounds having plural primary amino groups may be used.

When the group is a carboxyl group, then a known crosslinking agent such as compounds having plural epoxy groups, or compounds having plural hydroxyl groups may be used.

When the group is a hydroxyl group, then a known crosslinking agent such as compounds having plural isocyanate groups may be used.

When the group is a polymerizable unsaturated hydrocarbon group, then a known crosslinking agent such as organic peroxides, polymercaptans, or compounds having plural primary amino groups may be used.

The heat-decaying material of the invention may decay in a temperature atmosphere falling between 150 and 220° C. Accordingly, this can be decayed in temporary fixation in optical structures, or in packaging for producing semiconductor devices with low-temperature solder, and, therefore, the material can be used for temporary fixation or for other various purposes.

The heat-decaying material of any of the invention may decay in a temperature atmosphere falling between 220 and 280° C. Accordingly, it can be decayed in packaging for producing semiconductor devices with lead-free solder, and therefore, the material can be used for temporary fixation or for other various purposes.

The heat-decaying material of the invention may decay in a temperature atmosphere falling between 280 and 350° C. Accordingly, the material is applicable to a case where a porous thin film is formed on aluminium wiring, and it can be used in various applications.

The cured product of the heat-decaying material of any of the invention may decay in a temperature atmosphere falling between 150 and 220° C. Accordingly, the material can be decayed in temporary fixation in optical structures, or in packaging for producing semiconductor devices with low-temperature solder, and, therefore, the material can be used for temporary fixation or for other various purposes.

The cured product of the heat-decaying material of the invention may decay in a temperature atmosphere falling between 220 and 280° C. Accordingly, the material can be decayed in packaging for producing semiconductor devices with lead-free solder, and therefore, the material can be used for temporary fixation or for other various purposes.

The cured product of the heat-decaying material of the invention may decay in a temperature atmosphere falling between 280 and 350° C. Accordingly, the material is applicable to a case where a porous thin film is formed on aluminium wiring, and it can be used in various applications.

According to the method for producing a porous material of the invention, a skeleton-forming crosslinkable material and the heat-decaying material are heated in a uniformly dispersed condition of the two, and the heat-decaying material can be well decayed under heat at low temperatures. Accordingly, the resulting pores can be uniformly dispersed in the porous material produced in such a manner that the skeleton-forming crosslinkable material surrounds the pores and forms a stiff skeleton phase structure. Therefore, in a process of producing semiconductor devices, the film can be formed not having any negative influence on the other element region. If desired, in addition, the skeleton phase-constituting crosslinkable material can be selected in any desired manner, and porous materials of high reliability can be formed in accordance with the use thereof. Further, since porous materials of good film quality can be formed at low temperatures falling between 150 and 350° C., preferably between 150° C. and 200° C., the latitude in selecting the skeleton phase-constituting crosslinkable material is broad. In particular, when the porous material is used as interlayer insulating films in semiconductor devices, then it can be formed at extremely low temperatures not higher than 200° C., and this means that the films can be formed with no deterioration of elements. Regarding the film-forming methods, any of spin-coating method or screen-printing method may be suitably selected by controlling the composition for the films. Further, porous sheets are easy to form. The porous sheet may be stuck to the surface of a semiconductor substrate by the sue of an adhesive resin, and it may be used as an interlayer insulating film.

In the method for producing the porous material of the invention, the heating may be effected at a temperature falling between 150 and 350° C. and for a heating time of 10 minutes or less. Accordingly, the porous material can be produced not undergoing high-temperature treatment, and therefore its production is easy, and the production process has high reliability. When the material is used in formation of interlayer insulating films in production of semiconductor devices, it does not cause elongation of diffusion layers already formed or deterioration of wiring layers, and therefore semiconductor devices of high reliability can be provided.

In the method for producing the porous material of the invention, the skeleton-forming crosslinkable material (a) may be an alkoxysilane, and the step of crosslinking the crosslinkable material to form the skeleton phase may comprise condensing the alkoxysilane to form an inorganic silane compound phase. Accordingly, a strong porous material of high reliability can be formed, which is resistant to acid and base.

In the method for producing the porous material of the invention, the heat-decaying material (b) may have an oxygen atom content of from 15 to 55% by mass and at least 95% by weight of the material decays within 10 minutes when heated at a predetermined temperature falling between 150 and 350° C. Accordingly, in production of semiconductor devices, the material can be used not deteriorating element regions and wirings.

In the method for producing the porous material of the invention, the polyoxyalkylene resin may have a number-average molecular weight of from 5000 to 5,000,000. Therefore, the heat-decaying material (b) is not so much volatile and can be handled more stably. In addition, rapid decaying of the material can be ensured.

In the method for producing the porous material of the invention, the amount of the heat-decaying material (b) to be used may be from 5 to 1000 parts by weight relative to 100 parts by weight of the skeleton-forming crosslinkable material (a). Accordingly, the porous material produced has a low dielectric constant and a sufficient mechanical strength.

In the method for producing the porous material of the invention, the precursor may be a composite prepared through partial hydrolysis condensation of the skeleton-forming crosslinkable material (a), and the composite is applied onto the substrate to be processed and then this is heated. Accordingly, forming the porous material on semiconductor substrates may be extremely readily realized.

In the method for producing the porous material of the invention, the substrate to be processed may be a semiconductor substrate with semiconductor elements formed thereon, and the porous material may be formed as an interlay insulating film between the wiring layers that connect the semiconductor elements. Accordingly, interlayer insulating films having a low dielectric constant and having a high mechanical strength can be formed.

In the method for producing the porous material of the invention, the heating of the precursor may be effected in two stages, a first heating, and a second heating at a temperature higher than the temperature in the first heating. Accordingly, the heat-decaying material may be decayed little by little first at low temperatures and then it may be decayed at a higher speed at higher temperatures. In that manner, more uniform porous materials may be formed.

The porous material obtained according to the above-mentioned production step is homogeneous and may have a high mechanical strength.

The porous material may be a porous film, and when the porous film is used as interlayer insulating films in electronic parts, the films have a low dielectric constant and have a high mechanical strength.

The transfer sheet of the invention has a transfer object stuck onto a heat-decaying adhesive resin layer. Accordingly, after the transfer object is transferred, the heat-decaying adhesive resin layer may be readily decayed merely by heating it.

The conductive particles transfer sheet that comprises the transfer sheet of the invention has conductive fine particles adhered to and disposed on a heat-decaying adhesive resin sheet. Accordingly, this enables connection with no mispositioning.

In the conductive particles transfer sheet, the conductive fine particles may be embedded in the heat-decaying adhesive resin sheet from its top face toward its back face. Accordingly, when a semiconductor chip or a semiconductor wafer is laid on one face of the conductive particles transfer sheet and when one face of the conductive fine particles is kept in contact with the electrode pad of the semiconductor chip or the semiconductor wafer and this is heated at the melting temperature of the surface of the conductive fine particles, then the conductive fine particles are fixed to the electrode pad and the heat-decaying resin is decayed. In that manner, connection of the conductive fine particles to the electrode pad with no mispositioning can be realized.

In the conductive particles transfer sheet, the conductive fine particles may be for bump-bonding between electrodes of an electronic part, and the particles are melt-bonded on the electrodes. Accordingly, this enables easy connection only by heating, not using a bonding agent such as solder.

In the conductive particles transfer sheet, the electronic part may be a semiconductor chip, a resin-encapsulated semiconductor device or a wiring board. To that effect, the transfer sheet enables easy bump formation on semiconductor chips, resin-encapsulated semiconductor devices or wiring boards with no mispositioning.

In the conductive particles transfer sheet, the conductive fine particles may have solder at least on their surface. With that, the particles may be fused and bonded only by heating.

In the conductive particles transfer sheet, the conductive fine particles may form solder ball bumps in BGA packages. The transfer sheet enables easy formation of solder ball bumps with no mispositioning.

In the conductive particles transfer sheet, the conductive fine particles may from bumps on semiconductor chips. The transfer sheet enables bump formation with no mispositioning.

In the conductive particles transfer sheet, the heat-decaying adhesive resin may contain a polyoxyalkylene resin. Accordingly, the conductive particles transfer sheet may be removed at low temperatures not leaving any residue after its removal.

In the conductive particles transfer sheet, the heat-decaying adhesive resin may be formed of a coating film that contains a polyalkylene resin composition. Accordingly, positioning and fixation of the conductive fine particles is easy.

In the conductive particles transfer sheet, the heat-decaying adhesive resin may give a more volatile residue when decomposed under reduced pressure. In that condition, therefore, the decomposition residue may be reduced. In addition, when the adhesive resin is decayed under heat at a predetermined temperature falling between 150 and 350° C. under reduced pressure within 5 minutes, then the heating time may be shortened. Accordingly, even conductive fine particles that are readily damaged by heat can be used in the transfer sheet.

The method of the invention for bonding conductive fine particles to the electrode face of electronic parts comprises attaching a conductive particles transfer sheet to electronic parts where conductive fine particles are disposed on the heat-decaying adhesive sheet in such a manner that the conductive fine particles could be in contact or in no contact with the position of the electrodes of the electronic parts, then melting and bonding the conductive fine particles to the electrodes of the electronic parts, and heating the resulting structure to decay the heat-decaying adhesive sheet. According to the method, connection can be realized with good positional accuracy and with good operability.

The method of the invention for bonding conductive fine particles to electrodes comprises casting a paste of the heat-decaying material on the surface of electronic parts with electrode face formed thereon, to thereby form a heat-decaying resin layer on them, disposing and bonding conductive fine particles to the electrode face via the heat-decaying resin layer, then melting and bonding the conductive fine particles to the electrodes of the electronic parts, and heating the resulting structure to decay the heat-decaying adhesive sheet. According to the method, connection can be realized with good positional accuracy and with good operability.

The method of the invention for bonding conductive fine particles to electrodes comprises applying a solution that contains a composition of the heat-decaying material to the surface of electronic parts with electrode face formed thereon, forming a heat-decaying resin layer from the coating film, disposing and bonding conductive fine particles to the electrode face via the heat-decaying resin layer, then melting and bonding the conductive fine particles to the electrodes of the electronic parts, and heating the resulting structure to decay the heat-decaying adhesive sheet. According to the method, connection can be realized with good positional accuracy and with good operability.

In the method for bonding conductive fine particles to electrodes, a solution that contains the heat-decaying adhesive resin composition may be applied to form the coating film, and then the coating film is exposed to UV ray to form the heat-decaying resin layer. Accordingly, in the method, pattern formation can be attained through exposure to light in the method, and therefore electrode patterning can be attained with no use of photoresist.

In the method for bonding conductive fine particles to electrodes, recesses may be formed in a predetermined region of the heat-decaying adhesive sheet or the heat-decaying resin layer through exposure to laser rays, and the conductive fine particles may be bonded to and disposed in the recesses. In the method, the conductive fine particles may be bonded to and disposed in the recesses that are formed in a predetermined region of the heat-decaying adhesive sheet or the heat-decaying resin layer through exposure to laser rays. Accordingly, in the method, the conductive fine particles may be stably bonded to the predetermined region of the heat-decaying sheet or the heat-decaying resin layer.

In the method for bonding conductive fine particles to electrodes, the electronic parts may be semiconductor chips, resin-encapsulated semiconductor devices or wiring boards. Accordingly, the method enables easy bump formation.

In the method for bonding conductive fine particles to electrodes, the conductive fine particles may have solder on at least their surface. Accordingly, in the method, bonding of the heat-decaying material may be realized by solder-bonding the conductive fine particles.

In the method for bonding conductive fine particles to electrodes, the conductive fine particles may have solder on at least their surface, and the melt-bonding of the conductive fine particles and the decaying of the heat-decaying adhesive sheet or the heat-decaying adhesive resin may be simultaneously effected under heat at a solder reflow temperature. Accordingly, in the method, bonding of conductive fine particles such as solder balls to substrates may be realized at the same time with the heating operation in the reflow step.

The transfer sheet of the invention may be a transfer sheet for circuit formation, and this loses its solid form when the heat-decaying material or the adhesive sheet comprising a heat-decaying material-containing composition therein is decomposed.

Having the constitution, the adhesive sheet may be readily decomposed and decayed when heated. Therefore, the transfer sheet makes it easy to transfer a fine and high-density circuit pattern onto an insulating substrate and makes it possible to form a circuit board having fine and high-density wirings with high accuracy.

The solid form of the adhesive sheet changes under heat and the sheet thereby separates from the circuit pattern, the metal foil or the conductive paste layer.

When the adhesive sheet is formed of a composite film that partly contains the heat-decaying material, then the adhesive force of the adhesive sheet may be greatly lowered by the vapor generated through heat treatment to decompose the heat-decaying material, and as a result, the adhesive sheet can readily separate from the circuit pattern. Accordingly, it is easy to transfer a fine and high-density circuit pattern, a metal foil or a conductive paste onto an insulating substrate, and circuit boards having fine and high-density wirings can be formed with high accuracy.

Preferably, the heat-decaying material contains a crosslinkable resin composition that may crosslink through energy stimulation thereto. In the adhesive sheet, the crosslinkable resin composition may be crosslinked and cured through exposure to UV rays or electron rays.

Having the constitution, the adhesive sheet does not require heat treatment for suitably curing it, and the absence of heat treatment in the curing step completely prevents the heat-decaying material from being decomposed. It is possible to obtain a transfer sheet for forming high-quality circuits.

The transfer sheet for circuit formation may contain a heat-decaying material resin that comprises a crosslinkable silyl group-having polyoxyalkylene resin, and the temperature for the above-mentioned heat treatment may be a relatively low temperature not higher than 200° C.

According to the method for producing circuit boards of the invention, circuit boards having fine and high-density wirings can be produced in a simplified manner at high producibility and with high accuracy.

Preferably, the heat-decaying material comprises a crosslinkable silyl group-having polyoxyalkylene resin, and the heating temperature is controlled to fall between 150° C. and 170° C. Accordingly, in production of circuit boards, the circuit boards being produced are not exposed to high temperatures for a long period of time, and the materials and the properties of the circuit boards produced are not negatively influenced at all by the production process. In addition, any large-scale heating equipment is unnecessary and any simple-structured heating equipment is enough. Further, in production of electronic parts for which the acceptable limit of the heating temperature in the heating treatment is relatively low, or that is, not higher than 200° C., there occurs no change in the properties of the electronic parts produced, and the heat-decaying material of the invention is extremely effective for their production.

In the transfer sheet of the invention, the transfer parts are electronic parts. Accordingly, the transfer sheet makes it possible to adhere electronic parts to a predetermined region with high positional accuracy. For example, this is extremely effective for parts positioning in a process of packaging machine parts such as racks or pinions formed through MEMS (micro-electro-mechanical systems) or NEMS (nano-electro-mechanical systems) technology, or cantilevers or air bridges. For example, when a heat-decaying adhesive resin layer is formed on a cantilever formed on a silicon wafer and when this is positioned relative to another silicon wafer with a semiconductor integrated circuit formed thereon and attached thereto, then an acceleration sensor can be formed with ease. When a heat-decaying adhesive resin layer is formed on the MEMS switch beam formed on a silicon wafer and when this is positioned relative to the GaAs wafer with a semiconductor integrated circuit and an electric machine filter formed thereon and attached thereto, then a receiver device can be formed with ease.

The patterning method of the invention does not require direct patterning of a resist pattern and resist development after exposure transfer that are both indispensable in conventional patterning with a resist film. Accordingly, the patterning method of the invention is significantly simplified and the patterning costs may be lowered.

Further, differing from conventional photolithography, the working efficiency in the patterning method of the invention is improved and the patterning cost is thereby reduced and, in addition, the invention realizes high-accuracy patterning technology.

Moreover, according to the invention, patterning of various materials for use in production of semiconductor devices can be significantly simplified, and the production costs are greatly reduced.

BEST MODE FOR CARRYING OUT THE INVENTION

Figure 1:
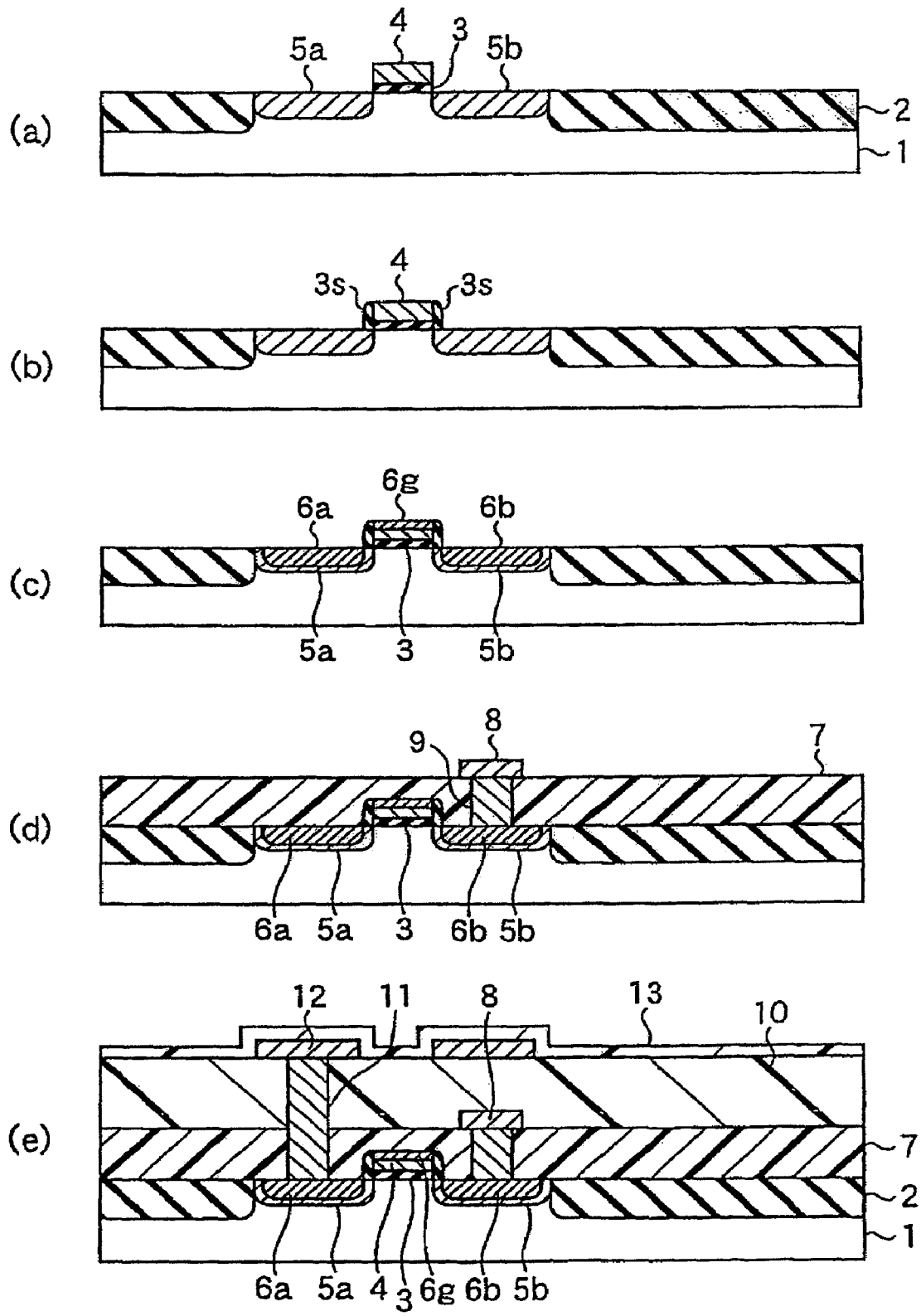
FIG. 1 includes cross-sectional views of a process scheme of producing a semiconductor device that has an interlayer insulating film formed of the porous material of the invention.

The invention is described in detail hereinunder.

The heat-decaying material of the invention comprises a polyoxyalkylene resin as the principal ingredient thereof, and has an oxygen atom content of from 15 to 55% by mass, and when heated at a predetermined temperature falling between 150 and 350° C., at least 95% by weight of the material decays within 10 minutes.

Though not specifically defined but essentially, the heat-decaying material of the invention may have a sheet form at room temperature, or may have a paste morphology at room temperature and, when exposed to light or the like, it may crosslink into a cured product.

The polyoxyalkylene resin in the heat-decaying material of the invention includes both an uncrosslinked one and a crosslinked one.

Though not specifically defined, the polyoxyalkylene resin in the heat-decaying material of the invention includes polymers that contain segments of polyalkylene glycol or polyoxyalkylene.

Also though not specifically defined, the polyalkylene glycol includes, for example, polyoxypropylene glycol, polyoxyethylene glycol, polyoxytetramethylene glycol. Above all, preferred for use in the invention are polyoxypropylene, polyoxyethylene, polyoxytetramethylene, as well as a mixed resin of polyoxypropylene, polyoxyethylene and/or polyoxytetramethylene. More preferably, the polyoxypropylene content of the mixed resin is at least 50% by mass. When the mixed resin of the type is used and when the blend ratio of the resins is controlled, then the decaying temperature and the decay time of the material may be controlled. A mixed resin of solid polyoxyethylene glycol and/or polyoxytetramethylene glycol is preferably used in the decaying material of the invention, since the properties of the material may be broadly varied including non-adhesive hot-melt-type resin sheets and adhesive sheets.

In the copolymer that contains segments of the above-mentioned polyoxyalkylene, the polyoxyalkylene segments are meant to indicate segments each having at least two repetitive units of the following formula (1):

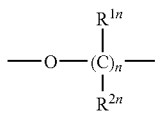

wherein n indicates an integer of 1 or more; $R^{1n}$ and $R^{2n}$ each represent an n'th substituent of one or more selected and from a hydrogen atom, an alkyl group, an aryl group, an alkenyl group, a hydroxyl group, a carboxyl group, an epoxy group, an amino group, an amido group, an ether group and an ester group.

If the number of the repetitive unit of formula (1) for the segment is one, then the heat-decaying material of the invention could not be completely decayed under heat. Even when the segment that has at least two repetitive units of formula (1) does not have a crosslinking point and the resin is crosslinked with any other segment to be a gel resin, then it may be used in the heat-decaying material of the invention so far as the above-mentioned polyoxyalkylene segment exist between the crosslinking points. In addition, the copolymer that includes the above-mentioned polyoxyalkylene segments may be processed with a chain extender so that the segments may be chain-wise liked together.

Not specifically defined, the polymer that contains the polyoxyalkylene segments includes, for example, polymethylene glycol (polyacetal), polyethylene glycol, polypropylene glycol, polytrimethylene glycol, polytetramethylene glycol, polybutylene glycol, and combinations of different types of these segments. It further includes polyurethanes, polyesters, polyamides and polyimides that may be obtained from these. It still includes vinyl-based polymers such as (meth)acrylic polymers and polystyrenes that have these polyoxyalkylene segments as the grafts thereof. Two or more different types of these resins may be combined for use herein.

Preferably, the number-average molecular weight of the polyoxyalkylene resin is from 500 to 5,000,000. If the number-average molecular weight is smaller than 500, then the resin will be too volatile and, if so, the decaying material of the invention may be difficult to stably handle. On the other hand, if the number-average molecular weight is larger than 5,000,000, then the cohesion force of the resin may be good but the resin could not be rapidly decayed owing to its entangled effect.

In detail, the number-average molecular weight of the resin may be suitably determined depending on the use, the object and the service condition of the heat-decaying material of the invention.

If desired, the heat-decaying material of the invention may contain a decomposition promoter or a decomposition retardant whereby the decomposition rate and the decomposition temperature of the material could be suitably controlled in accordance with the use, the object and the service condition of the material.

Not specifically defined, the decomposition promoter includes azo compounds such as azodicarbonamide; heavy metal compounds such as iron sulfate, sodium nitrate, cobalt naphthenate; carboxylic acids such as oxalic acid, linolenic acid, ascorbic acid; and hydroquinone, peroxides, tin oxide.

The peroxides are not specifically defined, and may be any of inorganic peroxides or organic peroxides. Concretely, they inorganic peroxides include potassium persulfate, sodium persulfate, ammonium persulfate, potassium perchlorate, sodium perchlorate, ammonium perchlorate, and potassium periodate.

Though not specifically defined, the organic peroxides are preferably those having a 10-hour half-value temperature of not lower than 100° C. when the heat-decaying material of the invention is desired to have good storage stability. The organic peroxides having a 10-hour half-value temperature of not lower than 100° C. are, for example, hydroperoxides such as p-menthanehydroxyperoxide, diisopropylbenzenehydroxyperoxide, 1,1,3,3-tetramethylbutylhydroxyperoxide, cumemehydroxyperoxide, t-hexylhydroxyperoxide, t-butylhydroxyperoxide; dialkylperoxides such as dicumylperoxide, α,α'-bis (t-butylperoxy-m-isopropylbenzene), 2,5-dimethyl-2,5-bis(t-butylperoxy)hexane, t-butylcumylperoxide, di-t-butylperoxide, 2,5-dimethyl-2,5-bis(t-butylperoxy)hexyne-3; peroxyketals such as 1,1-bis (t-hexylperoxy)-3,3,5-trimethylcyclohexane, 1,1-bis (t-hexylperoxy) cyclohexane, 1,1-bis(t-butylperoxy)-3,3,5-trimethylcyclohexane, 1,1-bis (t-butylperoxy)cyclohexane, 1,1-bis(t-butylperoxy)cyclododecane, 2,2-bis(t-butylperoxy)butane, n-butyl 4,4-bis(t-butylperoxy)valerate, 2,2-bis(4,4-di-t-butylperoxycyclohexyl)propane; peroxyesters such as t-hexylperoxy isopropylmonocarbonate, b-butylperoxy maleate, t-butylperoxy 3,5,5-trimethylhexanoate, t-butylperoxy laurate, 2,5-dimethyl-2,5-bis(m-toluylperoxy)hexane, t-butylperoxy isopropylmonocarbonate, t-hexylperoxy benzoate, 2,5-dimethyl-2,5-bis(m-benzoylperoxy)hexane, t-butylperoxy acetate, t-butylperoxy benzoate, bis-t-butylperoxy isophthalate, t-butylperoxy allylmonocarbonate.

Not specifically defined but concretely, the azo compounds include azobisisobutyronitrile (AIBN), 2,2-azobis(4-methoxy-2,4-dimethylvaleronitrile), 2,2-azobis(2-cyclopropylpropionitrile), 2,2-azobis(2-methylbutyronitrile), 1,1-azobis (cyclohexane-1-carbonitrile).

When containing the above-mentioned peroxide and azo compound, the heat-decaying material of the invention may reduce its carbide residue that may remain after thermally decayed. Of the peroxides, especially preferred are organic peroxides as more effective for reducing the generation of ash residues.

Also not specifically defined, the decomposition retardant includes mercapto compounds, amine compounds, organic tin, organic boron.

Not specifically defined but concretely the mercapto compounds include propanethiol, butanethiol, pentanethiol, 1-octanethiol, dodecanethiol, cyclopentanethiol, cyclohexanethiol, 1,3-propanediol.

Also not specifically defined but concretely, the amine compounds include propylamine, butylamine, hexylamine, dodecylamine, isopropylamine, hexamethylenediamine, cyclohexylamine, benzylamine, aniline, methylaniline.

Also not specifically defined but concretely, the organic tin includes dimethyltin dilaurate, dibutyltin dilaurate, dibutyltin dioctanoate, dibutyltin diacetate, dibutyltin-bis(2,4-pentanedione), dilauryltin dilaurate.

Also not specifically defined but concretely, the organic boron includes trimethyl borate, tripropyl borate, tributyl borate, trimethoxyboroxine, trimethylene borate.

The amount of the decomposition promoter and the decomposition retardant in the heat-decaying material of the invention is not specifically defined and may be suitably determined depending on the use, the object and the service condition of the material. Concretely, it is desirable that the additive content is from 1 to 10% by mass of the heat-decaying material.

The heat-decaying material of the invention decays, when heated in an oxygen-containing atmosphere at a predetermined temperature falling between 150 and 300° C., or when heated in an anaerobic atmosphere at a predetermined temperature falling between 150 and 350° C., or when heated under reduced pressure within 5 minutes at a predetermined temperature falling between 150 and 350° C. Depending on the atmosphere in which it is heated, the decomposition temperature range of the material varies. Taking advantage of the properties thereof, the material may be used for various applications.

At a temperature not higher than 100° C., the heat-decaying material of the invention may have a sheet form, and the invention provides such a heat-decaying sheet.

In this case, it is desirable that the polyoxyalkylene resin to be in the heat-decaying material of the invention has a number-average molecular weight of from 5000 to 5,000,000.

When the number-average molecular weight is at least 5000, then the material may keep a stable sheet form at a temperature not lower than 100° C.; and when it is at most 5,000,000, then the cohesion force of the resin is not so high and its wettability does not decrease, and the resin-containing material may ensure a sufficient adhesive force.

Regarding the morphology of the heat-decaying sheet, the sheet may be reinforced with a substrate, or may not be reinforced with a substrate.

When an uncrosslinked polyoxyalkylene resin is used, then the material could not keep a sheet form by itself since the resin is soft. Accordingly, the material of the type is preferably reinforced with a substrate.

For example, the material may be a supported-type sheet that is reinforced with a heat-resistant resin sheet such as; polyethylene terephthalate sheet or polyimide sheet, or with a substrate of metal film or the like. As the case may be, a copolymer having polyalkylene glycol or polyoxyalkylene segments may be infiltrated into paper, plastics or woven or nonwoven fabrics of a glass material or the like so as to keep the sheet form of the material. In this connection, since many of the polymers that contains polyoxyalkylene segments are also soft and could not keep a sheet form by themselves, it is also desirable that they are reinforced with a substrate so as to keep the sheet form thereof.

When a crosslinked polyoxyalkylene resin is used, then it may keep its sheet form by itself. Therefore, it may not be reinforced with a substrate.

The crosslinking morphology of the crosslinked polyoxyalkylene resin is not specifically defined, and it may be either physical crosslinking or chemical crosslinking.

For physically crosslinking a polyoxyalkylene resin, for example, there may be employed a method of selecting crystalline segments for polymerization followed by crystallizing them; a method of using high-molecular-weight segments to increase entanglements of molecular chains; and a method of using segments having a functional group such as hydroxyl group, amino group or amido group to thereby form hydrogen bonding.

For chemically crosslinking a polyoxyalkylene resin, for example, there may be employed a method of crosslinking a crosslinkable functional group-having polymer that includes crosslinkable functional group-having polyalkylene glycol or polyoxyalkylene segments, with a crosslinking agent.

The crosslinkable functional group that the above-mentioned polyalkylene glycol or polyoxyalkylene segments-containing polymer has is not specifically defined, including, for example, a hydrolyzing silyl group, an isocyanate group, an epoxy group, an oxetanyl group, an acid anhydride group, a carboxyl group, a hydroxyl group, and a polymerizable unsaturated hydrocarbon group. Above all, preferred is at least one selected from a hydrolyzing silyl group, an isocyanate group, an epoxy group, an oxetanyl group, an acid anhydride group, a carboxyl group, a hydroxyl group, and a polymerizable unsaturated hydrocarbon group; more preferred is at least one selected from a hydrolyzing silyl group, an epoxy group, and an oxetanyl group; and even more preferred is a hydrolyzing silyl group. One or more different types of these crosslinkable functional groups may be in the polymer, either alone or as combined.

Some types of the polymer that contains hydrolyzing silyl group-having polyalkylene glycol or polyoxyalkylene segments are commercially available. For example, they are Kanegafuchi Chemical Industry's trade name MS Polymer Series of MS-Polymer-S-203, S-303, S-903; Silyl Polymer Series of Silyl SAT-200, MA-403, MA-447; Epion Series of EP103S, EP303S, EP505S; and Asahi Glass' Exsester ESS-2410, ESS-2420, ESS-3630.

The polymer that contains isocyanate group-having polyalkylene glycol or polyoxyalkylene segments may be obtained, for example, through urethanation of a diisocyanate such as 1,6-hexamethylene diisocyanate, TDI or MDI with polypropylene glycol in such a condition that the isocyanate amount by mol is larger than the hydroxyl amount by mol.

Some types of the polymer that contains epoxy group-having polyalkylene glycol or polyoxyalkylene segments are commercially available. For example, they are Kyoeisha Chemical's Epolite Series.

The polymerizable unsaturated hydrocarbon group includes a (meth)acryloyl group and a styryl group.

The polymer that contains the polymerizable unsaturated group (e.g., (meth)acryloyl, styryl)-having polyalkylene glycol or polyoxyalkylene segments include, for example, α,ω-di(meth)acryloyloxypolypropylene glycol, α,ω-di(meth)acryloyloxypolyethylene glycol, α-(meth)acryloyloxypolypropylene glycol, α-(meth)acryloyloxypolyethylene glycol. Some of these are commercially available, for example, Nippon Yushi's Blemer Series, Shin-Nakamura Chemical's NK Ester M Series, Shin-Nakamura Chemical's NK Ester AMP Series, Shin-Nakamura Chemical's NK Ester BPE Series, Shin-Nakamura Chemical's NK Ester A Series, Shin-Nakamura Chemical's NK Ester APG Series, Toa Gosei's Aronix M-240, Toa Gosei's Aronix M-245, Toa Gosei's Aronix M-260, Toa Gosei's Aronix M-270, Daiichi Kogyo Seiyaku's PE series, Daiichi Kogyo Seiyaku's BPE Series, Daiichi Kogyo Seiyaku's BPP Series, Kyoeisha Chemical's Lite Ester 4EG, Kyoeisha Chemical's Lite Ester 9EG, Kyoeisha Chemical's Lite Ester 14EG, Kyoeisha Chemical's Lite Acrylate MTG-A, Kyoeisha Chemical's Lite Acrylate DPM-A, Kyoeisha Chemical's Lite Acrylate P-200A, Kyoeisha Chemical's Lite Acrylate 9EG, Kyoeisha Chemical's Lite Acrylate BP-EPA.

The crosslinking agent to be used for the chemical crosslinking is described below.

Not specifically defined, the crosslinking agent for use in the chemical crosslinking may be any one having the ability to crosslink crosslinkable functional groups of polymers. For example, it is a type capable of reacting with the crosslinkable functional group of the above-mentioned polyalkylene glycol or polyoxyalkylene segments-having polymer capable being taken into the structure of the crosslinked product by itself (hereinafter this is referred to as crosslinking agent (1)); or a type capable of acting as a catalyst for the reaction of the crosslinkable functional groups that the polyalkylene glycol or polyoxyalkylene segments-containing polymer has (hereinafter this is referred to as crosslinking agent (2)). Another type having both the function of the crosslinking agent (1) and the function of the crosslinking agent (2) is also usable herein, and this is referred to as crosslinking agent (3).

Not specifically defined but concretely, the crosslinking agent (1) includes the following:

A crosslinking agent capable of crosslinking the polymer that contains oxetanyl group-having polyalkylene glycol or polyoxyalkylene segments. For example, this includes an optical cationic initiator that generates an acid through exposure to UV rays or visible rays, and a thermal cationic initiator.

A crosslinking agent capable of crosslinking the polymer that contains isocyanate group-having polyalkylene glycol or polyoxyalkylene segments. For example, this includes a compound having plural active hydrogens, such as a compound having plural hydroxyl groups or a compound having plural amino groups. The compound having plural hydroxyl groups are, for example, ethylene glycol, butyleneglycol, glycerin, neopentyl glycol, 1,6-hexanediol, 1,4-cyclohexanedimethanol, pentaerythritol, polyester-polyol. The compound having plural amino groups are, for example, hexamethylene diamine, tetramethylenediamine, α,ω-diaminopropylene glycol.

The crosslinking agent (2) is not also specifically defined, concretely including the following:

The crosslinking agent capable of crosslinking the above-mentioned hydrolyzing silyl group includes, for example, a photoreactive catalyst having a functional group of the following formula (2), an optical cationic initiator capable of generating an acid through exposure to UV rays or visible rays, an organic metal compound, an amine compound, an acid phosphate, a tetraalkylammonium halide (halide includes fluoride, chloride, bromide, iodide), a carboxyl group having organic acid, and an inorganic acid such as hydrochloric acid, sulfuric acid or nitric acid. Above all, preferred are photoreactive catalysts having a functional group of the following formula (2):

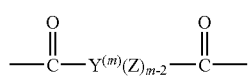

(2)

wherein m indicates an integer of from 2 to 5; Y(m) represents an atom of Group IVB, VB or VIB of the Periodic Table; Z represents a hydroxyl group, a hydrocarbon group, a mercapto group, an amino group, a halogen group, an alkoxyl group, an alkylthio group, a carbonyloxy group, or an oxo group.

The photoreactive catalyst having the functional group of formula (2) may have two or more different types of the functional groups of formula (2).

The functional group of formula (2) includes, for example, those derived from a compound having two carboxyl groups bonded to the atom of Y (m) that is selected from, for example, a group consisting of oxygen, sulfur, nitrogen, phosphorus and carbon, and suitably having a hydrocarbon group or an oxide group of Z in accordance with the number of atomic valences of Y(m).

The hydrocarbon group includes, for example, an aliphatic hydrocarbon group, an unsaturated aliphatic hydrocarbon group, and an aromatic hydrocarbon group. These hydrocarbon groups may have a substituent of, for example, an amino group, a hydroxyl group, an ether group, an epoxy group, a polymerizable unsaturated group, an urethane group, an urea group, an imido group and an ester group, not interfering with the object of the invention. As the case may be, different types of hydrocarbon groups may be combined for use herein.

The photoreactive catalyst having a functional group of formula (2) may be a cyclic compound. The cyclic compound is, for example, a compound having one or more different types of functional groups of formula (2) in the cyclic chain thereof. In addition, a compound constructed by bonding plural and the same or different cyclic compounds to each other with a suitable organic group; and a twin-ring compound containing at least one or more units of plural and the same or different cyclic compounds as above, are also usable herein.

The photoreactive catalyst having a functional group of formula (2), in which the atom of Y(m) is an oxygen atom, includes, for example, acetic acid anhydride, propionic acid anhydride, butyric acid anhydride, isobutyric acid anhydride, valeric acid anhydride, 2-methylbutyric acid, trimethylacetic acid anhydride, hexanoic acid anhydride, heptanoic acid anhydride, decanoic acid anhydride, lauric acid anhydride, myristic acid anhydride, palmitic acid anhydride, stearic acid anhydride, docosanoic acid anhydride, crotonic acid anhydride, acrylic acid anhydride, methacrylic acid anhydride, oleic acid anhydride, linolenic acid anhydride, chloroacetic acid anhydride, iodoacetic acid anhydride, dichloroacetic acid anhydride, trifluoroacetic acid anhydride, chlorodifluoroacetic acid anhydride, trichloroacetic anhydride, pentafluoropropionic acid anhydride, heptafluorobutyric acid anhydride, succinic acid anhydride, methylsuccinic acid anhydride, 2,2-dimethylsuccinic acid anhydride, isobutylsuccinic acid anhydride, 1,2-cyclohexanedicarboxylic acid anhydride, hexahydro-4-methylphthalic acid anhydride, itaconic acid anhydride, 1,2,3,6-tetrahydrophthalic acid anhydride, 3,4,5,6-tetrahydrophthalic anhydride, maleic acid anhydride, 2-methylmaleic acid anhydride, 2,3-dimethylmaleic acid anhydride, 1-cyclopentene-1,2-dicarboxylic acid anhydride, glutaric acid anhydride, 1-naphthylacetic acid anhydride, benzoic acid anhydride, phenylsuccinic acid anhydride, phenylmaleicacidanhydride, 2,3-diphenylmaleic acid anhydride, phthalic acid anhydride, 4-methylphthalic acid anhydride, 3,3',4,4'-benzophenonetetracarboxylic acid dianhydride, 4,4'-(hexafluoropropylidene)diphthalic acid anhydride, 1,2,4,5-benzenetetracarboxylic acid anhydride, 1,8-naphthalenedicarboxylic acid anhydride, 1,4,5,8-naphthalenetetracarboxylic acid anhydride; copolyemrs of maleic acid anhydride and radical-polymerizable double bond-having compound, for example, copolymer of maleic acid anhydride and (meth)acrylate, copolymer of maleic acid anhydride and styrene, and copolymer of maleic acid anhydride and vinyl ether. Some of these are commercially available, for example, Asahi Denka's Adeka Hardener EH-700, Adeka Hardener EH-703, Adeka Hardener EH-705A: Shin-Nippon Rika's Rikacid TH, Rikacid HT-1, Rikacid HH, Rikacid MH-700, Rikacid MH-700H, Rikacid MH-700H, Ricacid MH, Ricacid SH, Rikares in TMEG; Hitachi Kasei's HN-5000, HN-200; Yuka Shell Epoxy's Epicure 134A, Epicure YH306, Epicure YH307, Epicure YH308H; Sumitomo Chemical's Sumicure MS.

The photoreactive catalyst having a functional group of formula (2), in which the atom of Y(m) is a nitrogen atom, includes, for example, succinimide, N-methylsuccinimide, α,α-dimethyl-β-methylsuccinimide, α-methyl-α-propylsuccinimide, maleimide, N-methylmaleimide, N-ethylmaleimide, N-propylmaleimide, N-tert-butylmaleimide, N-laurylmaleimide, N-cyclohexylmaleimide, N-phenylmaleimide, N-(2-chlorophenyl)maleimide, N-benzylmaleimide, N-(1-pyrenyl)maleimide, 3-methyl-N-phenylmaleimide, N,N7-1, 2-phenylenedimaleimide, N,N'-1,3-phenylenedimaleimide, N,N'-1,4-phenylenedimaleimide, N,N'-(4-methyl-1,3-phenylene)bismaleimide, 1,1'-(methylene-1,4-phenylene)bismaleimide, phthalimide, N-methylphthalimide, N-ethylphthalimide, N-propylphthalimide, N-phenylphthalimide, N-benzylphthalimide, pyromellitic acid diimide.

The photoreactive catalyst having a functional group of formula (2), in which the atom of Y (m) is a phosphorus atom, includes, for example, bis(2,6-dimethoxybenzoyl)-2,4,4-trimethyl-pentylphosphine oxide, bis(2,4,6-trimethylbenzoylphenylphosphine oxide.

The photoreactive catalyst having a functional group of formula (2), in which the atom of Y(m) is a carbon atom, includes, for example, diketones such as 2,4-pentanedione, 3-methyl-2,4-pentanedione, 3-ethyl-2,4-pentanedione, 3-chloro-2,4-pentanedione, 1,1,1-trifluoro-2,4-pentanedione, 1,1,1,5,5,5-hexafluoro-2,4-pentanedione, 2,2,6,6-tetramethyl-3,5-heptanedione, 1-benzoylacetone, dibenzoylmethane; polycarboxylates such as dimethyl malonate, diethyl malonate, dimethyl methylmalonate, tetraethyl 1,1,2,2-ethanetetracarboxylate; and α-carbonyl-acetates such as methyl acetylacetonate, ethyl acetylacetonate, methyl propionylacetate.

Of the photoreactive catalysts having a functional group of formula (2), especially preferred are diacylphosphine oxides and their derivatives as their residue to remain after decay is extremely small.

The amount of the photoreactive catalyst having a functional group of formula (2) that may be in the material of the invention is preferably from 0.01 parts by weight to 30 parts by weigh as the uppermost limit, relative to 100 parts by weight of the polymer that contains the hydrolyzing silyl group-having polyalkylene glycol or polyoxyalkylene segments. If it is smaller than 0.01 parts by weight, then the catalyst could not exhibit photoreactivity; but if larger than 30 parts by weight, then the light transmittance of the composition that contains the polymer having hydrolyzing silyl group-having polyalkylene glycol or polyoxyalkylene segments may lower, and, if so, even when the composition is exposed to light, only the surface part thereof could be crosslinked and cured but the depth thereof could not be crosslinked and cured. More preferably, the lowermost limit of the content is 0.1 parts by weight; and the uppermost limit thereof is 20 parts by weight.

The organic metal compound includes, for example, tin compounds such as dibutyltin dilaurate, dibutyltin oxide, dibutyltin diacetate, dibutyltin phthalate, bis(dibutyltin laurate)oxide, dibutyltin bisacetylacetonate, dibutyltin bis (monoester maleate), tin octylate, dibutyltin octanoate, dioctyltin oxide; and alkyloxy titanates such as tetra-n-butoxy titanate, tetraisopropoxy titanate.

The crosslinking agent for crosslinking the polymer that contains the above-mentioned polymerizable unsaturated group-having polyalkylene glycol or polyoxyalkylene segments includes, for example, thermal radical initiators such as peroxides, azo compounds; optical radical initiators that act through exposure to UV rays or visible rays; and combined initiator systems comprising a thermal or optical radical initiator and a compound having plural mercapto groups.

The thermal radical initiator includes, for example, hydroperoxides such as diisopropylbenzene hydroperoxide, 1,1,3,3-tetramethylbutyl hydroperoxide, cumeme hydroperoxide, tert-hexyl hydroperoxide, tert-butyl hydroperoxide; dialkyl peroxides such as α,α'-bis(tert-butylperoxy-m-isopropyl) benzene, dicumyl peroxide, 2,5-dimethyl-2,5-bis(tert-butylperoxy)hexane, tert-butylcumyl peroxide, di-tert-butyl peroxide, 2,5-dimethyl-2,5-bis(tert-butylperoxy)hexyne-3; organic peroxides such as ketone peroxides, peroxy ketals, diacyl peroxides, peroxy dicarbonates, peroxy esters; and azo compounds such as 2,2'-azobisisobutyronitrile, 1,1'-(cyclohexane-1-carbonitrile), 2,2'-azobis(2-cyclopropylpropionitrile), 2,2'-azobis(2,4-dimethylvaleronitrile).

The optical radical initiator includes, for example, acetophenone derivative compounds such as 4-(2-hydroxyethoxy)phenyl (2-hydroxy-2-propyl) ketone, α-hydroxy-α, α'-dimethylacetophenone, methoxyacetophenone, 2,2-dimethoxy-2-phenylacetophenone; benzoin ether compounds such as benzoin ethyl ether, benzoin propyl ether; ketal derivative compounds such as benzyldimethyl ketal; halogenoketones; acylphosphine oxides; acyl phosphates; 2-methyl-1-[4-(methylthio)phenyl]-2-morpholinopropan-1-one, 2-benzyl-2-N,N-dimethylamino-1-(4-morphoinophenyl)-1-butanone; bis(2,4,6-trimethylbnzoyl)phenylphosphine oxide, bis(2,6-dimethoxybenzoyl)-2,4,4-trimethylpentylphosphine oxide; bis(η5-cyclopentadienyl)-bis(pentafluorophenyl)-titanium, bis(η5-cyclopentadienyl)-bis[2,6-difluoro-3-(1H-pyri-1-dyl)phenyl]-titanium; anthracene, perylene, coronene, tetracene, benzanthracene, phenothiazine, flavin, acridine, ketocoumarin, thioxanthone derivatives, benzophenone, acetophenone, 2-chlorothioxanthone, 2,4-dimethylthioxanthone, 2,4-diethylthioxanthone, 2,4-diisopropylthioxanthone, isopropylthioxanthone. One or more of these may be used herein either singly or as combined.

The crosslinking agent that crosslinks the polymer having the above-mentioned epoxy group-containing polyalkylene glycol or polyoxyalkylene segments includes, for example, an optical cationic initiator capable of generating an acid through exposure to UV rays or visible rays, a thermal cationic initiator, an amine compound-type curing agent, an amide-type curing agent, an acid anhydride-type curing agent, a mercapto-type curing agent, a thermal latent curing agent such as ketimine or DICY, and an optical amine generator having a carbamoyloxyimino group or the like.

The optical cationic catalyst includes, for example, iron-arene complex compounds, aromatic diazonium salts, aromatic iodonium salts, aromatic sulfonium salts, pyridinium salts, aluminium complex/silanol salts, trichloromethyltriazine derivatives. Of those, the counter anion of onium salts and pyridinium salts, for example, $SbF_6^-$, $PF_6^-$, $AsF_6^-$, $BF_4^-$ tetrakis(pentafluoro)borate, trifluoromethanesulfonate, methanesulfonate, trifluoroacetate, acetate, sulfonate, tosylate, nitrate. Some of these optical catalysts are commercially available, for example, Irgacure 261 (by Ciba-Geigy), Optomer SP-150 (by Asahi Denka Kogyo), Optomer SP-151 (by Asahi Denka Kogyo), Optomer SP-170 (by Asahi Denka Kogyo), Optomer sP-171 (by Asahi Denka Kogyo), UVE-1014 (by General Electronics), CD-1012 (by Sartomer), Sunaid SI-60L (by Sanshin Chemical Industry), Sunaid SI-80L (by Sanshin Chemical Industry), Sunaid SI-100L (by Sanshin Chemical Industry), CI-2064 (by Nippon Soda), CI-2639 (by Nippon Soda), CI-2624 (by Nippon Soda), CI-2481 (by Nippon Soda), RHODORSIL PHOTOINITIATOR 2074 (by Rhone-Poulenc), UVI-6990 (by Union Carbide), BBI-103 (by Midori Chemical), MPI-103 (by Midori Chemical), TPs-103 (by Midori Chemical), MDS-103 (by Midori Chemical), DTS-103 (by Midori Chemical), NAT-103 (by Midori Chemical), NDS-103 (by Midori Chemical). One or more of these optical cationic catalysts may be used herein either singly or as combined.

The thermal cationic curing agent includes, for example, ammonium salts, sulfonium salts, iodonium salts and diazonium salts each having at least one alkyl group, as well as boron trifluoride/triethylamine complex. The counter anion of these salts include, for example, anions such as $SbF_6^-$, PF$_6^-$, AsF$_6^-$, BF$_4^-$ tetrakis(pentafluoro)borate, trifluoromethanesulfonate, methanesulfonate, trifluoroacetate, acetate, sulfonate, tosylate, nitrate.

The optical amine generator includes, for example, carbamoyloxyimino group-having compounds, cobalt-amine complexes, o-nitrobenzyl carbamate, o-acyloximes.

The crosslinking agent (3) is not specifically defined, and is, for example, α,ω-diaminopolyoxypropylene.

The heat-decaying material of the invention, which contains a crosslinked polyoxyalkylene resin and therefore has a form of a heat-decaying sheet, may contain a functional group-having compound that is derived from the same reaction intermediate as that for the polymer that has crosslinkable functional group-having polyalkylene glycol or polyoxyalkylene segments, as a copolymerizable or co-crosslinkable component, not interfering with object of the invention. It may also contain a crosslinkable or polymerizable functional group-having compound that is derived from a reaction intermediate differing from that for the polymer that has crosslinkable functional group-having polyalkylene glycol or polyoxyalkylene segments, as a copolymerizable or co-crosslinkable component. Further, it may contain a compound having both these two types of functional groups.

The copolymerizable or co-crosslinkable component includes, for example, radical polymerizable unsaturated group-having compounds. The radical polymerizable unsaturated group-having compounds are, for example, styryl group-having compounds such as styrene, indene, α-methylstyrene, p-methylstyrene, p-chlorostyrene, p-chloromethylstyrene, p-methoxystyrene, p-tert-butoxystyrene, divinylbenzene; and (meth)acryloyl group-having compounds such as methyl (meth)acrylate, ethyl (meth) acrylate, propyl (meth) acrylate, n-butyl (meth) acrylate, tert-butyl (meth) acrylate, cyclohexyl (meth)acrylate, 2-ethylhexyl (meth) acrylate, n-octyl (meth) acrylate, isooctyl (meth)acrylate, isononyl (meth)acrylate, isomyristyl (meth)acrylate, stearyl (meth)acrylate, isobornyl (meth)acrylate, benzyl (meth)acrylate, 2-butoxyethyl (meth)acrylate, 2-phenoxyethyl (meth) acrylate, glycidyl (meth)acrylate, tetrahydrofurfuryl (meth) acrylate, hexanediol di(meth) acrylate, ethylene glycol di(meth)acrylate, polyethylene glycol di(meth)acrylate, propylene glycol di meth) acrylate, polypropylene glycol di(meth) acrylate, neopentyl glycol di(meth)acrylate, trimethylolpropane tri(meth)acrylate, pentaerythritol di(meth) acrylate, pentaerythritol tri(meth)acrylate, pentaerythritol tetra(meth)acrylate, dipentaerythritol hexa(meth)acrylate, epoxy acrylate, polyester acrylate, urethane acrylate, 2-hydroxyethyl (meth)acrylate, 3-hydroxypropyl (meth)acrylate, 2-hydroxypropyl (meth)acrylate, 4-hydroxybutyl (meth) acrylate, 2-hydroxybutyl (meth) acrylate, 5-hydroxypentyl (meth)acrylate, 6-hydroxyhexyl (meth)acrylate, 3-hydroxy-3-methylbutyl (meth)acrylate, 2-hydroxy-3-phenoxypropyl (meth) acrylate, pentaerythritol tri(meth)acrylate, 2-[(meth) acryloyloxy]ethyl 2-hydroxyethylphthalate, 2-[(meth)acryloyloxy]ethyl 2-hydroxypropylphthalate, compounds of the following formula (3), compounds of the following formula (4).

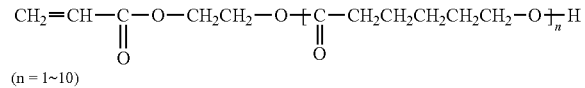

(3)

(n = 1~10)

-continued

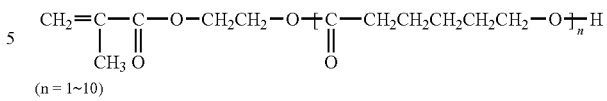

(4)

(n = 1~10)

The copolymerizable or co-crosslinkable component further includes, for example, epoxy group-having compounds. Such epoxy group-having compounds are, for example, bisphenol A-type epoxy resins, hydrogenated bisphenol A-type epoxy resins, bisphenol F-type epoxy resins, novolak-type epoxy resins, cresol-type epoxy resins, aliphatic cyclic epoxy resins, bromoepoxy resins, rubber-modified epoxy resins, urethane-modified epoxy resins, glycidyl ester-type compounds, epoxydated polybutadiene, epoxydated SBS (SBS indicates poly(styrene-co-butadiene-co-styrene) copolymer).

The copolymerizable or co-crosslinkable component further includes, for example, isocyanate group-having compounds. Such isocyanate group-having compounds are, for example, xylylene diisocyanate, toluylene diisocyanate, isophorone diisocyanate, naphthalene diisocyanate, 1,6-hexamethylene diisocyanate, phenylmethane diisocyanate.

The heat-decaying material of the invention, which contains a crosslinked polyoxyalkylene resin and therefore has a form of a heat-decaying sheet, may be a non-supported type with no substrate, or may be a supported type that comprises a layer of a polymer containing polyalkylene glycol or polyoxyalkylene segments formed on one or both faces of a substrate processed or not processed for lubrication.

The heat-decaying material of the invention, which contains an uncrosslinked or crosslinked polyoxyalkylene resin and has a form of a heat-decaying sheet, may be controlled to have broad-range properties to be adhesive or non-adhesive. For example, when polypropylene glycol is the principal component of the material, then the material may be highly adhesive; but when the content of solid polyethylene glycol or polytetramethylene glycol in the material is higher, then the adhesiveness of the material may lower. Further, the adhesiveness of the material may be controlled depending on the crosslinking degree of the resin in the material.

The method for producing the heat-decaying material of the invention which has a form of a heat-decaying sheet is not specifically defined. The material may be formed in any known method, for example, of solvent casting, extrusion coating, calendering or UV polymerization in coating.

When the heat-decaying material of the invention which has a form of a heat-decaying sheet is produced according to a solvent casting process, for example, the starting resin and optionally additives such as crosslinking agent and filler are dissolved or dispersed in a solvent, the resulting solution is cast onto a lubrication-processed film, and the solvent is removed by drying.

When the heat-decaying material of the invention which has a form of a heat-decaying sheet is produced according to a hot-melt coating process, for example, the starting resin and optionally additives such as crosslinking agent and filler are mixed and dispersed under heat, and then applied onto a substrate through a T-die or the like in a mode of hot-melt coating.

When the heat-decaying material of the invention which has a form of a heat-decaying sheet is produced according to a process of UV polymerization in coating, for example, a composition prepared by mixing a photo-crosslinkable functional group-having starting resin, an initiator or a crosslinking agent selected in accordance with the crosslinkable functional group, and optionally various additives such as filler is applied to a substrate while exposed to light capable of activating the optical initiator.

The lamp for light irradiation includes, for example, low-pressure mercury lamp, middle-pressure mercury lamp, high-pressure mercury lamp, ultra-high-pressure mercury lamp, chemical lamp, black light lamp, microwave-excited mercury lamp, metal halide lamp. In this case, when the light from the lamp includes a wavelength range light to which the optical cationic polymerization initiator used is sensitive, then the wavelength range light may be cut off through a suitable filter before light irradiation.

When the heat-decaying material of the invention which has a form of a heat-decaying sheet is produced according to a process of UV polymerization in coating, a sensitizer may be previously added to the starting composition. The sensitizer includes, for example, anthracene derivatives, thioxanthone derivatives.

When the heat-decaying material of the invention which has a form of a heat-decaying sheet is produced according to a thermal polymerization process, for example, a composition prepared by mixing a thermal-crosslinkable functional group-having starting resin, an initiator or a crosslinking agent selected in accordance with the crosslinkable functional group, and optionally various additives such as filler is applied to a substrate while heating it to polymerize or crosslink the resin. The heating method in this case includes, for example, hot plate, hot press, drying oven, heat gun, IR heater, dielectric heater, induction heater, ultrasonic heater. When the resin to be crosslinked has multiple crosslinkable functional groups that differ depending on their object, then plural production methods may be combined for the resin.

The heat-decaying material of the invention may have a paste morphology at room temperature, and it may be crosslinked through exposure to light into a cured product (this may be hereinunder referred to as a paste-type heat-decaying material). The material of this type is described below.

The paste-type heat-decaying material of the invention comprises a polymer that contains crosslinkable functional group-having polyoxyalkylene glycol or polyoxyalkylene segments and a crosslinking agent, and its viscosity at 20° C. falls between 1 and 5,000,000 mPa•s.

The polymer that contains polyoxyalkylene glycol or polyoxyalkylene segments, the crosslinkable functional group that the polymer has, and the crosslinking agent to be in the paste-type heat-decaying material of the invention may be the same as those mentioned hereinabove.

However, in order that the paste-type heat-decaying material of the invention could keep the paste morphology thereof at room temperature, for example, in order that it could have a viscosity at 20° C. falling between 1 and 5,000,000 mPa•s, the number-average molecular weight of the crosslinkable functional group-having polymer that contains crosslinkable functional group-having polyoxyalkylene glycol or polyoxyalkylene segments is preferably at most 5000.

When the paste-type heat-decaying material of the invention contains at most 30% by mass of a polymerizable unsaturated group-having compound, then its curability may be enhanced.

The polymerizable unsaturated group of the polymerizable unsaturated group-having compound is not specifically defined, including, for example, a styryl group, an acryloyl group, a methacryloyl group, a vinyl ester group, a vinyloxy group.

Though not specifically defined, the styryl group-having compound includes, for example, styrene, indene, α-methylstyrene, p-methylstyrene, p-chlorostyrene, p-chloromethylstyrene, p-methoxystyrene, p-tert-butoxystyrene, divinylbenzene.

The acryl group or methacryloyl group-having compound includes, for example, methyl (meth)acrylate, ethyl (meth)acrylate, propyl (meth) acrylate, n-butyl (meth) acrylate, tert-butyl (meth)acrylate, cyclohexyl (meth)acrylate, 2-ethylhexyl (meth)acrylate, n-octyl (meth)acrylate, isooctyl (meth)acrylate, isononyl (meth)acrylate, isomyristyl (meth)acrylate, stearyl (meth)acrylate, isobornyl (meth)acrylate, benzyl (meth)acrylate, 2-butoxyethyl (meth)acrylate, 2-phenoxyethyl (meth)acrylate, glycidyl (meth)acrylate, tetrahydrofurfuryl (meth)acrylate, hexanediol di(meth)acrylate, ethylene glycol di(meth)acrylate, polyethylene glycol di(meth)acrylate, propylene glycol di(meth)acrylate, polypropylene glycol di(meth)acrylate, neopentyl glycol di(meth)acrylate, trimethylolpropane tri(meth)acrylate, pentaerythritol di(meth)acrylate, pentaerythritol tri(meth)acrylate, pentaerythritol tetra(meth)acrylate, dipentaerythritol hexa(meth)acrylate, epoxy acrylate, polyester acrylate, urethane acrylate, 2-hydroxyethyl (meth)acrylate, 3-hydroxypropyl (meth)acrylate, 2-hydroxypropyl (meth)acrylate, 4-hydroxybutyl (meth) acrylate, 2-hydroxybutyl (meth) acrylate, 5-hydroxypentyl (meth)acrylate, 6-hydroxyhexyl (meth)acrylate, 3-hydroxy-3-methylbutyl (meth)acrylate, 2-hydroxy-3-phenoxypropyl (meth) acrylate, pentaerythritol tri(meth)acrylate, 2-[(meth)acryloyloxy]ethyl 2-hydroxyethylphthalate, 2-[(meth)acryloyloxy]ethyl 2-hydroxypropylphthalate.

The vinyl ester group-having compound includes, for example, vinyl acetate, vinyl propionate, vinyl butyrate, vinyl caproate, vinyl benzoate, vinyl cinnamate.

The vinyloxy group-having compound includes, for example, n-propyl vinyl ether, n-butyl vinyl ether, isobutyl vinyl ether, tert-butyl vinyl ether, tert-amyl vinyl ether, cyclohexyl vinyl ether, 2-ethylhexyl vinyl ether, dodecyl vinyl ether, octadecyl vinyl ether, 2-chloroethyl vinyl ether, ethylene glycol butyl vinyl ether, triethylene glycol methyl vinyl ether, (4-vinyloxy)butyl benzoate, ethylene glycol divinyl ether, diethylene glycol divinyl ether, triethylene glycol divinyl ether, tetraethylene glycol divinyl ether, butane-1,4-diol divinyl ether, hexane-1,6-diol divinyl ether, cyclohexane-1, 4-dimethanol divinyl ether, di(4-vinyloxy)butyl isophthalate, di(4-vinyloxy)butyl glutarate, di(4-vinyloxy)butyl succinate, trimethylolpropane trivinyl ether, 2-hydroxyethyl vinyl ether, 4-hydroxybutyl vinyl ether, 6-hydroxyhexyl vinyl ether, cyclohexane-1,4-dimethanolmonovinyl ether, diethylene glycol monovinyl ether, 3-aminopropyl vinyl ether, 2-(N,N-diethylamino) ethyl vinyl ether, urethane vinyl ether, polyester vinyl ether.

Not specifically defined, the viscosity of the paste-type heat-decaying material of the invention may fall between 1 and 5,000,000 mPa•s at 20° C., but may be suitably selected and determined depending on the use, the object and the service condition of the material.

For example, when the paste-type heat-decaying material of the invention is uniformly formed within a desired region according to a spin-coating process, a pulling-up process or a dipping process, then the viscosity of the material at 20° C. preferably falls between 1 and 100 mPa•s.

When the paste-type heat-decaying material of the invention is formed within a desired region according to a brush-coating process, then the viscosity of the material at 20° C. preferably falls between 500 and 100,000 mPa•s.

When the paste-type heat-decaying material of the invention is formed to have a desired pattern according to a screen-printing process, then the viscosity of the material at 20° C. preferably falls between 20 and 1,000 mPa·s.

The paste-type heat-decaying material of the invention keeps its paste condition at room temperature, having a viscosity at 20° C. falling between 10 and 5,000,000 mPa·s, but when it receives energy for crosslinking, then it crosslinks and cures into a crosslinked and cured product.

For crosslinking and curing the paste-type heat-decaying material of the invention, employable is a mode of thermal crosslinking by heat or a mode of photocrosslinking by light.

In thermal crosslinking, however, the polyoxyalkylene resin in the paste-type heat-decaying material of the invention may be decomposed and lost if overheated, and therefore some attention must be paid thereto. For these reasons, photocrosslinking is preferred for crosslinking and curing the paste-type heat-decaying material of the invention.

When the paste-type heat-decaying material of the invention is photocrosslinked and cured, employable is a method of exposing the heat-decaying material to light that may activate the crosslinking reaction.

The lamp for light irradiation includes, for example, low-pressure mercury lamp, middle-pressure mercury lamp, high-pressure mercury lamp, ultra-high-pressure mercury lamp, chemical lamp, black light lamp, microwave-excited mercury lamp, metal halide lamp. In this case, when the light from the lamp includes a wavelength range light to which the optical cationic polymerization initiator used is sensitive, then the wavelength range light may be cut off through a suitable filter before light irradiation.

When the paste-type heat-decaying material of the invention is photocrosslinked and cured, a sensitizer may be added to the heat-decaying material. The sensitizer includes, for example, anthracene derivatives and thioxanthone derivatives.

When the paste-type heat-decaying material of the invention is thermally crosslinked and cured, employable are a method and an apparatus for heating the heat-decaying material. The method and the apparatus in this case include, for example, hot plate, hot press, drying oven, heat gun, IR heater, dielectric heater, induction heater, ultrasonic heater.

In the paste-type heat-decaying material of the invention, the crosslinkable functional group-having polymer that contains crosslinkable functional group-having polyoxyalkylene glycol or polyoxyalkylene segments may be partially crosslinked with a crosslinking agent so that the resulting material may have a micro-gel morphology.

The cured product obtained by crosslinking the paste-type heat-decaying material of the invention keeps the cured product form thereof at a temperature not higher than 100° C., but when heated at a predetermined temperature falling between 150 and 350° C., then at least 95% by weight of the cured product decays within 10 minutes.

The heat-decaying material of the invention may contain a liquid resin. Containing a liquid resin, the decay-initiating temperature of the heat-decaying material of the invention lay be lowered and the material may be rapidly decayed at 150° C. or higher. Not specifically defined, the liquid resin may be any compound having a boiling point not lower than 100° C. in consideration of the shape sustainability of the heat-decaying sheet and the decaying temperature thereof. For example, it includes polyethylene glycol oligomer, polypropylene oligomer, polytetramethylene glycol oligomer, dioctylphthalate, dibutyl phthalate, glycerin monooleate.

The heat-decaying material of the invention may contain a filler such as titanium oxide, alumina, colloidal calcium carbonate, heavy calcium carbonate, barium carbonate, magnesium carbonate, silica, surface-processed silica, calcium silicate, anhydrous silicon, hydrous silicon, mica, surface-processed mica, talc, clay, surface-processed talc, boron nitride, alumina nitride, carbon nitride, carbon black, white carbon, short glass fibers, glass beads, glass balloons, shirasu balloons, acryl beads, polyethylene beads. Containing it, the cohesion force of the sheet or the cured product increases. However, since it inevitably gives an inorganic residue, its content must be the necessary minimum one.

In addition, the heat-decaying material of the invention may contain a silane coupling agent.

The silane coupling agent includes, for example, vinyltrimethoxysilane, dimethyldimethoxysilane, methyltrimethoxysilane, methyltriethoxysilane, tetramethoxysilane, tetraethoxysilane, phenyltrimethoxysilane, diphenyldimethoxysilane, 3-aminopropyltrimethoxysilane, 3-aminopropylmethyldimethoxysilane, 3-aminopropyltriethoxysilane, N-(2-aminoethyl)-3-aminopropyltrimethoxysilane, N-(2-aminoethyl)-3-aminopropyltriethoxysilane, N,N'-bis-[3-(trimethoxysilyl)propyl]ethylenediamine, N,N'-bis[3-(triethoxysilyl)propyl]ethylenediamine, N,N'-bis-[3-(trimethoxysilyl)propyl]hexaethylenediamine, N,N'-bis-[3-(triethoxysilyl)propyl]hexaethylenediamine.

The heat-decaying material of the invention may contain a titanium coupling agent.

The titanium coupling agent includes, for example, isopropyl triisostearoyltitanate, isopropyl n-dodecylbenzenesulfonyltitanate, isopropyl tris(dioctylpyrophosphate)titanate, tetraisopropyl bis(dioctylphosphite)titanate, tetraisopropyl bis(ditridecylphosphite)titanate, tetra(2,2-diallyloxymethyl-1-butyl) bis(di-tridecyl)phosphite titanate, bis(dioctylpyrophosphate)oxyacetate titanate, bis(dioctylpyrophosphate)ethylene titanate, isopropyl tri(N-aminoethyl-aminoethyl)titanate.

The heat-decaying material of the invention may contain a adhesiveness-improving resin such as rosins, rosin esters, disproportionated rosin esters, hydrogenated rosin esters, polymerized rosin esters, terpene resins, terpene-phenol resins, aromatic modified terpene resins, C5/C9 petroleum resins, hydrogenated petroleum resins, phenol resins, chroman-indene resins, ketone resins, xylene resins, for the purpose of increasing the adhesiveness of the material.

Further, the heat-decaying material of the invention may contain any of dropping inhibitor, antioxidant, antiaging agent, UV absorbent, solvent, fragrance, pigment and dye, in accordance with the use and the service mode of the material.

The heat-decaying material and its cured product of the invention are not specifically defined, provided that at least 95% by weight thereof could decay within 10 minutes when heated at a predetermined temperature falling between 150 and 350° C., but they may be suitably selected and prepared so that their decaying temperature could satisfy the use object and the service mode of the material.

For example, when the material could decay in a temperature atmosphere falling between 150 and 220° C., then it may be used for temporary fixation and for other various applications since it may be decayed in a process of temporary fixation of optical parts or in a process of packaging semiconductor devices by the use of low-temperature solder.

When the material could decay in a temperature atmosphere falling between 220 and 280° C., then it may be used for temporary fixation and for other various applications since it may be decayed in a process of packaging semiconductor devices by the use of lead-free solder.

When the material could decay in a temperature atmosphere falling between 280 and 350° C., then it may be used in forming porous thin film on aluminium wiring and may be used for various applications.

The heat-decaying material and its cured product of the invention hardly decompose at a temperature not higher than 100° C. and keep their solid form, but may rapidly decompose at a relatively low temperature falling between 150 and 350° C. so that most of the solid part thereof decays. Accordingly, when heated, the material may be readily removed from the objects to which it has stuck, and, in addition, the objects receive little thermal influence. The heat-decaying material of the invention can be used, for example, as a temporary fixer such as binder for temporary fixation of glass fibers, and, after used, the temporary fixation with it may be relieved by heating; or it may be used as an adhesive for fixation of interlayer film for glass laminates, plasma display heat-conductive sheets or wallpapers, for fixation of gravel on railways, for fixation of stone structures, and for fixation of gypsum boards, and when recycled, it may be recovered merely by heating with no damage to the structures; or it may be used in temperature sensors in such a manner that it is disposed between contact points or one contact point is fixed with it and it is decayed at a predetermined temperature so as to shut up the contact point; or it may be used as a fixation paste or a fixation sheet for temporarily fixing metal surface-protective sheets, rust-preventing covers or polished samples; or it may be used as an under film for reinforcing semiconductor chips or substrates, and, when desire, it may be removed by heating; or it may be used for laser ablation resist to form a resist pattern.

The applications of the heat-decaying material of the invention are not limited to those mentioned above. For example, the heat-decaying material is favorably used as a masking agent in working articles for preventing the area around the worked part of the articles from being soiled. The masking agent of the type is favorably used in a masking material that covers the area to be processed, for example, in a process of etching substrates for electronic parts or chips of electronic parts through laser processing or in a process of forming through-holes.

Heretofore, a re-peelable adhesive tape is used for such a masking material. However, the masking material of the re-peelable adhesive tape must be peeled after working. As opposed to this, when the heat-decaying material of the invention is used as a masking material, then it can be readily removed by heating after working. In addition, when the heat-decaying material of the invention is so designed that it is transparent, and even when the masking material is applied so as to cover even the part to be worked, the covered structure could be worked with laser or the like. Accordingly, since the masking material may be applied to the region that includes the part to be worked and therearound, the working efficiency may be enhanced. Furthermore, since the heat-decaying material of the invention can be cast in the absence of solvent, it may be readily applied to the surface of the objects to be worked, as a masking material thereover.

Of the above-mentioned applications of the heat-decaying material of the invention, those that are especially important are porous films, conductive particles transfer sheets mentioned above, transfer sheets for circuit formation, and pattern formation. These are described in detail hereinunder.

[Porous Film]

A method for producing a porous film by the use of the heat-decaying material of the invention is described.

The method for producing a porous material comprises:

a step of preparing a precursor that contains a skeleton-forming crosslinkable material (a) and the heat-decaying material (b) of the invention that comprises a polyoxyalkylene resin as the principal ingredient thereof;

a step of heating the precursor at a temperature not lower than the temperature at which the heat-decaying material (b) decays under heat;

a step of crosslinking the crosslinkable material before or during the heating to form a skeleton phase, in which the heat-decaying material (b) decays in the crosslinked material to give a porous material having a large number of pores surrounded by the skeleton phase.

(Crosslinkable Material (a) for Skeleton Formation)

For forming the matrix of the porous material, used is a crosslinkable material for skeleton formation. The crosslinkable material for skeleton formation is not specifically defined, but alkoxysilane is favorably used for it.

The alkoxysilane may be any type of alkoxysilane formed through condensation of an inorganic silane compound phase. Preferred examples of the alkoxysilane of the type includes dimethoxydimethylsilane, cyclohexyldimethoxymethylsilane, diethyldimethylsilane, dimethoxymethyloctylsilane, diethoxymethylvinylsilane, chloromethyl(diisoprooxy) methylsilane, dimethoxymethylphenylsilane, diethoxydiphenylsilane, trimethoxysilane, triethoxysilane, methyltrimethoxysilane, trimethoxypropylsilane, isobutyltrimethoxysilane, octyltrimethoxysilane, octadecyltrimethoxysilane, methyltriethoxysilane, ethyltriethoxysilane, isobutyltriethoxysilane, octyltriethoxysilane, vinyltrimethoxysilane, vinyltriethoxysilane, allyltriethoxysilane, (3-chloropropyl)trimethoxysilane, chloromethyltriethoxysilane, tris(2-methoxyethoxy)vinylsilane, 3-glycidoxypropyltrimethoxysilane, diethoxy(3-glycidoxypropyl) methylsilane, trimethoxy[2-(7-oxabicyclo[4.1.0]-hept-3-yl) ethyl]silane, chlorotrimethoxysilane, chlorotriethoxysilane, chlorotris(1,3-dimethylbutoxy)silane, dichlorodiethoxysilane, 3-(triethoxysilyl)propionitrile, 4-(triethoxysilyl)butyronitrile, 3-(triethoxysilyl)propyl isocyanate, 3-(triethoxysilyl)propylthio isocyanate, phenyltrimethoxysilane, phenyltriethoxysilane, tetramethoxysilane, tetraethoxysilane, tetrapropoxysilane, tetrabutoxysilane, hexamethylcyclotrisiloxane, 2,4,6,8-tetramethylcyclotetrasiloxane, octamethylcyclotetrasiloxane, 2,4,6,8-tetramethyl-2,4,6,8-tetravinylcyclotetrasiloxane, octaphenylcyclotetrasiloxane, N-(3-acryloyloxy-2-hydroxypropyl)-3-aminopropyltriethoxysilane, 3-acryloyloxypropyldimethylmethoxysilane, 3-acryloyloxypropylmethyldimethoxysilane, 3-acryloyloxypropyltrimethoxysilane, 3-acryloyloxypropylmethylbis(trimethylsiloxy)silane, allylriethoxysilane, allyltrimethoxysilane, 3-allylaminopropyltrimethoxysilane, 3-methacryloyloxypropyldimethylmethoxysilane, 3-methacryloyloxypropyldimethylethoxysilane, 3-methacryloyloxypropylmethyldimethoxysilane, 3-methacryloyloxypropylmethyldiethoxysilane, 3-methacryloyloxypropyltrimethoxysilane, 3-methacryloyloxypropenyltrimethoxysilane, vinylmethyldiacetoxysilane, vinyltriacetoxysilane, vinyldimethylmethoxysilane, vinyldimethylethoxysilane, vinylmethyldiethoxysilane, vinyltrimethoxysilane, vinyltriethoxysilane, vinyltriisopropoxysilane, vinyltriphenoxysilane, vinyldimethylisopentenyloxysilane, vinyldimethyl-2-((2-ethoxyethoxy)ethoxy)silane, vinyltris(1-methylvinyloxy)silane, vinyltris(2-methoxyethoxy) silane, phenylvinyldiethoxysilane, diphenylvinylethoxysilane, 6-triethoxysilyl-2-norbornene, oct-3-enyltrimethoxysilane, styrylethyltrimethoxysilane. One or more of these alkoxysilanes may be used herein either singly or as combined.

The alkoxysilane condenses in the heating step that will be mentioned hereinunder, and forms an inorganic silane compound phase, or that is, an $SiO_2$ phase to constitute the matrix phase of a porous material.

The alkoxysilane is liquid at room temperature, and therefore, in the precursor that contains the alkoxysilane and the heat-decaying material (b) of the invention mentioned below, the heat-decaying material may be uniformly dispersed.

The heat-decaying material (b) of the invention is prepared, as dispersed or dissolved in the above-mentioned, skeleton-forming crosslinkable material (a), concretely, liquid alkoxysilane. When the heat-decaying material is dispersed and when the particle size thereof is controlled, then the size of the pores that are formed after the heat-decaying material has been decayed under heat may be thereby controlled. Accordingly, it is desirable that the particle size of the heat-decaying material is uniform. For lowering the dielectric constant of the porous material, the pore size must be satisfactorily large, for example, preferably falling between 0.01 μm and 100 μm or so. Accordingly, the particle size of the heat-decaying material is preferably from 0.01 μm to 100 μm or so.

In the method of producing the porous film by the use of the heat-decaying material of the invention, the ratio of the heat-decaying material is preferably from 5 to 1000 parts by weight to 100 parts by weight of the skeleton-forming crosslinkable material (a). If the ratio is less than 5 parts by weight, then the porosity will be too low and the dielectric constant could not be sufficiently low; but if larger than 1000 parts by weight, then the strength of the porous material may lower.

For adding the heat-decaying material to the skeleton-forming crosslinkable material (a), the skeleton-forming crosslinkable material (a) and the heat-decaying material may be mixed in any suitable method, and the heat-decaying material may be thereby readily uniformly dispersed.

(Heating)

In the invention, a precursor that comprises the heat-decaying material dispersed in the skeleton-forming crosslinkable material (a) is obtained in the manner mentioned above, and the precursor is heated at a temperature not lower than the temperature at which the heat-decaying material decays under heat. Accordingly, when the skeleton-forming crosslinkable material (a) is an alkoxysilane, then an inorganic silane compound phase is formed through condensation of the alkoxysilane and the heat-decaying material in the inorganic silane compound phase is decayed to give a large number of pores. Specifically, a porous material is thereby obtained in that manner.

The heating may be effected, for example, at a temperature falling between 150 and 350° C. Specifically, the pores may be formed by heating at a relatively low temperature. The pores may be formed by heating at a temperature in the range within 10 minutes, or that is, a porous material can be obtained within a relatively short period of time.

The porous material thus obtained may be used for various applications. Specifically, since a large number of uniform and satisfactorily large pores are dispersed in the material and since the resulting porous material may have a high mechanical strength, the porous material may be favorably used as interlayer insulating films, as electrodes or proton-conductive films in fuel cells, and as heat-insulating materials. In particular, since relatively large pores can be uniformly dispersed therein, the porous film of the porous material can be favorably used as interlayer insulating films in electronic structures such as semiconductor devices or multi-layered substrates.

[Conductive Particles Transfer Sheet]

A conductive particles transfer sheet that comprises the heat-decaying material of the invention is described below.

The conductive particles transfer sheet that comprises the heat-decaying material of the invention is characterized in that conductive fine particles are adhered to and disposed on a sheet-type heat-decaying material.

Embodiments of the conductive particles transfer sheet that comprises the heat-decaying material of the invention are described in detail hereinunder.

Embodiment 1 of Conductive Particles Transfer Sheet

Figure 2:
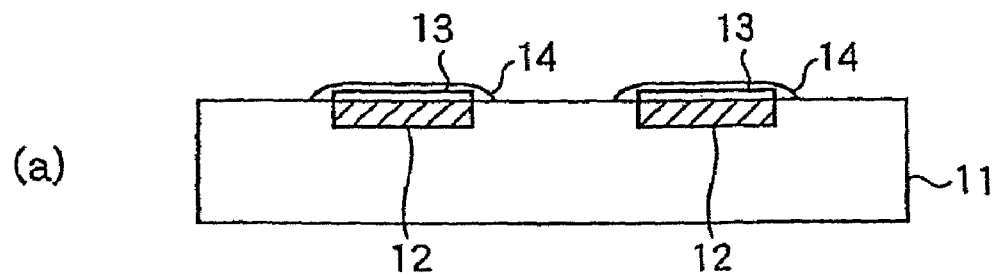
FIG. 2 includes cross-sectional views of a process scheme of forming solder ball bumps for BGA package for explaining the application embodiment 1 of a conductive particles transfer sheet.
Figure 2:
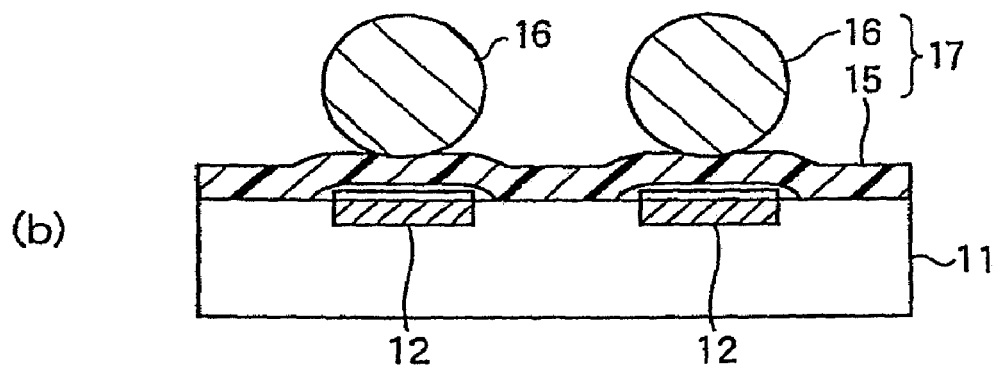
Figure 2:
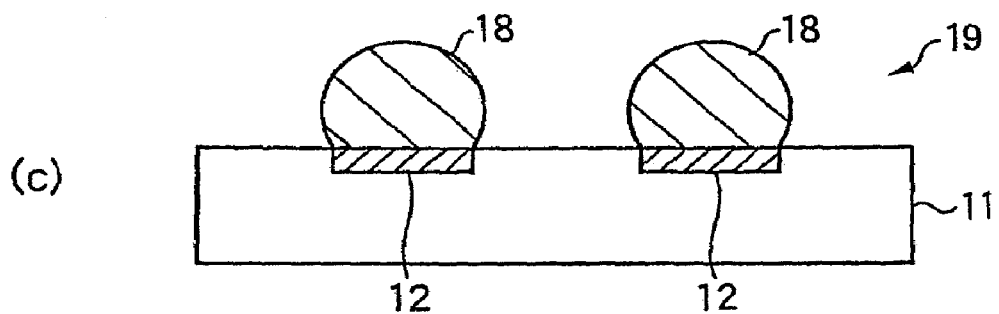
Figure 2:
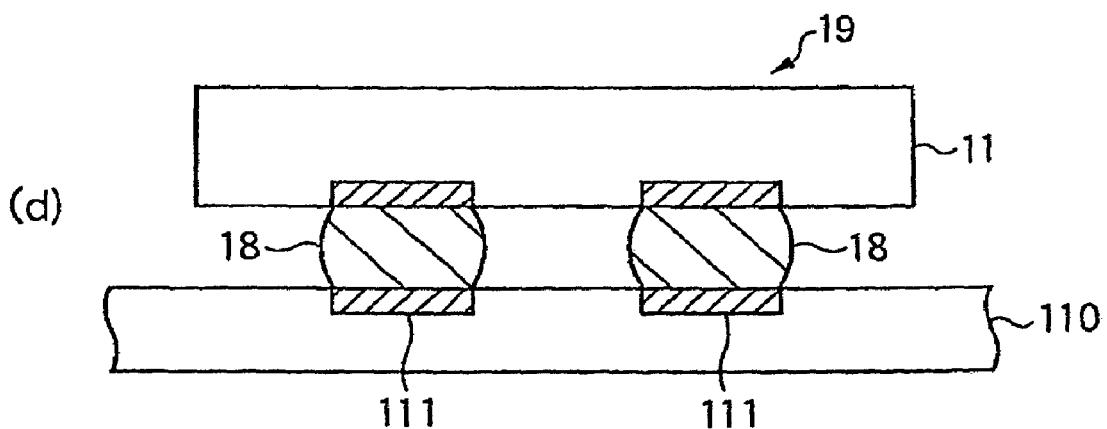

Embodiment 1 of the conductive particles transfer sheet that comprises the heat-decaying material of the invention is described with reference to FIG. 2. FIG. 2 includes cross-sectional views of a process scheme of forming solder ball bumps for BGA package and connecting them to a mother board, wiring board by the use of the above-mentioned conductive particles transfer sheet. In this, semiconductor chips are mounted on the BGA package.

As in FIG. 2(a), an antioxidant layer 13 is formed of Au foil or the like on the Cu wiring layer 12 formed in a BGA package 11, and a flux 14 is applied to the antioxidant layer 13 to cover it. Next, as in FIG. 2(b), a conductive particles transfer sheet 17 that comprises a heat-decaying adhesive sheet 15 and solder balls 16 adhered to predetermined regions of the surface thereof is laminated onto the BGA package 11 while the position of the Cu wiring layer 12 of the BGA package 11 is aligned with that of the solder ball 16. In this, the heat-decaying adhesive sheet 15 is formed of a polyoxyalkylene resin having a thickness of 50 μm or so. The solder ball 16 is formed of Pb—Sn alloy solder or Pb-free solder such as Sn—Cu, Sn—Ag or Sn—Zn solder, and its diameter is 500 μm or so.

In an nitrogen atmosphere at a temperature falling between 200° C. and 250° C., this is subjected to solder-reflow heat treatment, and the solder balls 16 are thereby melt-fused to the Cu wiring layer 12. In that manner, as in FIG. 2(c), solder ball bumps 18 are formed on the Cu wiring layer 12 of the BGA package 11. At the same time in the heat-treatment, the heat-decaying adhesive sheet 15 of the conductive particles transfer sheet 17 is pyrolyzed and vaporized, and is thereby completely decayed. In this, the Au atom of the antioxidant layer 13 melts in the solder ball bump 18, and a semiconductor device 19 is thus formed in which semiconductor chips are mounted on the BGA package 11 that has the solder ball bumps 18 in predetermined regions. In general, the BGA package comprises a multi-level wiring board.

As in FIG. 2(d), an electrode pad 111 of Cu on a wiring substrate, mother board 110 is melt-bonded to the solder ball bump 18, and a semiconductor device 19 is thereby mounted on the mother board 10. In this Example, when a low-melting-point organic acid is added to the heat-decaying adhesive sheet 15, then it acts to clean the surface of the Cu wiring layer 12, and therefore, the flux 14 will be unnecessary. In addition, depending on the manufacture condition, the antioxidant layer 13 may be omitted.

In that manner, when the conductive particles transfer sheet that comprises the heat-decaying material of the invention is used in forming solder ball bumps for BGA packages, then the producibility of semiconductor devices on which semiconductor chips are mounted significantly increases, and semiconductor devices of high reliability can be readily produced.

Embodiment 2 of Conductive Particles Transfer Sheet

Embodiment 2, a modification of Embodiment 1 of the conductive particles transfer sheet is described with reference to FIG. 3 and FIG. 4. In these drawings, the same parts as those in FIG. 2 are indicated by the same reference numerals. The difference between Embodiment 2 and Embodiment 1 is that, in Embodiment 2, the solder balls 16 are embedded into the heat-decaying adhesive sheet 15 and is adhered and positioned therein in the conductive particles transfer sheet 17 described in FIG. 2(b).

Figure 3:
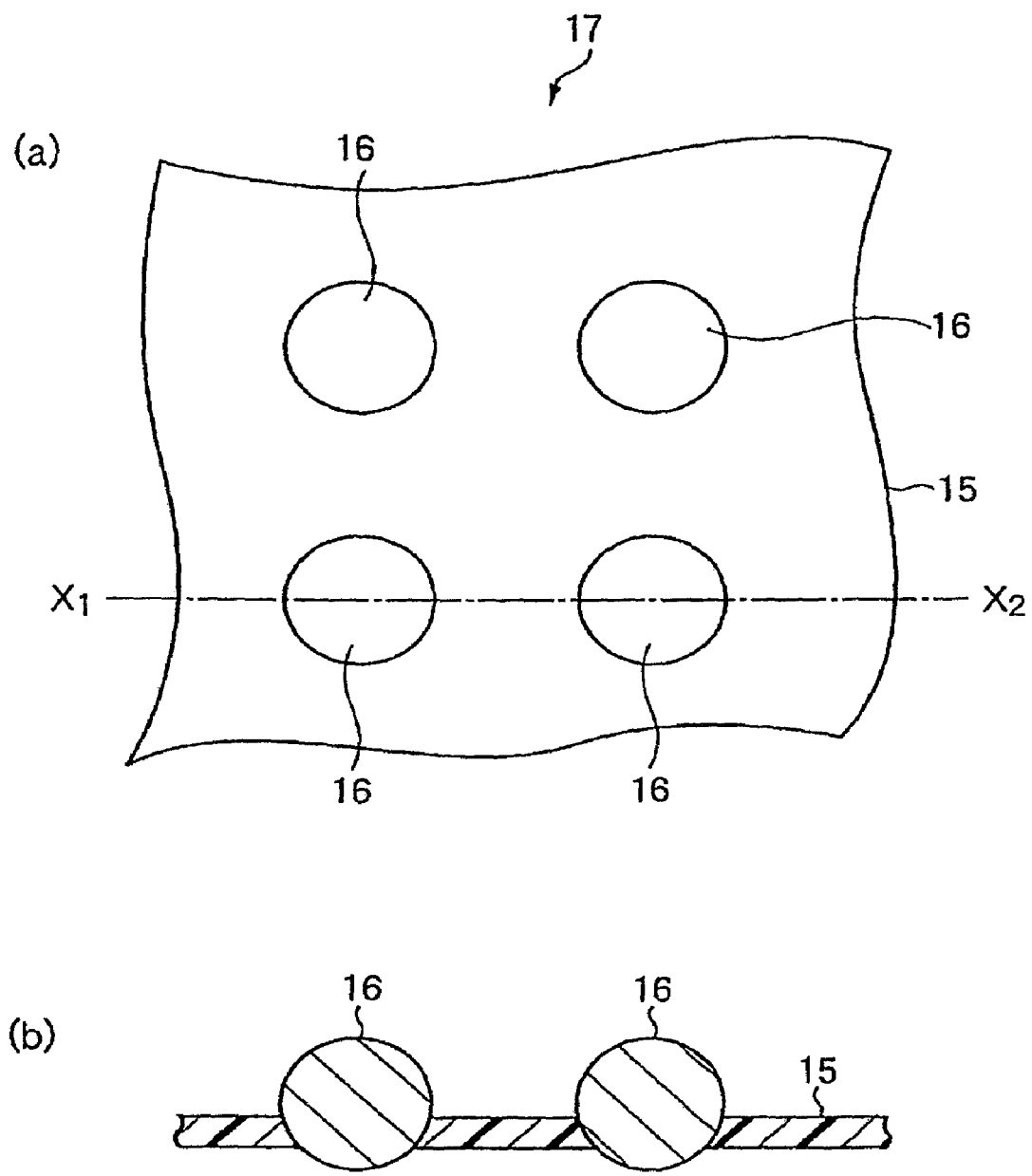
FIG. 3 includes a plan view and a cross-sectional view of a conductive particles transfer sheet for use in the application embodiment 2 of the conductive particles transfer sheet.

First described in the conductive particles transfer sheet 17 to be used in Embodiment 2 of the conductive particles transfer sheet with reference to FIG. 3. FIG. 3(a) is a plan view of the conductive particles transfer sheet 17; and FIG. 3(b) is a cross-sectional view of FIG. 3(a) cut along $X_1$-$X_2$. As in FIG. 3(a), a large number of solder balls 16 are disposed in the heat-decaying adhesive sheet 15. The solder balls 16 are embedded and fitted into the heat-decaying adhesive sheet 15, as in FIG. 3(b). For fixing these into the sheet, employed is a method of forming through-holes of which the pore size is smaller than the diameter of the solder balls 16, at predetermined positions of the heat-decaying adhesive sheet 15 by the use of laser beams or electron beams, and sucking the solder balls 16 into the holes via the sheet, as so mentioned hereinabove.

Figure 4:
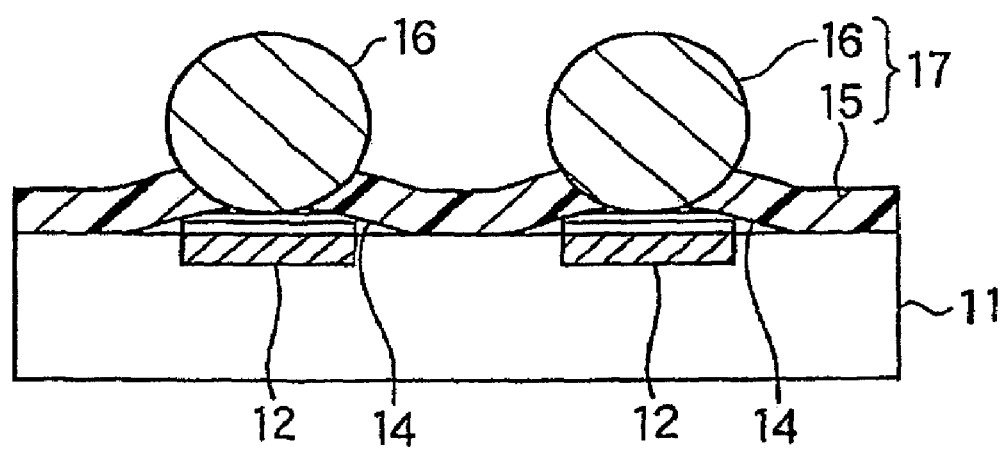
FIG. 4 is a cross-sectional view of one process step in formation of solder ball bumps in the application embodiment 2 of the conductive particles transfer sheet.

Next described is the case of forming solder ball bumps of the BGA package by the use of the conductive particles transfer sheet 17 with the solder balls 16 embedded and disposed therein as in the above, with reference to FIG. 2 and FIG. 4. In this description, the same matters as those described in the section of Embodiment 1 of the conductive particles transfer sheet are omitted. After the step of FIG. 2(a) like in Embodiment 1, the conductive particles transfer sheet 17 described in FIG. 3 is laminated onto the BGA package 11 while the solder balls 16 are positioned to the Cu wiring layer 12 of the BGA package 11, as in FIG. 4. In this, for example, when a pin-lamination process is employed, then it makes it possible to attain accurate positioning of the solder balls 16 to the Cu wiring layer 12. As in FIG. 4, the bottom of the solder ball 16 is exposed out of the heat-decaying adhesive sheet 15 into which the ball has been embedded. Accordingly, in the above-mentioned adhesion treatment, the solder ball 16 adheres to the flux 14 at the bottom thereof.

Then, first, this is subjected to heat treatment at a solder reflow temperature falling between 160° C. and 180° C. or so in a nitrogen atmosphere, whereby the solder balls 16 are melt-bonded to the Cu wiring layer 12. After this melt-bonding treatment, this is then heated in a nitrogen atmosphere at 200 to 250° C. whereby the heat-decaying adhesive sheet 15 of the conductive particles transfer sheet 17 is decayed. In that manner, the solder ball bumps 18 are formed on the Cu wiring layer 12 of the BGA package 11, as in FIG. 2(c). Then, like in the above-mentioned Embodiment 1, this is mounted on another board.

In Embodiment 2 of the conductive particles transfer sheet, the heat-decaying adhesive sheet 15 does not exist below the bottom of each solder ball 16 in the solder reflow treatment step, different from that in the case of FIG. 2(b), and therefore the melt-bonding can be attained within a shorter period of time with higher accuracy in this Embodiment 2. Naturally, the above-mentioned melt-bonding and decaying can be attained simultaneously through the same heat treatment as in the above-mentioned Embodiment 1.

Embodiment 3 of Conductive Particles Transfer Sheet

Figure 5:
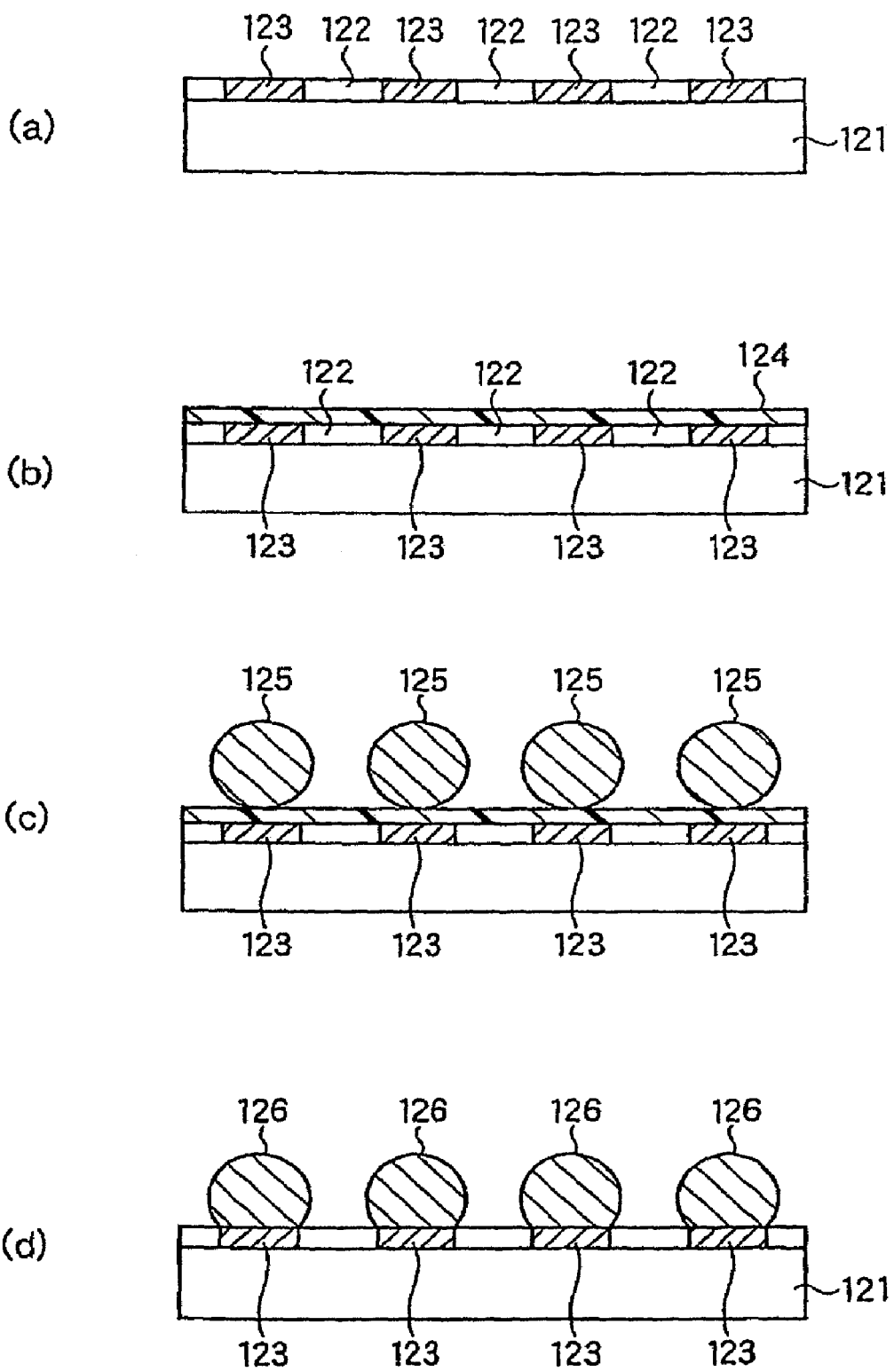
FIG. 5 includes cross-sectional views of a process scheme of forming bumps on a semiconductor wafer for explaining the application embodiment 3 of a conductive particles transfer sheet.

Embodiment 3, still another example of the invention is described with reference to FIG. 5. FIG. 5 includes cross-sectional views of a process scheme of forming bumps on the surface of a semiconductor chip or semiconductor wafer.

As in FIG. 5(a), a passivation film 122 of a silicon nitride or silicon oxynitride film is formed on the surface of a 8-inchφ semiconductor wafer 121 with semiconductor elements and internal wiring (not shown) formed thereon, and an outer lead wiring 123 is formed on it. The outer lead wiring 123 is formed of aluminium (Al) metal or Cu.

Then, as in FIG. 5(b), a coating solution that contains a composition of a liquid heat-decaying adhesive resin is applied onto the passivation film 122 and the outer lead wiring 123 on the surface of the semiconductor wafer 121, in a mode of spin-coating. Then, this is baked at 80° C. or so to thereby form a heat-decaying adhesive resin layer 124 thereon. In this, the heat-decaying adhesive resin layer 124 is formed of a polyoxyalkylene resin having a thickness of 1 μm or so.

Next, as in FIG. 5(c), solder particles 125 having a size of 20μ or so are disposed at the position of the outer lead wiring 123, and these are adhered to the surface of the heat-decaying adhesive resin layer 124 above the outer lead wiring 123. Briefly, every solder particle 125 is sucked all at a time by every nozzle of a large number of vacuum suction nozzles, and all the solder particles 125 are positioned on the outer lead wiring 123 on the semiconductor chip, and these are adhered all at a time to the thus-positioned surface of the heat-decaying adhesive resin layer 124. This operation is carried out for all the semiconductor chips on the semiconductor wafer 121.

Then, this is subjected to heat treatment in a nitrogen atmosphere at a temperature of 200° C. or so, whereby the solder particles 125 are melt-bonded to the outer lead wiring 123. In that manner, as in FIG. 5(d), the solder bumps 126 are formed on the outer lead wiring 123 of the semiconductor wafer 121. In this, the heat-decaying adhesive resin layer 124 on the outer lead wiring 123 is pyrolyzed and completely decayed simultaneously with the above-mentioned heat treatment. Heretofore, the bumps of the type are formed mainly according to a plating process. In this Embodiment 3, the operability is significantly improved, therefore enabling high producibility. This is because, in a plating process, a feeder layer for plating must be formed on the semiconductor wafer 121, and a complicated step of forming it and removing it is needed, but in the invention, the solder bumps 126 can be formed in the simple process that comprises disposition of the solder particles 125 on the outer lead wiring 123 followed by heat treatment thereof.

Though not shown in these drawings, the semiconductor wafer with the solder bumps 126 formed thereon is diced into semiconductor chips, and the semiconductor chips are bump-bonded to resin-encapsulated semiconductor devices or wiring boards according to a flip-chip-bonding process. Alternatively, two different types of semiconductor chips may be bump-bonded according to a butt-joint bonding process, and accordingly, COC (chip-on-chip), a type of high-density MCPs (multi-chip packages) can be fabricated in a simplified manner and at high reliability. In that manner, electronic system integration according to the above-mentioned packaging technology is thereby promoted.

The conductive particles transfer sheet that comprises the heat-decaying material of the invention is not limited to the above-mentioned embodiments, but may be changed and modified in any desired manner within the technical idea of the heat-decaying material of the invention. In the above-mentioned embodiments, the conductive fine particles are spherical solder balls or spherical solder particles. However, not limited to these, the conductive fine particles may also be columnar solder balls or columnar solder particles. Further, the conductive fine particles may be formed of any other low-melting-point alloys than solder. For example, metals of Au, Cu and Al are employable. When the conductive fine particles are not formed of a low-melting-point alloy such as solder, then the heat-decaying adhesive resin is decayed by heating and thereafter the conductive fine particles are melt-bonded to the electrodes of electronic parts for electrical connection.

As described hereinabove, the conductive particles transfer sheet that comprises the heat-decaying material of the invention has conductive fine particles disposed on a heat-decaying adhesive resin layer or sheet. In this description, the heat-decaying adhesive resin (sheet) is meant to indicate a single-layered sheet of a heat-decaying adhesive that decomposes into vapor when heated, or decomposes and vaporizes to lose its solid form, or a multi-layered sheet having an adhesive layer of such a heat-decaying adhesive. When this is a supported-type heat-decaying adhesive sheet that is constructed by forming a heat-decaying adhesive layer on one or both faces of a substrate, then the substrate may not decay so far as the heat-decaying adhesive layer may decay. Preferably, however, the entire sheet including the substrate may decay by heating.

Some such heat-decaying adhesives are known, for example, polymethylenemalonic acid diesters, polybutylene, nitrocellulose, α-methylstyrene polymer, propylene carbonate polymer, polyalkyl (meth)acrylates, copolymers of carboxylic acid dihydrazides and diisocyanates, peroxides of these polymers, as well as tackified compositions of such polymers optionally containing a plasticizer such as dibutyl phthalate or dioctyl phthalate or a softener such as xylene oil, terpene oil or paraffin wax added thereto. In addition, polybutene and polylauryl methacrylate may also be used as the heat-decaying adhesive.

In general, however, in a process of bonding conductive fine particles to electrodes, the surface metal layer of the conductive fine particles or the conductive fine particles themselves are generally melted and bonded to them in the solder reflow step of the process. Therefore, when an adhesive capable of decaying at the reflow temperature falling between 150 and 260° C. is used, then the heat-decaying adhesive may be decayed in the reflow step, and the process may be significantly simplified. In addition, the heat-decaying adhesive can be used even in electronic parts relatively poorly resistant to heat. Heretofore, no one knows an adhesive capable of rapidly decaying at 150 to 260° C., but we the present inventors have found, as a result of assiduous studies, that the adhesive comprising the heat-decaying material that contains a polyoxyalkylene resin of the invention is effective. In addition, we have further found that, of the heat-decaying resin of the invention, a crosslinked resin of a polyoxyalkylene resin having a crosslinkable silyl group can rapidly decay when heated at 150 to 260° C. and, in addition, it is highly adhesive to various materials of a broad range such as metals of conductive fine particles, as well as silicon materials and plastic materials, and further, when it is formed into a sheet, the sheet has a suitable sheet strength.

The crosslinkable silyl group includes, for example, an oxime-silyl group, an alkenyloxysilyl group, an acetoxysilyl group, a halogenosilyl group, a vinylsilyl group, a silanol group. Above all, alkoxysilyl-terminated polyoxyalkylene resin is favorable as it gives rubber-like crosslinked resin of good elasticity. The alkoxysilyl group includes, for example, a methoxysilyl group, an ethoxysilyl group, a propyloxysilyl group, an isopropyloxysilyl group, a butoxysilyl group, a tert-butoxysilyl group, a phenoxysilyl group, a benzyloxysilyl group. In dialkoxysilyl groups or trialkoxysilyl groups, the alkoxy groups may be the same or different alkoxy groups may be combined. One or more such crosslinked silyl groups may be used herein either singly or as combined. Different types of polyoxyalkylene resins, or polyoxyalkylene resins having different types of crosslinkable silyl groups may also be combined for use herein.

For crosslinking the crosslinkable silyl group-having polyoxyalkylene resin, preferably used is a photoreactive catalyst having a functional group of formula (2). With it, the crosslinkable silyl group-having polyoxyalkylene resin can be crosslinked and cured through exposure to light such as visible rays, UV rays or electron rays (this may be hereinafter referred to as light irradiation). Above all, carboxylic acid anhydrides, carboxylic acid imides and diacylphosphine oxides are preferred as their photoreactivity is high and as their solubility in crosslinkable silyl group-having polyoxyalkylene resins is also high. One or more such photoreactive catalyst may be used herein either singly or as combined.

For crosslinking the crosslinkable silyl group-having polyoxyalkylene resin, a sensitizer may be added to the crosslinkable silyl group-having polyoxyalkylene resin composition. Containing a sensitizer, the photoreactivity of the resin increases and therefore, the time for light irradiation to the resin composition may be shortened and the light irradiation energy thereto may be reduced, and the composition may be uniformly crosslinked and cured from its surface to its depth.

The sensitizer includes, for example, acetophenone derivative compounds such as 4-(2-hydroxyethoxy)phenyl (2-hydroxy-2-propyl) ketone, α-hydroxy-α'-dimethylacetophenone, methoxyacetophenone, 2,2-dimethoxy-2-phenylacetophenone; benzoin ether compounds such as benzoin ethyl ether, benzoin propyl ether; ketal derivative compounds such as benzyldimethyl ketal; halogenoketones; acylphosphine oxides; acyl phosphonates; 2-methyl-1-[4-(methylthio)phenyl]-2-morpholinopropan-1-one, 2-benzyl-2-N,N-dimethylamino-1-(4-morpholinophenyl)-1-butanone; bis(2,4,6-trimethylbenzoyl)-phenylphosphine oxide, bis(2,6-dimethoxybenzoyl)-2,4,4-trimethylpentylphosphine oxide; bis(η5-cyclopentadienyl)-bis(pentafluorophenyl)-titanium, bis(η5-cyclopentadienyl)-bis[2,6-difluoro-3-(1H-pyri-1-dyl)phenyl]-titanium; anthracene, perylene, coronene, tetracene, benzanthracene, phenothiazine, flavin, acridine, ketocoumarin, thioxanthone derivatives, benzophenone, acetophenone, 2-chlorothioxanthone, 2,4-dimethylthioxanthone, 2,4-diethylthioxanthone, 2,4-diisopropylthioxanthone, isopropylthioxanthone. One or more of these may be used herein either singly or as combined.

When the above-mentioned heat-decaying adhesive sheet is used in a process in which, for example, it is subjected to solder reflow treatment repeatedly a few times, then the conductive bonding material is re-melted in every reflow treatment and the electronic parts may be moved and disordered in the re-melting step. In such a case where electronic parts are temporarily fixed before they pass through multiple solder reflow steps, the heat-decaying adhesive sheet of the invention is favorably used.

[Transfer Sheet for Circuit Formation]

A transfer sheet for circuit formation that comprises the heat-decaying material of the invention is described below.

The transfer sheet for circuit formation that comprises the heat-decaying material of the invention is characterized in that it comprises an adhesive sheet of the heat-decaying material of the invention and a circuit pattern formed on the surface of the adhesive sheet.

Embodiments of the transfer sheet for circuit formation that comprises the heat-decaying material of the invention are described hereinunder with reference to the drawings.

Figure 6:
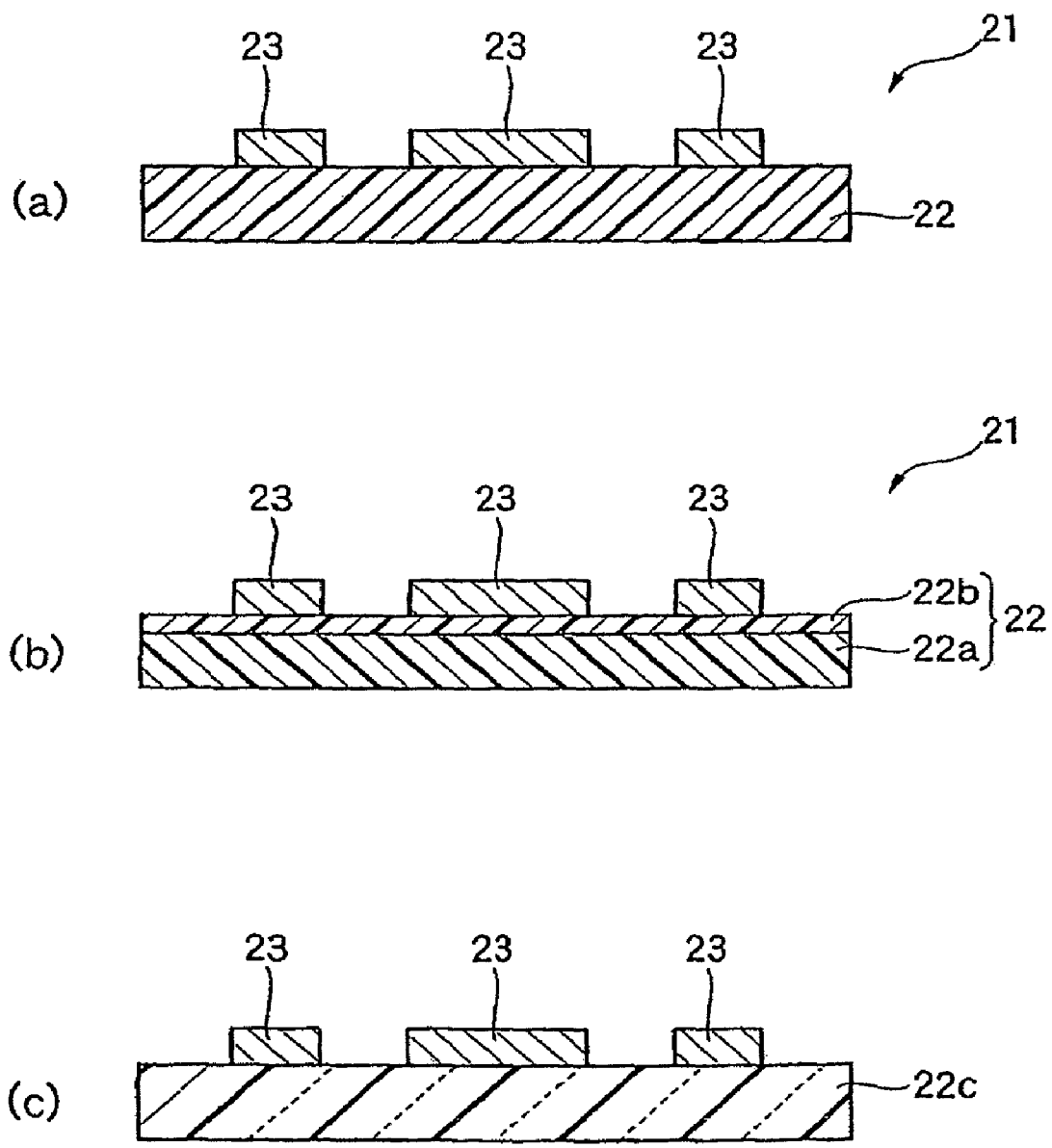
FIG. 6 includes cross-sectional views of a transfer sheet for circuit formation.

The transfer sheet for circuit formation that comprises the heat-decaying material of the invention has a structure as in FIG. 6. In this, FIG. 6(a) shows a case of using an adhesive sheet of the heat-decaying material of the invention. FIG. 6(b) and FIG. 6(c) each show a case of a composite adhesive sheet that partly contains the heat-decaying material of the invention. In this, FIG. 6(b) is a case of an adhesive sheet having a laminate structure of a heat-decaying material and a non-heat-decaying resin; FIG. 6(c) is a case of an adhesive sheet formed by mixing different resin materials such as a heat-decaying material and a non-heat-decaying resin. The non-heat-decaying resin means an ordinary resin not decomposing under heat.

As in FIG. 6(a), the transfer sheet 21 for circuit formation comprises an adhesive sheet 22 formed of only a heat-decaying material having a thickness of from 10 μm to 500 μm, and a circuit pattern-forming metal layer 23 formed on the surface of the sheet 22.

As in FIG. 6(b), the transfer sheet 21 for circuit formation comprises an adhesive sheet 22 of a composite film formed of a resin substrate 22a of a non-heat-decaying resin and a heat-decaying material layer 22b, and a circuit pattern-forming metal layer 23 formed on the surface of the sheet 22. In FIG. 6(b), the adhesive sheet 22 has a laminate structure of the resin substrate 22a and the heat-decaying resin layer 22b, and the metal layer 23 is formed on the surface of the heat-decaying resin layer 22b.

For the transfer sheet 21 for circuit formation of the invention, the composite film is not limited to the above-mentioned laminate structure. As in FIG. 6(c), the sheet 21 may comprise an adhesive sheet 22c formed of a mixture of different types of resin material including a heat-decaying resin, and a circuit pattern-forming metal layer 23 is formed on the surface of the sheet 22c. The resin mixture for the adhesive sheet 22c may be a mixture of a heat-decaying resin and a non-heat-decaying resin. Regarding the mixing condition in this, a heat-decaying resin composition and a non-heat-decaying resin composition may be mixed to form a mixture condition; or a heat-decaying resin and a non-heat-decaying resin may be mixed to form separated phases. In this, the phase separation is caused by the light irradiation or the heat treatment of the solution of a heat-decaying resin composition and a non-heat-decaying resin composition in a solvent, and, as a result, the adhesive sheet may have, for example, a large number of isolated small masses of the heat-decaying resin in the matrix (phase) of the non-heat-decaying resin. Apart from it, even when a cured powdery heat-decaying resin is mixed with a non-heat-decaying resin and formed into a sheet, then the resulting adhesive sheet may also have the same structure as above. Further, the composite film may comprise a mixture of different types of heat-decaying resins that differ in point of the heat-decaying temperature.

(Resin to Constitute Adhesive Sheet)

For rapidly decaying the above-mentioned heat-decaying resin or the heat-decaying resin layer, it must be heated generally at 250 to 400° C. However, when circuit boards are exposed to a high temperatures for a long period of time, then it may have some negative influences on the properties of the circuit boards. For it, in addition, a large-scale device is needed. On the other hand, when the layer peeling is attained by the pressure of the vapor to be generated through the decomposition of the heat-decaying resin as will be described hereinunder, it is desirable to use a heat-decaying resin capable of rapidly decaying at a possibly lower temperature. Further, as will be also described hereinunder, the acceptable heating temperature in production of electronic parts is often a relatively low temperature of 200° C. or lower.

Given that situation, we the present inventors have assiduously studied various heat-decaying materials that have heretofore been known to be able to decay at relatively low temperatures and, as a result, have found that the heat-decaying resin of the invention is effective. Of the heat-decaying resin of the invention, we have further found that the resin prepared by crosslinking a crosslinkable silyl group-having polyoxyalkylene resin can rapidly decay when heated at 150 to 170° C., and, in addition, it has good adhesiveness to materials of a broad range such as metals and resins, and moreover, when it is shaped into sheets, the resulting sheets have a suitable sheet strength.

The details of the resin prepared by crosslinking a crosslinkable silyl group-having polyoxyalkylene resin are the same as those described in detail hereinabove for the above-mentioned conductive particles transfer sheet.

When the adhesive sheet 22 comprises a mixture of a heat-decaying resin and a non-heat-decaying resin, for example, when it comprises a mixture with any of the above-mentioned heat-decaying resin, then the proportion of the heat-decaying resin to the heat-decaying resin-containing resin composition is not specifically defined, but is preferably at least 10% by weight.

When the heat-decaying resin is the principal component of the adhesive sheet 22 and when it accounts for a major part of the sheet, then the adhesive sheet may be substantially decayed by heating. In addition, even when the content of the heat-decaying resin in the adhesive sheet is such that the adhesive sheet is not entirely decayed, the vapor generated through decomposition of the heat-decaying resin may act to peel at least a part of the adhesive face of the adhesive sheet from the circuit pattern to thereby lower the adhesiveness therebetween, so far as the proportion of the heat-decaying resin is at least 10% by weight, and even in this case, therefore, the adhesive sheet could be readily peeled.

In order that the vapor generated through decomposition of the heat-decaying resin may act to peel at least a part of the adhesive face of the adhesive sheet from the circuit pattern to thereby lower the adhesiveness therebetween, it is desirable that the heat-decaying resin-containing resin composition further contains a crosslinkable resin composition capable of crosslinking through energy stimulation applied thereto, for example, through exposure to light, electron rays or ion beams.

When some energy stimulation is applied to the adhesive sheet before the heat-decaying resin is decomposed to give a vapor and when the crosslinkable resin component is thereby crosslinked, then the adhesive sheet may be entirely cured and it may release more efficiently the vapor generated through the decomposition of the heat-decaying resin, and as a result, the adhesive sheet may be more readily peeled.

The proportion of the crosslinkable resin component to be in the heat-decaying resin-containing resin composition is not specifically defined, but is preferably at least 30% by weight of the composition. If the ratio of the crosslinkable resin component is less than 30% by weight, then the entire adhesive sheet could not be sufficiently cured.

Not specifically defined, the crosslinkable resin component that may crosslink through energy stimulation applied thereto is, for example, a photocurable adhesive that comprises a polymerizable polymer of an alkyl acrylate and/or an alkyl methacrylate having a radical-polymerizable unsaturated bond in the molecule, and a radical-polymerizable polyfunctional oligomer or monomer, as the principal ingredients thereof, and optionally contains a photopolymerization initiator; or a thermosetting adhesive that comprises a polymerizable polymer of an alkyl acrylate and/or an alkyl methacrylate having a radical-polymerizable unsaturated bond in the molecule, and a radical-polymerizable polyfunctional oligomer or monomer, as the principal ingredients thereof, and optionally contains a thermal polymerization initiator.

The post-curable adhesive such as the photocurable adhesive or thermosetting adhesive of the type may uniformly and rapidly polymerizes and cures as a whole of the adhesive through exposure to light or heat, thereby giving an integrated cured body. Accordingly, the elastic modulus of the polymerized and cured body of the adhesive extremely increases and the adhesive force thereof greatly lowers. In addition, when the heat-decaying resin is decomposed to generate a vapor in the hard cured body, then a major part of the generated vapor is let outside, and the thus-released vapor acts to peel at least a part of the adhesive face from the adhered object, thereby lowering the adhesiveness therebetween.

The polymerizable polymer may be obtained, for example, by previously preparing a (meth)acrylic polymer having a functional group in the molecule (hereinunder referred to as "functional group-containing (meth)acrylic polymer"), followed by reacting it with a compound having a functional group capable of reacting with the above-mentioned functional group, and a radical-polymerizable unsaturated bond in the molecule (hereinunder referred to as "functional group-having unsaturated compound").

The functional group-containing (meth) acrylic polymer is a polymer that is adhesive at room temperature, and it may be obtained through ordinary copolymerization of a main monomer, alkyl acrylate and/or alkyl methacrylate in which the alkyl-group generally has from 2 to 18 carbon atoms, with a functional group-containing monomer and optionally with any other modifying monomer copolymerizable with them, like ordinary (meth)acrylic polymers. The functional group-containing (meth)acrylic polymer may have a weight-average molecular weight of generally from 200,000 to 2,000,000 or so.

The functional group-containing monomer includes, for example, carboxyl group-having monomers such as acrylic acid, methacrylic acid; hydroxyl group-having monomers such as hydroxyethyl acrylate, hydroxyethyl methacrylate; epoxy group-having monomers such as glycidyl acrylate, glycidyl methacrylate; isocyanate group-having monomers such as isocyanatoethyl acrylate, isocyanatoethyl methacrylate; amino group-having monomers such as aminoethyl acrylate, aminoethyl methacrylate.

The other copolymerizable modifying monomer is, for example, various monomers used for ordinary (meth)acrylic polymers, such as vinyl acetate, acrylonitrile, styrene.

The functional group-containing unsaturated compound to be reacted with the functional group-containing (meth) acrylic polymer may be selected from those mentioned hereinabove for the functional group-containing monomers in accordance with the functional group of the functional group-containing (meth) acrylic polymer. For example, when the functional group of the functional group-containing (meth) acrylic polymer is a carboxyl group, then epoxy group-having monomers and isocyanate group-having monomers may be used for it; when the functional group is a hydroxyl group, then isocyanate group-having monomers may be used; when the functional group is an epoxy group, then carboxyl group-having monomers and amido group-having monomers such as acrylamide may be used; and when the functional group is an amino group, then epoxy group-having monomers may be used.

The polyfunctional oligomer or monomer preferably has a molecular weight of at most 10,000. More preferably, it has a molecular weight of at most 5,000 and has from 2 to 20 radical-polymerizable unsaturated bonds in the molecule, for more efficient three-dimensional network formation through heating or exposure to light. Such more preferred examples of the polyfunctional oligomer or monomer are, for example, trimethylolpropane triacrylate, tetramethylolmethane tetraacrylate, pentaerythritol triacrylate, pentaerythritol tetraacrylate, dipentaerythritol monohydroxypentaacrylate, dipentaerythritol hexaacrylate, and methacrylates corresponding to these. In addition, also preferred are 1,4-butylene glycol diacrylate, 1,6-hexanediol diacrylate, polyethylene glycol diacrylate, commercially-available oligoester acrylates, and methacrylates corresponding to these. One or more of these polyfunctional oligomers and monomers may be used herein either singly or as combined.

The photopolymerization initiator is, for example, one capable of being activated when exposed to light having a wavelength of from 250 to 800 nm. The photopolymerization initiator of the type includes, for example, acetophenone derivative compounds such as methoxyacetophenone; benzoin ether compounds such as benzoin isopropyl ether, benzoin isobutyl ether; ketal derivative compounds such as benzyldimethyl ketal, acetophenonediethyl ketal; phosphine oxide derivative compounds; and photoradical polymerization initiators such as bis(η5-cyclopentadienyl)titanocene derivative compounds, benzophenone, Michler's ketone, chlorothioxanthone, dodecylthioxanthone, dimehtylthioxanthone, diethylthioxanthone, α-hydroxycyclohexylphenyl ketone, 2-hydroxymethylphenylpropane. One or more these photopolymerization initiators may be used herein either singly or as combined.

The thermal polymerization initiator is one that decomposes under heat and generates an active radical for initiating polymerization and curing. For example, it includes dicumylperoxide, di-t-butylperoxide, t-butylperoxybenzoate, t-butylhydroperoxide, benzoyl peroxide, cumene hydroperoxide, diisopropylbenzene hydroperoxide, paramenthane hydroperoxide, di-t-butyl peroxide. Of those, preferred are cumeme hydroperoxide, paramenthane hydroperoxide and di-t-butyl peroxide, as their thermal decomposition temperature is high. Some such thermal polymerization initiators are commercially available, and are usable herein with no specific limitation. For example, preferred are Perbutyl D, Perbutyl H, Perbutyl P, Permenta H (all by Nippon Yushi). One or more of these thermal polymerization initiators may be used herein either singly or as combined.

(Metal Layer to From Circuit Pattern)

Preferably, the circuit pattern to be formed on the surface of the adhesive sheet is formed of, for example, metal foil or conductive paste layer. Not specifically defined, the metal foil may be foil of metal suitable for circuit pattern formation and is, for example, foil of high-melting-point metal such as tungsten, molybdenum; low-resistance metal such as gold, silver, copper, aluminium; or alloy containing at least one such low-resistance metal.

Preferably, the lowermost limit of the thickness of the metal foil is 1 μm, and the uppermost limit thereof is 100 μm.

If smaller than 1 µm, then the resistivity of the circuit pattern to be formed of the metal foil may be high and the circuit boards produced may be unsuitable. If larger than 100 µm, then an insulating substrate or a ceramic-green sheet may deform greatly when the metal foil is laminated thereon in producing circuit boards that will be mentioned hereinunder, and, in addition, when the circuit pattern formed of the metal foil is transferred onto an insulating substrate or a ceramic green sheet, the buried amount of the circuit pattern may increase and the degree of deformation of the insulating substrate or the ceramic green sheet may increase. As a result, this may cause a problem in that the insulating substrate or the ceramic green sheet may be readily deformed when the resin is cured. Moreover, when the metal foil is etched to form a circuit pattern, the etching may be difficult, and this may cause another problem in that a micropatterned circuit is difficult to form with accuracy. More preferably, the lowermost limit of the thickness is 5 µm, and the uppermost limit thereof is 50 µm.

The surface of the metal foil that is to be on the side of the adhesive sheet may be roughened to have fine irregularities in order to increase the adhesiveness thereof to the adhesive sheet. For example, the surface of the metal foil may be roughened to have fine irregularities of from 0.2 to 0.7 µm or so in terms of the surface roughness Ra defined by JIS B0601. The other surface of the metal foil opposite to the adhesive sheet side may also be roughened in the same manner to have fine irregularities, whereby the bonding force between the insulating substrate or ceramic green sheet and the circuit pattern may be increased.

The conductive paste layer is, for example, a layer of a resin paste prepared by adding conductive fine particles, such as noble metal particles of gold, silver or copper, or solder particles or metal-plated resin particles, to a binder resin, or a layer of a metal paste of cream solder or the like.

The circuit pattern-having metal layer 23 is formed according to a patterning screen-printing method of processing the metal foil adhered to the adhesive sheet 22, or according to a plating method. The method of forming a circuit pattern by patterning the metal foil is not specifically defined, and for example, a known resist method is employed for it. The resist method comprises applying a photoresist onto the entire surface of the metal foil, exposing it to light via a mask of a predetermined pattern, developing it, and then etching it in a mode of plasma etching or chemical etching to thereby remove the metal foil in the non-pattern region (the region from which the photoresist is removed). Accordingly, the intended circuit pattern of the metal foil is formed. Another method is also employable, which comprises applying a photoresist to the surface of metal foil in a predetermined circuit pattern form according to a screen printing process or the like, then exposing it to light in the same manner as above and thereafter etching it to form the intended circuit pattern. After the etching, some resist may remain on the circuit pattern, but it may be removed with a resist remover, and the resulting circuit pattern is thereby cleaned. Accordingly, a transfer sheet for circuit formation is thus obtained, which has a circuit pattern formed on the surface of an adhesive sheet.

For patterning the conductive paste layer to form a circuit pattern, for example, employable is a method of baking the conductive paste layer and then processing it in the same manner as in the above-mentioned case of processing metal foil. Another method is also employable, which comprises screen-printing a conductive paste on a substrate, baking it to form a circuit pattern, and attaching the above-mentioned adhesive sheet to it to thereby form a circuit pattern of the conductive paste layer on the adhesive sheet.

Still another method may be employed, which comprises forming grooves corresponding to the circuit pattern on the surface of the adhesive sheet, and filling the grooves with a conductive paste by the use of a squeeze to thereby form a circuit pattern of the conductive paste on the adhesive sheet.

As mentioned hereinabove, the transfer sheet for circuit formation that comprises the heat-decaying material of the invention has an adhesive sheet that comprises a heat-decaying resin capable of decomposing under heat or comprises a composite film containing such a heat-decaying resin, and therefore, when this is used for circuit transfer, the adhesive sheet decays, or its adhesive force lowers owing to the vapor generated through decomposition of the heat-decaying resin that constitutes the adhesive sheet and, as a result, the intended circuit pattern can be well transferred onto an insulating resin or a ceramic green sheet with no pattern disturbance even when the adhesive sheet has a high adhesive force. In addition, even when a circuit pattern having an extremely narrow line width is transferred, it can be well transferred with high accuracy.

The transfer sheet for circuit formation may optionally have metal foil or conductive paste layer formed on the surface of the adhesive sheet thereof. The metal foil or the conductive paste layer is not patterned into a form of circuit pattern.

(Production of Circuit Board)

Figure 7:
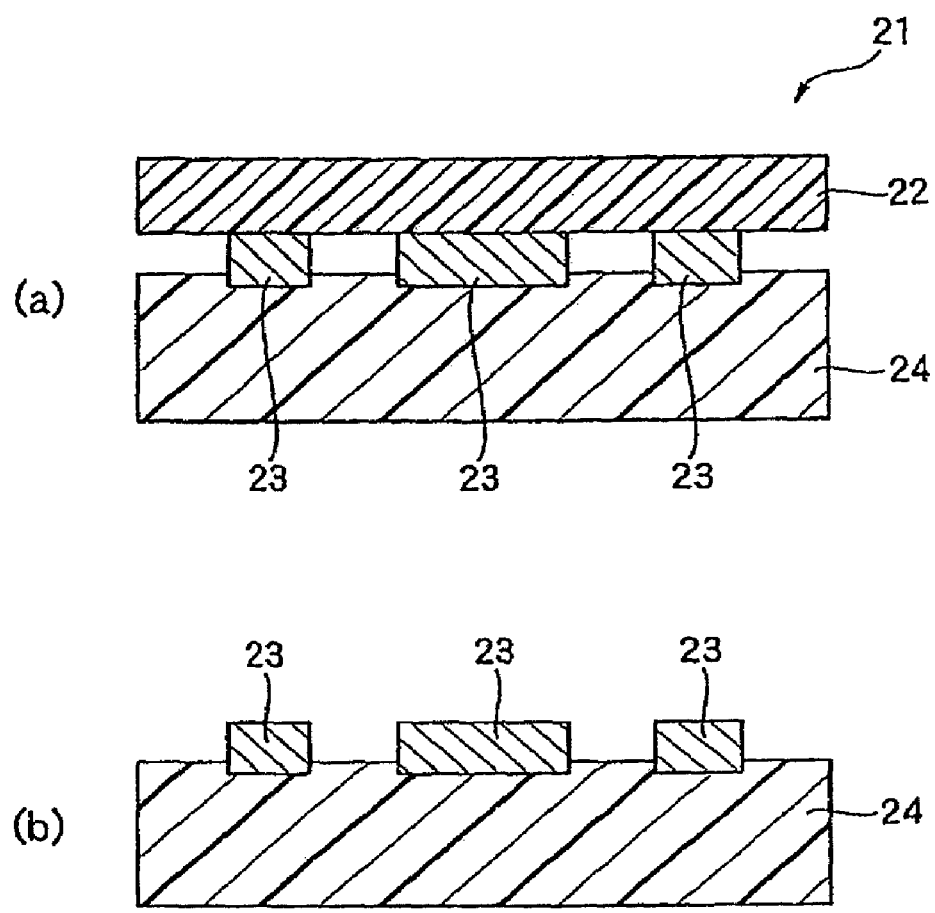
FIG. 7 includes cross-sectional views of a process scheme for producing a circuit board.
Figure 8:
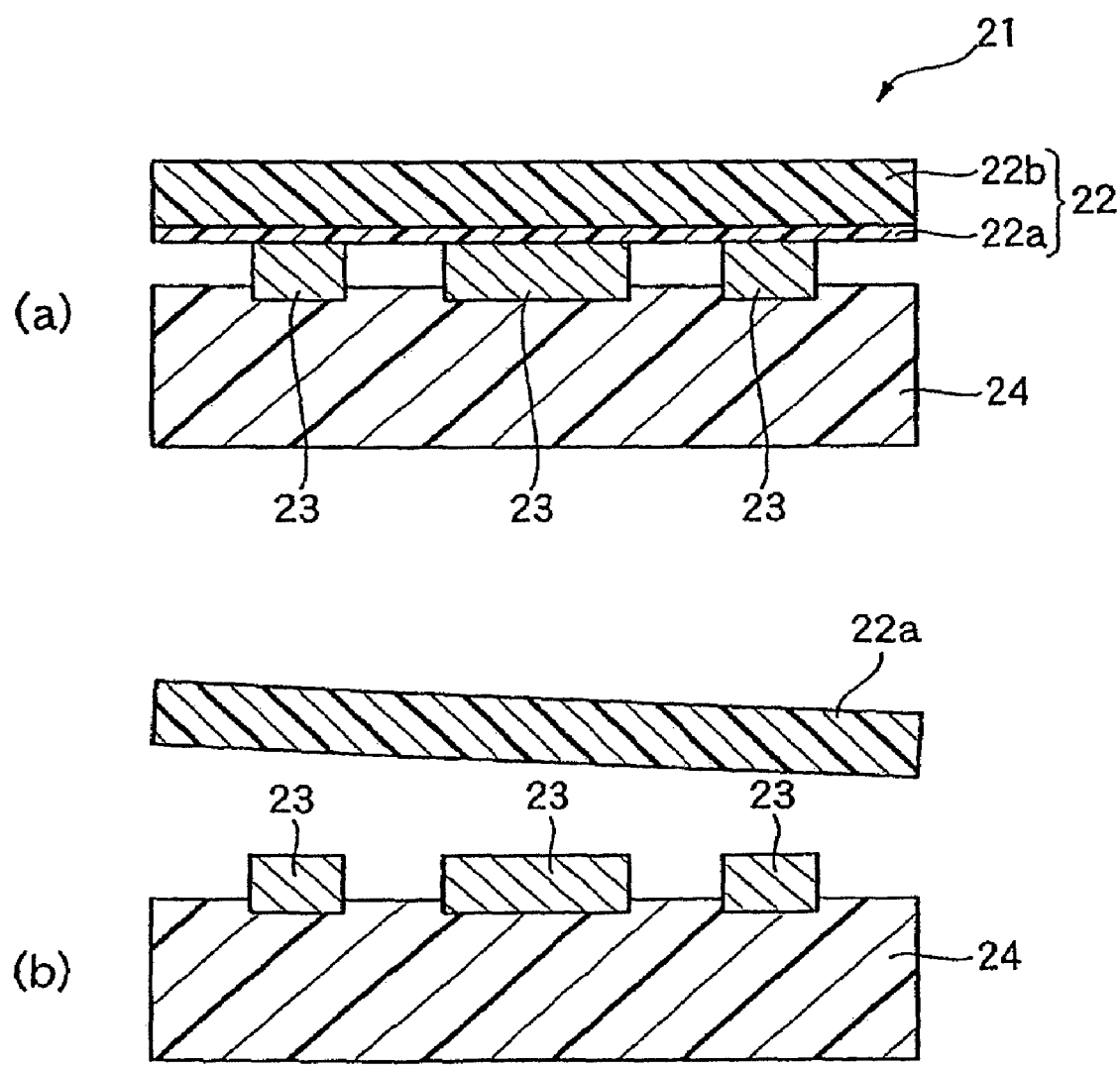
FIG. 8 includes cross-sectional views of a process scheme for producing another circuit board.

Using the transfer sheet for circuit formation as above, a circuit board is produced. This is described with reference to FIG. 7 and FIG. 8. FIG. 7 includes cross-sectional views of a process scheme of using the transfer sheet for circuit formation of FIG. 6(a); and FIG. 8 includes cross-sectional views of a process scheme of using the transfer sheet for circuit formation of FIG. 6(b).

As in FIG. 7(a), a transfer sheet 21 that comprises an adhesive sheet 22 and a circuit pattern-forming metal layer 23 on the surface thereof is prepared in the manner as above, and this is positioned to an insulating substrate 24 which is in a semi-cured condition, and then the two are bonded to each other. In this, the insulating substrate 24 is a substrate having insulating properties as will be described hereinunder. For bonding the two, for example, a pressure of 100 kg/cm$^2$ or so is applied to the two, whereby a part or all of the metal layer 23 is embedded and fixed in the insulating substrate 24.

In this, the method of pressure-bonding the transfer sheet 1 for circuit formation and the insulating substrate 24 is not specifically defined. For example, herein employable is a method of bonding the two owing to the anchor effect by pressing; and a method of applying an adhesive to the insulating substrate and/or the circuit pattern of the transfer sheet for circuit formation, followed by bonding the two. In particular, when the transfer sheet is pressure-bonded to the insulating substrate of a semi-cured thermosetting resin, preferred is a method of thermally pressing the two at a suitable temperature. This is because, according to the method, a part or all of the thermosetting resin may be cured to have an increased adhesive force, and it evades troubles of circuit pattern mispositioning or transfer failure.

Next, this is subjected to heat treatment at a relatively low temperature falling between 150° C. and 170° C. in a nitrogen atmosphere. Through the heat treatment, the adhesive sheet 22 pyrolyzes, vaporizes and decays. Thus, as in FIG. 7(b), a single-layered circuit board is formed, which has the circuit pattern-having metal layer 23 transferred onto the insulating substrate 24. Further, if desired, the insulating substrate 24 may be completely cured at a temperature falling between 250 and 300° C. A multi-layered circuit board may be formed by laminating these single-layered circuit boards.

Similarly, as in FIG. 8(a), a transfer sheet 21 for circuit formation is prepared in the manner as above, which comprises a laminate-structured adhesive sheet 22 of a composite film comprising a resin substrate 22a and a heat-decaying resin layer 22b, and a metal layer 23 formed on the surface of the heat-decaying resin layer 22b. Like in FIG. 7, the transfer sheet 21 is positioned to an insulating substrate 24 which is in a semi-cured condition, and then the two are bonded to each other under heat and pressure. In that manner, a part or all of the metal layer 23 is embedded and fixed in the insulating substrate 24.

Next, this is subjected to heat treatment at a temperature around 250° C. or so in a nitrogen atmosphere. Through the heat treatment, the heat-decaying resin layer 22b to form the adhesive sheet 22 pyrolyzes and decays. Thus, as in FIG. 7(b), the resin substrate 22a is lifted off though the pyrolysis of the heat-decaying resin layer 22b, and this is completely separated from the metal layer 23. In the heat-treatment, the insulating substrate 24 completely cures at the same time. Thus, a single-layered circuit board is formed, which has the circuit pattern-having metal layer 23 transferred onto the insulating substrate 24.

Though not shown in the drawings, when a composite film of a mixture of a heat-decaying resin and a non-heat-decaying resin is used for the adhesive sheet 22c as so mentioned hereinabove, then the adhesive sheet 22 greatly shrinks and completely peels from the metal layer 23 since the heat-decaying resin in the adhesive sheet 22 pyrolyzes and decays through the heat treatment at about 250° C. In a different case, the adhesive force of the adhesive sheet 22c greatly lowers owing to the vapor generated through the decomposition of the heat-decaying resin, and the sheet 22c peels from the metal layer 23. Also in this case, the circuit pattern-having metal layer 23 is transferred onto the insulating substrate 24, and a single-layered circuit board is readily formed.

In the production of circuit boards mentioned above, the insulating substrate 24 is formed of an ordinary thermosetting resin or a ceramic green sheet.

The thermosetting resin is not specifically defined, including, for example, polyphenylene ether (PPE); bismaleimide resins such as bismaleimido-triazine (BT); and epoxy resins, polyimide resins, fluororesins, phenol resins. Preferably, the thermosetting resin is liquid at room temperature.

The semi-cured thermosetting resin may contain a filler generally for increasing its strength. Not specifically defined, the filler may be, for example, organic or inorganic power or fibers.

The inorganic filler is not also specifically defined, including, for example, $SiO_2$, $Al_2O_3$, $ZrO_2$, $TiO_2$, AlN, SiC, $BaTiO_3$, $SrTiO_3$, zeolite, $CaTiO_3$, aluminium borate. Preferably, the inorganic filler is a powder of nearly spherical particles. Also preferably, the mean particle size of the particles is at most 20 μm more preferably at most 10 μm, even more preferably at most 7 μm. The inorganic filler may be fibrous, and may have a mean aspect ratio of at least 5. Not specifically defined, the fibrous filler includes, for example, fibers of glass, and it may be in any form of woven fabric or nonwoven fabric, and may have any unlimited properties. Also not specifically defined, the organic filler includes, for example, aramid fibers, cellulose fibers.

One or more different types of the above-mentioned fillers may be used herein either singly or as combined. Preferably, the thermosetting resin and the filler are used in a ratio by volume of thermosetting resin/filler falling between 15/85 and 65/35.

For producing the insulating substrate, a thermosetting resin or a slurry containing a thermosetting resin and an inorganic filler is shaped into a sheet according to a doctor blade method or the like, and then it is heated to be in a semi-cured condition. Preferably, via-holes are formed in the insulating substrate by the use of a carbon dioxide gas laser or the like, and the via-holes are filled with a low-resistance metal powder of gold, silver, copper, aluminium or the like to form a via-hole conductor.

In the step of pressure-bonding the circuit pattern-having face of the transfer sheet for circuit formation mentioned above to an insulating substrate or the like followed by attaching or embedding the circuit pattern into the insulating substrate, when a via-hole conductor is formed in the insulating substrate, then the transfer sheet is so positioned to the insulating substrate that the circuit pattern could overlap with the surface-exposed part of the via-hole conductor.

The ceramic green sheet may be produced, for example, by shaping a mixture of a ceramic powder of alumina or the like, a binder resin and a plasticizer, into a sheet.

When the insulating substrate 24 is formed of a ceramic green sheet, the ceramic green sheet must be baked at a high temperature (from 600 to 1500° C. or so) after the circuit pattern-having metal layer 23 has been transferred onto the insulating substrate 24. Accordingly, especially in this case, the metal layer 23 is formed of a high-melting-point metal such as tungsten or molybdenum mentioned above.

For the production of circuit boards mentioned above, a first method of producing circuit boards comprises using the transfer sheet for circuit formation mentioned above. The method includes a step of pressure-bonding an insulating substrate or a ceramic green sheet onto the circuit pattern of the above-mentioned transfer sheet for circuit formation and attaching or embedding the circuit pattern into the insulating substrate of the ceramic green sheet, and a step of decomposing the heat-decaying resin by heating thereby to decay or deform the adhesive sheet and to transfer the circuit pattern onto the insulating substrate or the ceramic green sheet.

In the above-mentioned step, when the adhesive sheet is formed of a heat-decaying resin or the adhesive sheet is formed of a resin composition comprising the heat-decaying resin as the principal ingredient thereof, then the adhesive sheet is substantially decayed by heating. Accordingly, the process does not require a step of peeling the adhesive sheet from the circuit pattern, and its production efficiency (producibility) and workability may be thereby improved.

On the other hand, even when the adhesive sheet does not decay by heating, the adhesive force of the adhesive sheet is reduced by the vapor generated through decomposition of the heat-decaying resin, and therefore the adhesive sheet could be readily peeled from the circuit pattern.

Further, when the adhesive sheet contains a crosslinkable resin component capable of crosslinking through energy stimulation applied thereto, then it is desirable that some energy stimulation is applied to the sheet so as to crosslink the crosslinkable resin component before the sheet is heated to decompose the heat-decaying resin therein. The adhesive force of the adhesive sheet could be greatly lowered, and the adhesive sheet could be more readily peeled from the circuit pattern. When the adhesive sheet is formed of a composite film as in FIG. 6(c), then the heat-decaying resin polymerizes owing to the crosslinkable resin component capable of crosslinking through exposure to light, and it readily undergoes phase separation in the matrix (phase) mentioned above.

In the above-mentioned step, when a crosslinked resin of the above-mentioned crosslinkable silyl group-having polyoxyalkylene resin is used for the heat-decaying resin, then the heat-decaying resin may be decomposed by heating at 150 to 170° C. The crosslinked resin of the above-mentioned crosslinkable silyl group-having polyoxyalkylene resin can be rapidly decomposed in an oxygen atmosphere even at a relatively low temperature. Accordingly, the decomposition time for the heat-decaying resin can be controlled by controlling the oxygen concentration in the heating atmosphere gas.

For the production of circuit boards mentioned above, a second method of producing circuit boards comprises using the transfer sheet for circuit formation mentioned above. The method includes a step of forming a circuit pattern by patterning the metal foil or the conductive paste layer of the transfer sheet for circuit formation, a step of pressure-bonding an insulating substrate or a ceramic green sheet onto the circuit pattern and attaching or embedding the circuit pattern into the insulating substrate of the ceramic green sheet, and a step of decomposing the heat-decaying resin by heating thereby to decay or deform the adhesive sheet and to transfer the circuit pattern onto the insulating substrate or the ceramic green sheet. Accordingly, the production method includes the step of forming a circuit pattern by patterning the metal foil or the conductive paste layer of the transfer sheet for circuit formation.

While the circuit pattern formed of a conductive paste layer is kept pressure-bonded to the insulating substrate or the ceramic green sheet, they may be heated so as to decay or deform the adhesive sheet and to transfer the circuit pattern formed of a conductive paste layer onto the insulating substrate or the ceramic green sheet.

In this method of producing circuit boards, the step of pressure-bonding the insulating substrate or the like onto the circuit pattern and attaching or embedding the circuit pattern into the insulating substrate, and the step of decomposing the heat-decaying resin by heating thereby to transfer the circuit pattern onto the insulating substrate or the ceramic green sheet may be the same as those in the above-mentioned first method for producing circuit boards.

According to the second method of producing circuit boards mentioned above, a transfer sheet for circuit formation that contains the above-mentioned heat-decaying resin is used, and therefore, even when the adhesive sheet has a high adhesive force, the circuit pattern can be well transferred onto the insulating resin or the like with no pattern disturbance. In addition, even when a circuit pattern having an extremely narrow line width is transferred at high density, it can be well transferred with high accuracy.

In addition, the method does not require any additional step of reducing the adhesive force of the adhesive sheet, but requires only the step of heating the adhesive sheet to decay or peel the adhesive sheet. Therefore, the production efficiency (producibility) and the workability of the method may be significantly improved.

[Pattern Formation]

The heat-decaying material of the invention is effective for pattern formation.

Embodiments of a method of pattern formation by the use of the heat-decaying material of the invention are described below with reference to the drawings.

First Embodiment of Pattern Formation

Figure 11:
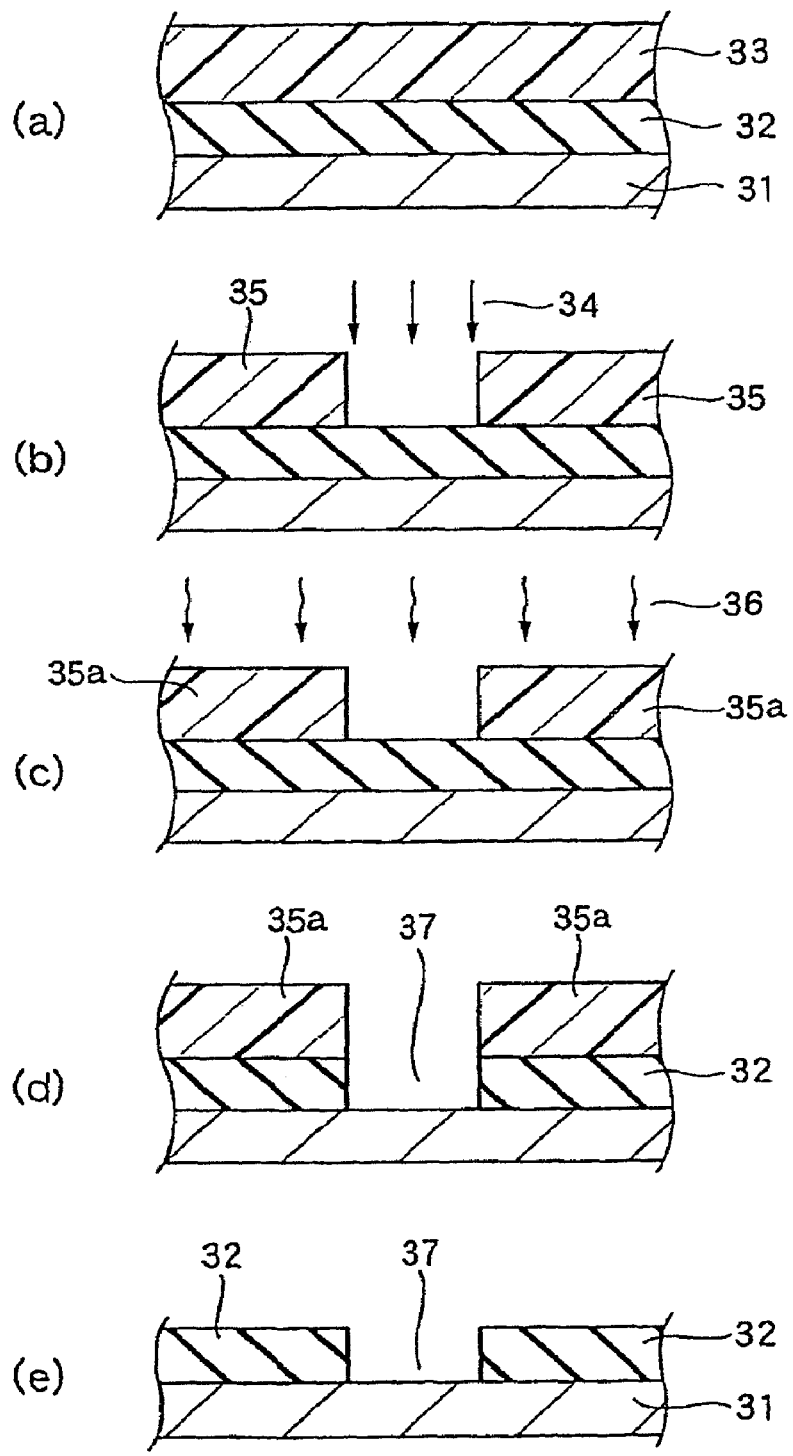
FIG. 11 includes cross-sectional views showing a process scheme of the first embodiment of pattern formation of the invention.

A first embodiment of pattern formation by the use of the heat-decaying material of the invention is described with reference to FIG. 11. FIG. 11 includes cross-sectional views of a process scheme that comprises patterning of an etching mask by the use of the heat-decaying resin film mentioned above, and patterning an insulator film via the mask for pattern formation.

In this, for forming the heat-decaying resin film, used is, for example, a decaying resin coating solution prepared by dissolving a crosslinkable silyl group-having polyoxypropylene resin and a diacylphosphine oxide compound in a solvent.

As in FIG. 11(a), an insulator film 32 of silicon oxide is deposited on a semiconductor substrate 31 with various semiconductor elements (not shown) formed thereon, and the above-mentioned decaying resin coating solution is applied onto the insulator film 32 in a mode of spin coating. Then, after the spin coating, this is pre-baked at a temperature not higher than 100° C. to vaporize the unnecessary solvent. In that manner, a heat-decaying resin film 33 having a thickness of 1 μm or so is formed. In this, the coating operation may be effected under irradiation with ordinary fluorescent light. As opposed to this, the coating step in conventional photolithography requires a special working room capable of completely blocking UV light.

Next, as in FIG. 11(b), using a carbon dioxide gas laser as a light source in a direct-patterning process, this is exposed to laser beams 34 of high energy density within a short period of time. The laser beams 34 are heat beams, and give heat energy to the heat-decaying resin film 33 whereby the irradiated region of the film is heated up to 200° C. to 250° C. or so. By the heat energy applied thereto, the irradiated region of the heat-decaying resin film 33 is pyrolyzed and decayed. In that manner, the heat-decaying resin film 33 is patterned to form an etching mask 35.

As opposed to this, in conventional resist films, the functional group in the resist is sensitive to the light in the direct-patterning process, and the base resin of the resist is therefore changed through exposure to light. Specifically, the copolymerization of the base resin is cleaved (in positive resists) or the polymerization is promoted (in negative resists). In that manner, the base resin having changed through exposure to light is dissolved in the next developing step to attain pattern formation.

Accordingly, the first embodiment of the method of pattern formation by the use of the heat-decaying material of the invention does not require the development step as in conventional photolithography, and therefore enables significant cost reduction in pattern formation.

Next, as in FIG. 11(c), this is entirely exposed to light 36, whereby the composition that constitutes the patterned heat-decaying resin film 33 for the etching mask 35 is crosslinked and photocured to form an etching mask 35a. Not specifically defined, the light source usable for the light irradiation may be any one that covers a wavelength range in which the polyoxyalkylene resin composition is sensitive to the light and begins to cure. For example, it includes low-pressure mercury lamp, middle-pressure mercury lamp, high-pressure mercury lamp, ultra-high-pressure mercury lamp, excimer laser, chemical lamp, black light lamp, microwave-excited mercury lamp, metal halide lamp, sodium lamp, halogen lamp, xenon lamp, fluorescent lamp, sunlight, electron beam radiator. One or more of these light sources may be used herein either singly or as combined. The etching mask 35a thus formed from the etching mask through exposure to light may have improved dry-etching resistance that will be mentioned below, and may well function as a dry-etching mask.

Next, as in FIG. 11(d), the insulator film 32 is dry-etched with plasma, via the etching mask 35a. Thus, an opening 37 is formed in the insulator film 32.

Next, as in FIG. 11(e), in an oxygen atmosphere or a nitrogen atmosphere, this is subjected to heat treatment at a temperature falling between 150° C. and 250° C. or so in the former or at a temperature falling between 200° C. and 250° C. or so in the latter. Through the heat treatment, the etching mask 35a formed of the heat-decaying resin is pyrolyzed and is completely decayed and removed. In this, the atmosphere for the heat treatment may be dry air. In that manner, a pattern of the insulator film 32 having the opening 37 is formed on the semiconductor substrate 31.

Regarding the device to be used for it, the removal of the etching mask 35a in the first embodiment of the method of pattern formation may be attained in a simple oven, as compared with the ashing removal in plasma in the prior art, and, in addition, the removal method is extremely simple. Accordingly, since the removal of the etching mask after used is extremely simple, and the cost of pattern formation can be greatly reduced.

In addition, when the heating is effected under reduced pressure, then the removal may be effected more efficiently.

In the above-mentioned embodiment, electron beams may be used in place of the laser beams for the thermal energy impartation. As the laser source, further usable herein are UV laser light source, and excimer laser light source.

The heat-decaying resin to be used for the above-mentioned pattern formation includes, for example, polymethylenemalonic acid diesters, polybutylene, nitrocellulose, α-methylstyrene polymer, propylene carbonate polymer, polyalkyl (meth)acrylates, copolymers of carboxylic acid dihydrazides and diisocyanates, peroxides of these polymers, as well as tackified compositions of such polymers optionally containing a plasticizer such as dibutyl phthalate or dioctyl phthalate or a softener such as xylene oil, terpene oil or paraffin wax added thereto. In addition, polybutene and polylauryl methacrylate may also be used as the heat-decaying resin.

However, it is desirable to use the heat-decaying material as defined in the invention. Further, among them, we the present inventors have found that the heat-decaying resin film prepared by crosslinking a crosslinkable silyl group-having polyoxyalkylene resin composition can be rapidly decayed when heated at 150 to 260° C.

The heat-decaying resin prepared by crosslinking a crosslinkable silyl group-having polyoxyalkylene resin composition may be the same as those described in detail in the section of the conductive particles transfer sheet.

Second Embodiment of Pattern Formation

Figure 12:
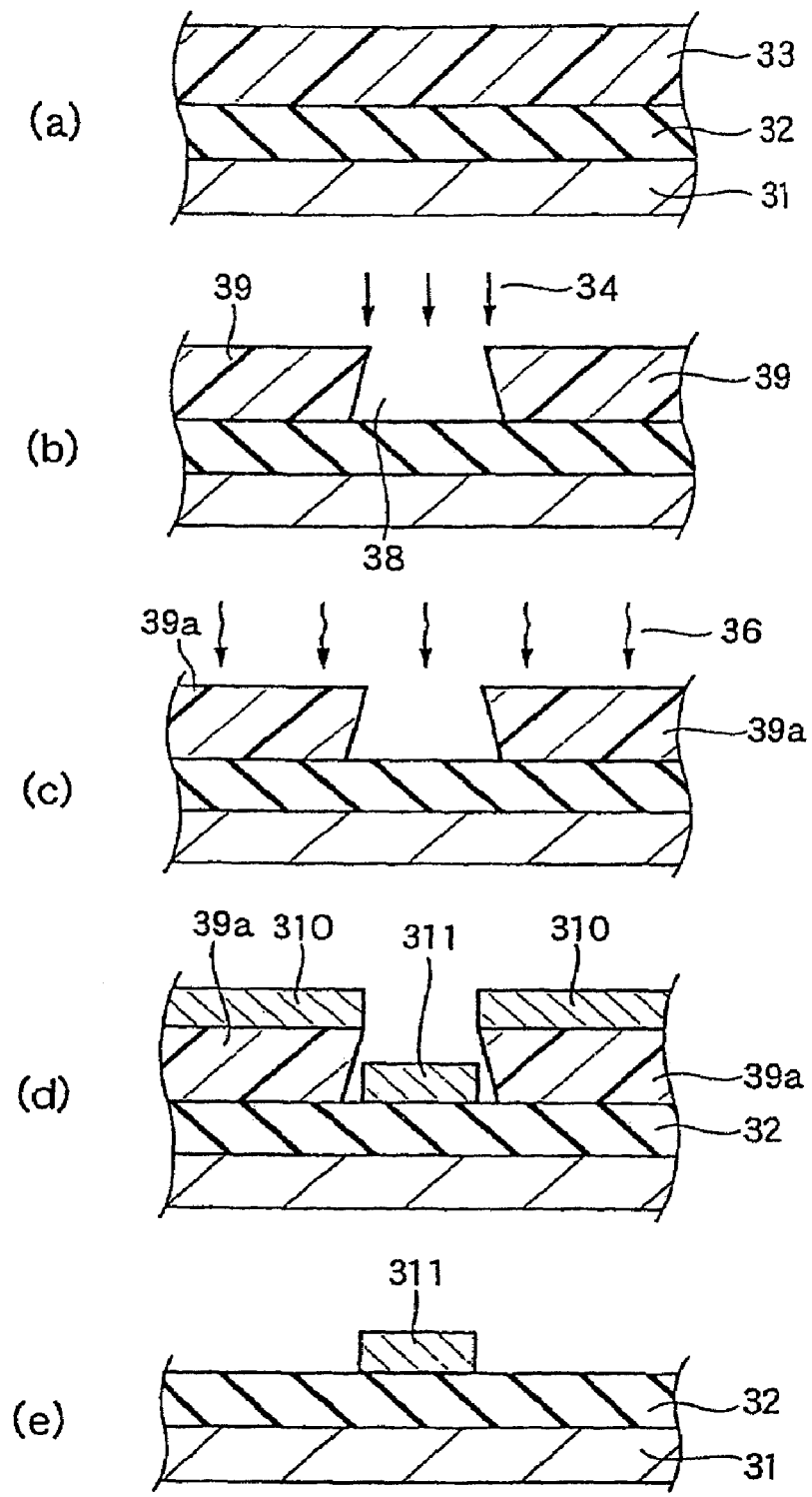
FIG. 12 includes cross-sectional views showing a process scheme of the second embodiment of pattern formation of the invention.

A second embodiment of pattern formation by the use of the heat-decaying material of the invention is described with reference to FIG. 12. FIG. 12 includes cross-sectional views of a process scheme that comprises patterning of a lift-off mask by the use of the heat-decaying resin film mentioned above, and patterning of a conductor film for wiring by the use of it. In this, the same elements as those in the first embodiment are indicated by the same reference numerals.

Also in this embodiment, for forming the heat-decaying resin film, used is a decaying resin coating solution prepared by dissolving the above-mentioned, crosslinkable silyl group-having polyoxypropylene resin and a diacylphosphine oxide compound in a solvent.

Like in the first embodiment but as in FIG. 12(a), a silicon oxide insulator film 32 is deposited on a semiconductor substrate 31, and the above-mentioned decaying resin coating solution is applied onto the insulator film 32 in a mode of spin coating. Then, after the spin coating, this is pre-baked at a temperature of 80° C. or so to vaporize the unnecessary solvent. In that manner, a heat-decaying resin film 33 having a thickness of 1.5 μm or so is formed.

Next, as in FIG. 12(b), this is exposed to heat beams or laser beams 34 according to a direct-patterning process. In this, YAG laser is used for the light source. Heat energy is thus imparted to the heat-decaying resin film 33 and the irradiated region of the film is thereby heated at 200° C. or so. In that manner, heat may concentrate and remain in the surface of the insulator film 32 formed of silicon oxide of poor thermal conductivity, and therefore the heat-decaying resin film 33 nearer to the insulator film 32 is more readily pyrolyzed. Accordingly, a lift-off mask 39 having a lift-off opening 38 is formed as in FIG. 12(b), in which the opening 38 has a reverse-tapered cross-sectional profile.

Also in this case, the formation of the lift-off mask 39 having the lift-off opening 38 does not require at all the development step as in conventional photolithography, like in the first embodiment. Accordingly, the pattern formation in this embodiment enables significant cost reduction, as so mentioned hereinabove.

Nest, like in the first embodiment but as in FIG. 12(c), this is entirely exposed to light 36, whereby the heat-decaying resin film 33 patterned for the lift-off mask 39 is crosslinked and photocured to form lift-off mask 39a.

Next, as in FIG. 12(d), a conductor film 310 of tungsten (W) or the like, for example, having a thickness of 0.5 μm or so is formed on the lift-off mask 39a in a mode of sputtering film formation. In this, preferred is a collimate-sputtering process excellent in rectilinear deposition. In that manner, since the lift-off mask 39a has a reversed taper form, the conductor film 310 deposited on the lift-off mask 39a and the conductor film deposited inside the lift-off opening 38 to be a wiring 311 can be separated from each other as in FIG. 12(d).

Next, in an oxygen atmosphere or a nitrogen atmosphere, this is subjected to heat treatment at a temperature of 200° C. or so in the former or at a temperature of 250° C. or so in the latter. Through the heat treatment, the lift-off mask 38a formed of the heat-decaying resin is pyrolyzed and decayed, and the conductor film 310 on the lift-off mask 39a can be thereby lifted off and removed. According to the lift-off process of the invention, a wiring 311 may be formed on the insulator film 32 on the semiconductor substrate 31, as in FIG. 12(e).

In conventional lift-off technology, the life-off mask is formed of a resist film, and in the lift-off step, the lift-off mask formed of a resist film is dissolved in a chemical of an organic solvent and removed. Through the dissolution and removal of the lift-off mask, the conductor film deposited on the lift-off mask is lifted off and removed, and wiring is thereby formed.

In this embodiment 2, the chemical as in the conventional lift-off step is not used, and therefore, the lift-off operation is safe and its operability is improved. In addition, the pattern formation cost is thereby reduced. When the quantity of light of YAG laser is varied, then the reversed taper could not be formed but the lift-off operation is still possible.

Third Embodiment of Pattern Formation

Figure 13:
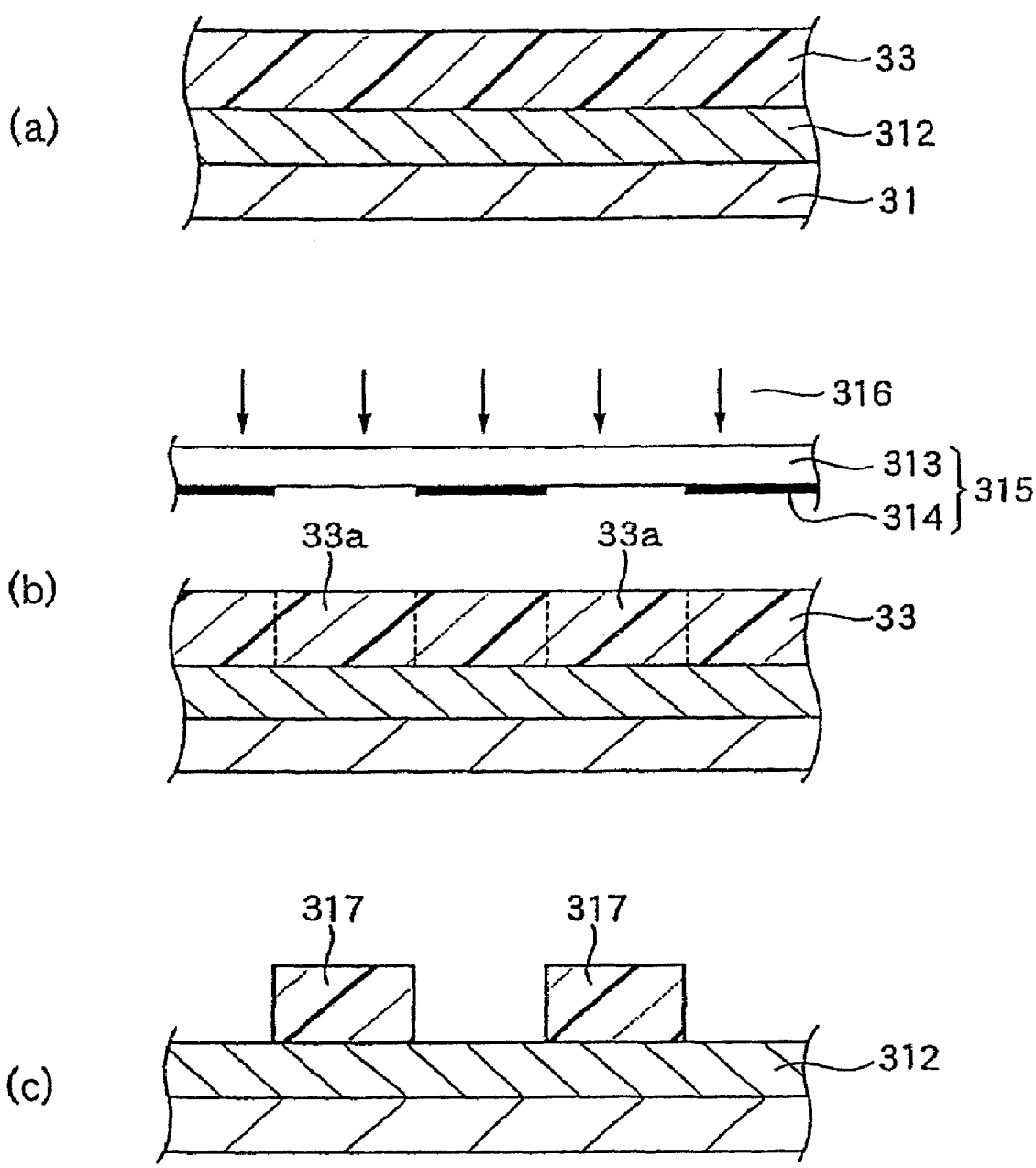
FIG. 13 includes cross-sectional views showing a process scheme of the third embodiment of pattern formation of the invention.
Figure 14:
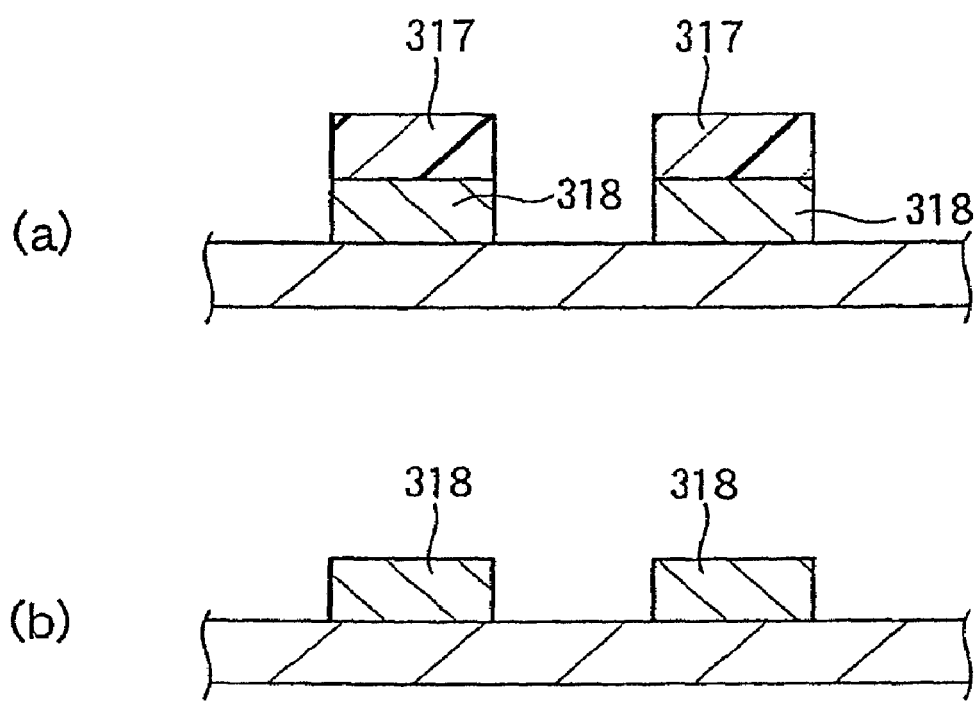
FIG. 14 includes cross-sectional views of a process scheme of pattern formation that follows the above-mentioned process.

A third embodiment of pattern formation by the use of the heat-decaying material of the invention is described with reference to FIG. 13 and FIG. 14. FIG. 13 and FIG. 14 each include cross-sectional views of a process scheme that comprises patterning of an etching mask by the use of the heat-decaying resin film mentioned above, and patterning of a semiconductor film by the use of it. In this, the same elements as those in the first embodiment are indicated by the same reference numerals.

Also in this embodiment, for forming the heat-decaying resin film, used is a decaying resin coating solution prepared by dissolving the above-mentioned, crosslinkable silyl group-having polyoxypropylene resin and a diacylphosphine oxide compound in a solvent, like in the first and second embodiments.

As in FIG. 13(a), a thermal oxide film (not shown) is formed on the surface of a semiconductor substrate 31, and a semiconductor thin film 312 of a polycrystalline silicon film or the like is deposited on the thermal oxide film, and the above-mentioned decaying resin coating solution is applied onto the semiconductor thin film 312 in a mode of spin coating. Then, after the spin coating, this is pre-baked at a temperature of 80° C. or so to vaporize the unnecessary solvent. In that manner, a heat-decaying resin film 33 having a thickness of 1 µm or so is formed.

Next, as in FIG. 13(b), this is exposed to light in the same manner as in conventional photolithography. Concretely, using a reticle 315 that comprises a quartz glass substrate 313 and a light-shielding film pattern 314 formed on its surface, as a photomask, light for exposure 316 is applied to this in a mode of ordinary reduced projection exposure and the heat-decaying resin film 33 is thereby patterned through exposure transfer. In that manner, a photocured region 33a is formed in a predetermined area of the heat-decaying resin film 33. In this, ArF excimer layer (wavelength: about 193 nm) is used for the light for exposure 316.

Next, in an oxygen atmosphere, this is subjected to heat treatment at a temperature of 150° C. or so. Through the heat treatment, the heat-decaying resin in the region except the photocurable region 33a of the heat-decaying resin 33 is pyrolyzed and completely decayed. However, the photocurable region 33a of the heat-decaying resin film 33 does not pyrolyze at the above-mentioned temperature of 150° C. or so, but remains to exist as it is. In that manner, as in FIG. 13(c), the heat-decaying resin film 33 is patterned to form an etching mask 317 on the semiconductor film 312. In this, one important matter is that the above-mentioned temperature for heat treatment is so designed as to be higher than the temperature at which the heat-decaying resin film 33 in the region not irradiated with the light 316 decomposes and decays, but lower than the temperature at which the heat-decaying resin film 33 in the region irradiated with the light 316, or that is, the photocurable region 33a thereof decomposes and decays.

Figure 16:
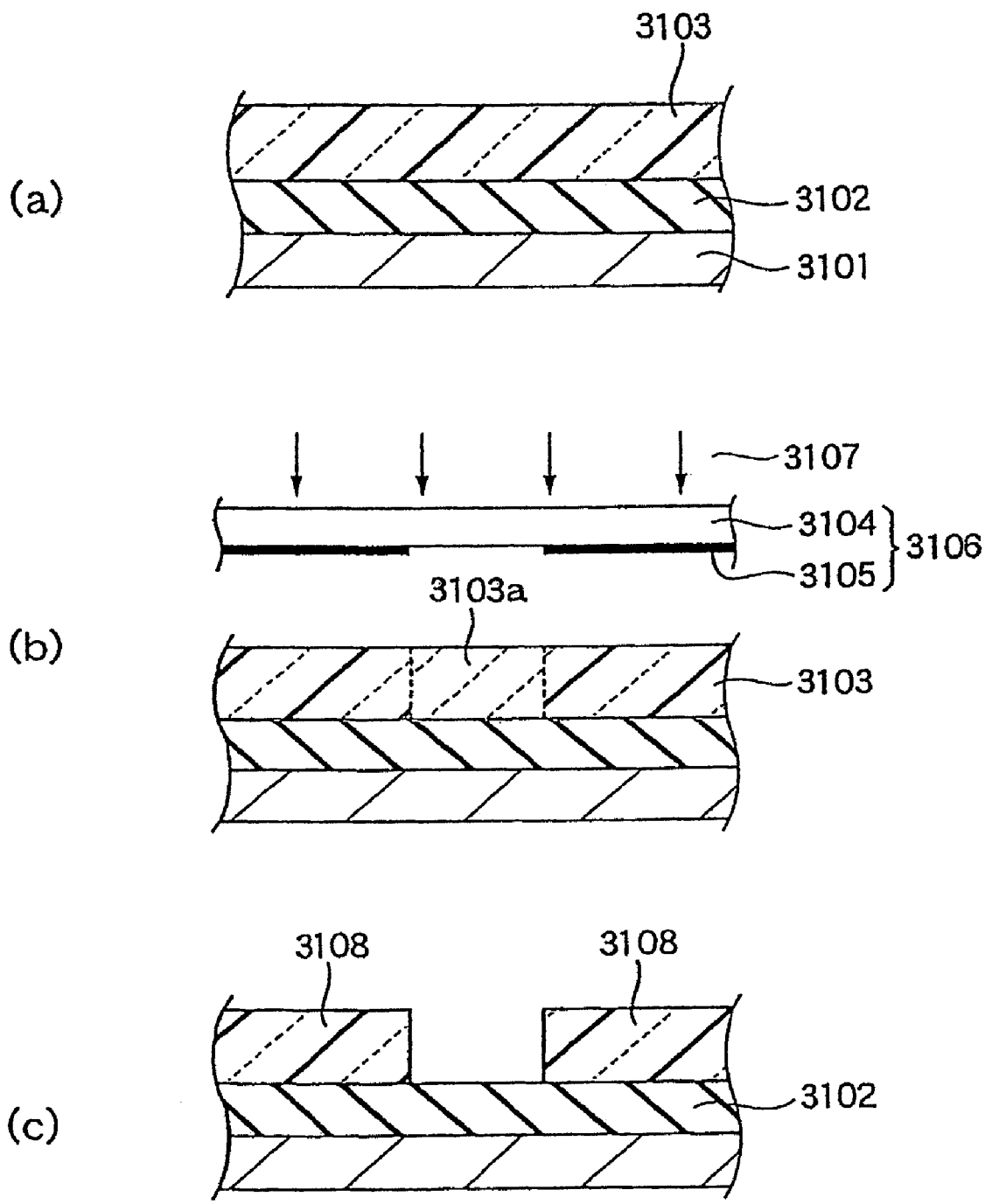
FIG. 16 includes cross-sectional views of a process scheme of pattern formation for explaining a prior art.
Figure 17:
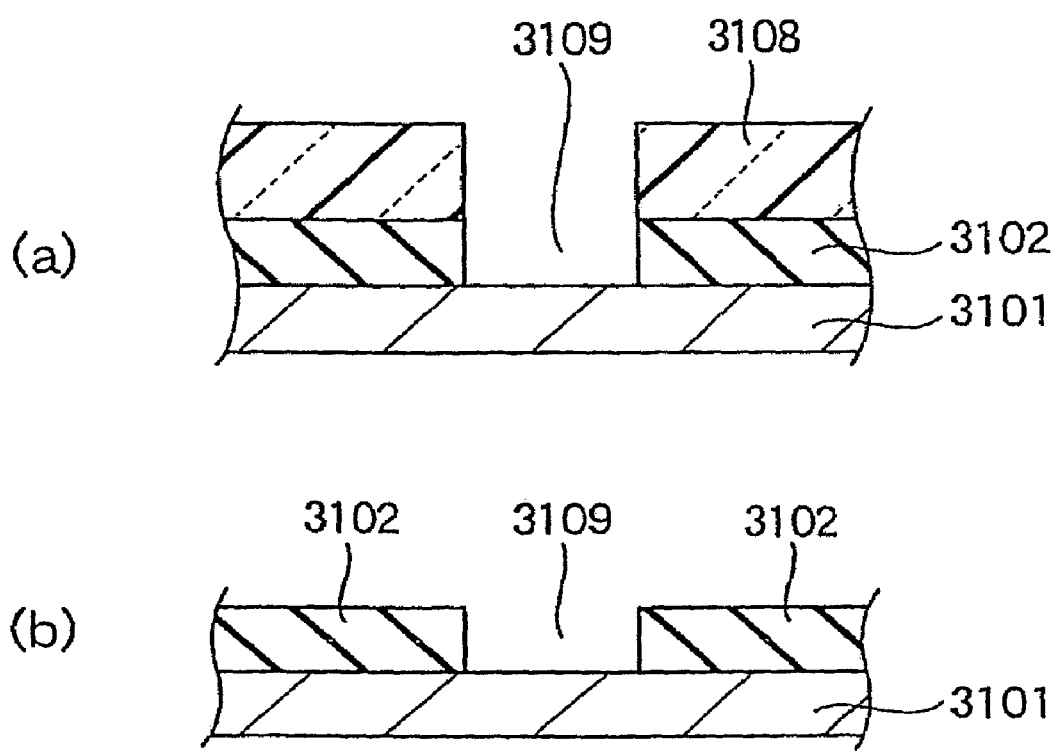
FIG. 17 includes cross-sectional views of a process scheme of pattern formation that follows the above-mentioned process.

As opposed to this, in conventional patterning of resist films, the functional group in the resist is sensitive to light, and the base resin of the resist is therefore changed through exposure to light in the step of FIG. 16(b) as so mentioned hereinabove. Specifically, the copolymerization of the base resin is cleaved (in positive resists) or the polymerization is promoted (in negative resists). In that manner, the base resin having changed through exposure to light is dissolved in the next developing step to attain pattern formation.

Accordingly, this embodiment also does not require a development step as in conventional photolithography, and enables significant cost reduction in pattern formation.

Next, as in FIG. 14(a), the semiconductor thin film 312 is dry-etched with plasma, via the etching mask 317. Thus, for example, a gate electrode 318 is formed.

Next, as in FIG. 14(b), in a nitrogen atmosphere, this is subjected to heat treatment at a temperature falling between 200° C. and 250° C. or so. Through the heat treatment, the etching mask 317 formed of the heat-decaying resin is pyrolyzed and is completely decayed and removed. In this, the atmosphere for the heat treatment may be dry air. In that manner, the gate electrode 318 is formed on the semiconductor substrate 31 through patterning of the semiconductor thin film 312.

Also in this case, the removal of the etching mask 317 is extremely simple as compared with the ashing removal in plasma in the prior art, and this enables significant cost reduction in patterning.

In this, a polypropylene glycol diacrylate-based photocurable resin may be added to the decaying resin coating solution for use herein. Accordingly, such a photo crosslinkable material is added to it, and the decay temperature T1 in the exposed region can be selectively elevated over the decay temperature T0 in the non-exposed region. With that, when the coating layer is heated at a temperature T (T0<T<T1), then the resist pattern can be more readily formed.

After the patterning, this is heated at T (T>T1), and the resist pattern can be removed.

Fourth Embodiment of Pattern Formation

Figure 15:
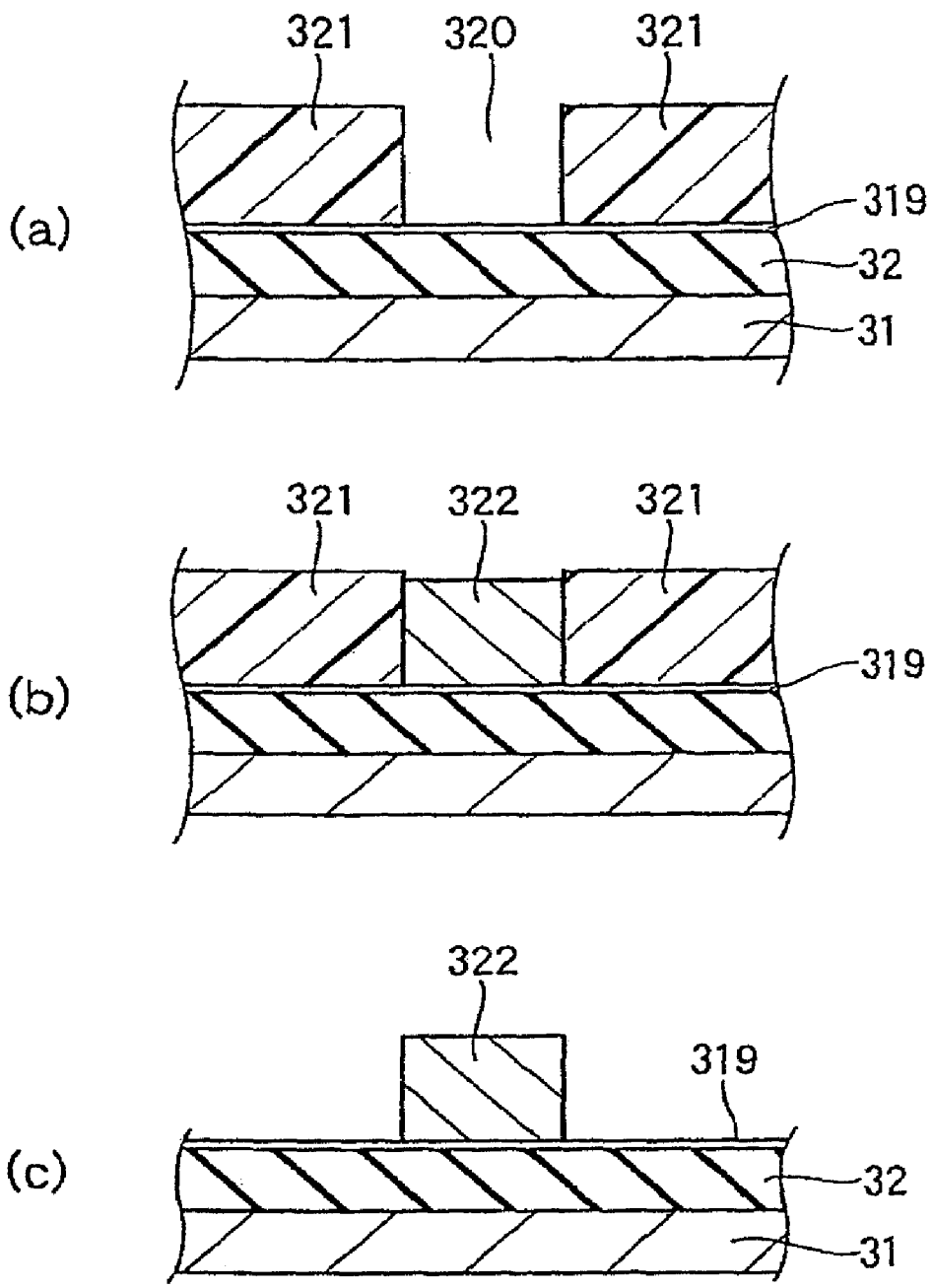
FIG. 15 includes cross-sectional views of a part of a process scheme of the fourth embodiment of pattern formation of the invention.

A fourth embodiment of pattern formation by the use of the heat-decaying material of the invention is described with reference to FIG. 15. FIG. 15 includes cross-sectional views of a process scheme that comprises patterning of a plating mask by the use of the heat-decaying resin film mentioned above, and patterning of a metal film for bumps by the use of it. In this, the same elements as those in the first embodiment are indicated by the same reference numerals.

Also in this embodiment, for forming the heat-decaying resin film, used is a decaying resin coating solution prepared by dissolving the above-mentioned, crosslinkable silyl group-having polyoxypropylene resin and a diacylphosphine oxide compound in a solvent.

As in FIG. 15(a), an insulator film 32 of silicon oxide is deposited on a semiconductor substrate with various semiconductor elements (not shown) formed thereon, and a thin Cu layer is formed on the insulator film 32 to be a feeder layer 319, according to a sputtering process. Next, the above-mentioned, decaying resin coating solution is applied over this according to a spin-coating process, and a plating mask 321 having a plating opening 320 is formed in the same manner as that for the step of FIG. 11(b). Further, in the same manner as in the first embodiment, the plating mask 321 is entirely exposed to light, whereby the composition that constitutes the heat-decaying resin film to form the pattern of the plating mask 321 is crosslinked and photocured.

Next, this is plated in a plating bath filled with a plating solution that contains a divalent copper ion, for example, an aqueous solution of cupper sulfate having a copper ion content of from 5 to 200 g/liter or so. Through the plating treatment, a copper electrode 322 is formed to fill the plating opening 320, as in FIG. 15(b). In this plating step, the photocured plating mask 321 does not swell in the plating bath and its pattern does not change.

Next, this is subjected to heat treatment in a nitrogen atmosphere at a temperature falling between 200 and 250° C., as in FIG. 15(c). Through the heat treatment, the plating mask 321 formed of the heat-decaying resin is pyrolyzed and completely decayed and removed. In this, the atmosphere for heat treatment may be dry air. In that manner, the metal film is patterned to give the copper electrode 322 formed on the insulator film 32 on the semiconductor substrate 31. The thin feeder layer 319 is removed by dry etching or ion milling in the subsequent step.

The plating mask 321 formed of the heat-decaying resin may be applied entirely in the same manner as above also to gold (Au) plating except copper plating. Patterning the metal film in the manner as above enables formation of bumps or wirings on semiconductor chips.

As described hereinabove, use of the plating mask formed of the heat-decaying material of the invention significantly reduces the patterning cost of metal films.

The pattern formation by the use of the heat-decaying material of the invention is not limited to the above-mentioned embodiments, and the embodiments may be suitably changed and modified within the technical scope of the invention. The above-mentioned embodiments are to demonstrate production of semiconductor devices. Not limited to these, the invention is applicable to production of display devices such as liquid-crystal display panels, plasma display panels. In the above, the etching treatment is for dry etching. Also not limited to it, the invention is applicable to wet etching.

The invention is described in more detail with reference to the following Examples, to which, however, the invention should not be limited.

Example 1

In a 0.2-liter beaker, 100 g of an alkoxysilyl-modified polypropylene glycol (Kanegafuchi Chemical's MS Polymer S-303) and 3 g of a diacylphosphine oxide compound (Ciba Specialty Chemical's Irgacure 819) were heated at 50° C. in the dark, and mixed with a stirrer to be uniform to give a heat-decaying material (paste).

The thus-prepared, heat-decaying material (paste) was applied onto a polyethylene terephthalate film and onto an aluminium plate having a thickness of 25 µm, so that its thickness could be 100 µm. The coated object was exposed to UV ray at 365 nm from a high-pressure mercury lamp at a controlled irradiation intensity of 10 mW/cm$^2$ for 60 seconds. After thus exposed to UV ray, this was cured at 80° C. for 30 minutes to obtain a heat-decaying sheet.

Example 2

In a 0.2-liter beaker, 100 g of an alkoxysilyl-modified polypropylene glycol (Kanegafuchi Chemical's MS Polymer S-303) and 3 g of a diacylphosphine oxide compound (Ciba Specialty Chemical's Irgacure 819) were heated at 80° C. in the dark, and mixed with a stirrer to be uniform. Then, this was cooled to room temperature, and 3 g of an organic peroxide, 1,1-bis(t-hexylperoxy)-3,3,5-trimethylcyclohexane (Nippon Yushi's Perhexa TMH) was added to it to prepare a heat-decaying material (paste).

The thus-prepared, heat-decaying material (paste) was applied onto a polyethylene terephthalate film and onto an aluminium plate having a thickness of 25 µm, so that its thickness could be 100 µm. The coated object was exposed to UV ray at 365 nm from a high-pressure mercury lamp at a controlled irradiation intensity of 10 mW/cm$^2$ for 60 seconds. After thus exposed to UV ray, this was cured at 50° C. for 30 minutes to obtain a heat-decaying sheet.

Comparative Example 1

In a 0.2-liter beaker, 100 g of lauryl methacrylate and 1 g of a diacylphosphine oxide compound (Ciba Specialty Chemical's Irgacure 819) were heated at 50° C. in the dark, and mixed with a stirrer to be uniform. Then, this was bubbled with nitrogen for 10 minutes to remove the dissolved oxygen, and a photocurable composition was thus prepared.

The thus-prepared photocurable composition was applied onto a lubricant-processed polyethylene terephthalate film and onto an aluminium plate having a thickness of 25 µm, so that its thickness could be 100 µm. The coated object was exposed to UV ray at 365 nm from a high-pressure mercury lamp at a controlled irradiation intensity of 2 mW/cm$^2$ for 30 minutes, and an adhesive sheet was thus obtained.

(Evaluation)

The heat-decaying sheets formed in Examples 1 and 2 and Comparative Example 1 were evaluated in point of cobwebbing from sheet, tacky feel, and decay time when heated at 150° C. and 250° C.

The results are shown in Table 1.

(Evaluation of Cobwebbing from Sheet)

A thin and long polyethylene terephthalate sheet having a width of 25 mm and a thickness of 50 µm is attached to the adhesive layer of the adhesive sheet, and the sheet is peeled from its end. In this case, the sheet is visually observed as to whether or not cobwebbing is seen in the peeling interface.

(Evaluation of Tacky Feel)

The adhesive layer of the heat-decaying sheet is touched with fingers, and the sample is organoleptically evaluated as to whether it is sticky or not.

(Evaluation of Decay Time Heated at 150° C. and 250° C.)

The adhesive sheet with an aluminium plate as its substrate is cut into a piece of 5 mm×5 mm, and the resulting sample is put on a hot plate heated at a predetermined temperature. The adhesive layer is visually observed, and its decay time is determined. After the decay of the layer, the weight of the residue remaining on the aluminium plate is measured, and the weight reduction by heating is calculated.

| | | | Heated at 150° C. | | Heated at 250° C. | | Appearance of Aluminium |
|---|---|---|---|---|---|---|---|
| | Cobwebbing from Sheet | Tacky Feel | Decay Time (sec) | Weight Reduction (%) | Decay Time (sec) | Weight Reduction (%) | Plate after Resin Decay |
| Example 1 | no | yes | 500 | 96 | 15 | 98 | burned but a little |
| Example 2 | no | yes | 500 | 98 | 15 | 99 | not burned |
| Comparative Example 1 | yes | yes | 600 | 70 | 600 | 83 | burned but a little |

Example 3

In a 0.2-liter beaker, 20 g of a double-terminated glycidyl ether polypropylene glycol (Kyoeisha Chemical's Epolite 400P), and 80 g of a double-terminated amino group-containing polypropylene glycol (Huntsman's Jeffamin D2000, crosslinking agent (1)) were mixed with a stirrer to be uniform to give a heat-decaying material (paste) of the invention.

In the same manner as in Example 1, the thus-prepared, heat-decaying material (paste) was formed into a 100 μm-thick coating film, and cured in an oven at 80° C. for 2 hours to give a crosslinked film.

In the same manner as in Example 1, the resulting crosslinked film was heated at 150° C., 250° C. and 300° C., and the decaying time and the weight of the residue after decay of the sample were determined. The results are shown below.

150° C. decay time 500 seconds weight reduction 95%
250° C. decay time 20 seconds weight reduction 98%
300° C. decay time 5 seconds weight reduction 98%

Example 4

In a 0.2-liter beaker, 95 g of a polypropylene glycol monomethacrylate (Nippon Yushi's Blemmer PP1000), 5 g of a polypropylene glycol diacrylate (Toa Gosei's Aronix M270) and 1 g of a diacylphosphine oxide (Ciba Specialty Chemical's Irgacure 819) were mixed in the dark with a stirrer to be uniform, and then bubbled with nitrogen for 10 minutes to remove the dissolved oxygen to give a heat-decaying material (paste) of the invention.

In the same manner as in Example 1, the thus-prepared, heat-decaying material (paste) was formed into a 100 μm-thick coating film, and exposed to UV ray at 365 nm from a high-pressure mercury lamp at a UV intensity of 10 mW/cm$^2$ to give a crosslinked film.

In the same manner as in Example 1, the resulting crosslinked film was heated at 150° C., 250° C. and 300° C., and the decaying time and the weight of the residue after decay of the sample were determined. The results are shown below.

150° C. decay time 500 seconds weight reduction 93%
250° C. decay time 25 seconds weight reduction 98%
300° C. decay time 15 seconds weight reduction 98%

Example 5

A heat-decaying material (paste) was prepared in the same manner as in Example 1, to which, however, 2 g of cumene hydroxyperoxide (peroxide as a decomposition promoter) was added. This was formed into a heat-decaying sheet in the same manner as in Example 1.

In the same manner as in Example 1, the resulting heat-decaying sheet was heated at 150° C., 250° C. and 300° C., and the decaying time and the weight of the residue after decay of the sample were determined. The results are shown below.

150° C. decay time 300 seconds weight reduction 97%
250° C. decay time 12 seconds weight reduction 98%
300° C. decay time 10 seconds or less weight reduction 98%

Example 6

A heat-decaying material (paste) was prepared in the same manner as in Example 1, to which, however, 2 g of AIBN (azo compound as a decomposition promoter) was added. This was formed into a heat-decaying sheet in the same manner as in Example 1.

In the same manner as in Example 1, the resulting heat-decaying sheet was heated at 150° C., 250° C. and 300° C., and the decaying time and the weight of the residue after decay of the sample were determined. The results are shown below.

150° C. decay time 300 seconds weight reduction 98%
250° C. decay time 12 seconds weight reduction 97%
300° C. decay time 10 seconds or less weight reduction 97%

Example 7

A heat-decaying material (paste) was prepared in the same manner as in Example 1, to which, however, 4 g of tin oxide (decomposition promoter) was added. This was formed into a heat-decaying sheet in the same manner as in Example 1.

In the same manner as in Example 1, the resulting heat-decaying sheet was heated at 150° C., 250° C. and 300° C., and the decaying time and the weight of the residue after decay of the sample were determined. The results are shown below.

150° C. decay time 350 seconds weight reduction 98%
250° C. decay time 12 seconds weight reduction 97%
300° C. decay time 10 seconds or less weight reduction 96%

Example 8

A heat-decaying material (paste) was prepared in the same manner as in Example 1, to which, however, 3 g of dodecylmercaptan (mercapto compound as a decomposition retardant) was added. This was formed into a heat-decaying sheet in the same manner as in Example 1.

In the same manner as in Example 1, the resulting heat-decaying sheet was heated at 150° C., 250° C. and 300° C., and the decaying time and the weight of the residue after decay of the sample were determined. The results are shown below.

150° C. decay time 800 seconds weight reduction 96%
250° C. decay time 30 seconds weight reduction 97%
300° C. decay time 15 seconds weight reduction 97%

Example 9

A heat-decaying material (paste) was prepared in the same manner as in Example 1, to which, however, 2 g of 1,6-hexamethylenediamine (amine compound as a decomposition retardant) was added. This was formed into a heat-decaying sheet in the same manner as in Example 1.

In the same manner as in Example 1, the resulting heat-decaying sheet was heated at 150° C., 250° C. and 300° C., and the decaying time and the weight of the residue after decay of the sample were determined. The results are shown below.

150° C. decay time 750 seconds weight reduction 95%
250° C. decay time 30 seconds weight reduction 96%
300° C. decay time 15 seconds weight reduction 97%

Example 10

A heat-decaying material (paste) was prepared in the same manner as in Example 1, to which, however, 2 g of dibutyltin dilaurate (organic tin as a decomposition retardant) was added. This was formed into a heat-decaying sheet in the same manner as in Example 1.

In the same manner as in Example 1, the resulting heat-decaying sheet was heated at 150° C., 250° C. and 300° C., and the decaying time and the weight of the residue after decay of the sample were determined. The results are shown below.

150° C. decay time 800 seconds weight reduction 95%
250° C. decay time 40 seconds weight reduction 96%
300° C. decay time 20 seconds weight reduction 98%

Example 11

A heat-decaying material (paste) was prepared in the same manner as in Example 1, to which, however, 3 g of tributyl borate (organic boron as a decomposition retardant) was added. This was formed into a heat-decaying sheet in the same manner as in Example 1.

In the same manner as in Example 1, the resulting heat-decaying sheet was heated at 150° C., 250° C. and 300° C., and the decaying time and the weight of the residue after decay of the sample were determined. The results are shown below.
150° C. decay time 800 seconds weight reduction 96%
250° C. decay time 40 seconds weight reduction 96%
300° C. decay time 20 seconds weight reduction 97%

Example 12

The heat-decaying sheet of Example 1 was heated in a nitrogen or oxygen concentration atmosphere as in the following Tables, at 250° C. or 300° C. for 5 minutes. The weight reduction of the sheet after heated, the amount of the residue thereof, and the visual appearance thereof are shown in the Tables.

| | 250° C. × 5 min. | | | | | | | |
|---|---|---|---|---|---|---|---|---|
| Nitrogen Concentration (%) | 100 | 98 | 95 | 92.4 | 89.8 | 83 | 73.8 | 0 |
| Oxygen Concentration (%) | 0 | 2 | 5 | 7.6 | 10.2 | 17 | 26.2 | 100 |
| Weight Reduction (mas %) | 2.9 | 24.14 | 57.3 | 80.98 | 97.28 | 98.68 | 99.35 | 97.1 |
| Amount of Residue (mas %) | 97.1 | 75.86 | 42.7 | 19.02 | 2.72 | 1.32 | 0.65 | 2.9 |
| Visual Appearance | almost kept original | almost kept original | thick liquid | thick liquid | flawed | flawed | not flawed | fired and torn |

| | 300° C. × 5 min. | |
|---|---|---|
| Nitrogen Concentration (%) | 90 | 82 |
| Oxygen Concentration (%) | 10 | 18 |
| Weight Reduction (mas %) | 100 | 96.4 |
| Amount of Residue (mas %) | 0 | 3.6 |
| Visual Appearance | yellow | flawed |

In the Tables, the oxygen concentration was measured with an oxygen concentration monitor alarm, Gastec's OXYTEC mini-monitor, GOA-6H-S, and indicated by percentage.

In the Tables, the oxygen concentration is a value obtained by subtracting the value of the above-mentioned oxygen concentration from 100.

The weight reduction and the amount of residue, the oxygen concentration in the Tables is a value obtained by subtracting the value of the above-mentioned oxygen concentration from 100.

The above results confirm that the heat-decaying material of the invention can be more efficiently decomposed when the oxygen concentration in the heating atmosphere is higher.

[Examples of Production Methods for Porous Materials]

Example 21

80 g of tetraethoxysilane (by Shin-etsu Chemical), 20 g of a hydrolyzing silyl group-containing polypropylene glycol (Asahi Glass' Exsester ESS-3630), and 3 g of a diacylphosphine oxide derivative (Ciba Specialty Chemical's Irgacure 819) were heated at about 40° C. in the dark and dissolved to be uniform.

The resulting composition was cast into a frame, width 10 mm×length 30 mm×depth 0.05 mm, formed of a steel sheet with an adhesive tape, and exposed to a high-pressure mercury lamp (365 nm, intensity 10 mW/cm$^2$×60 seconds) whereby the hydrolyzing silyl group-containing polypropylene glycol was crosslinked, and the size of the copolymer to be a heat-decaying material was controlled. After thus exposed to light, this was then cured at 20° C. for 48 hours at it was. A flexible film was obtained. The resulting film was cured in an oven at 250° C. for 10 minutes. A rigid porous plate having a residual organic content of at most 3% was obtained. The resulting rigid film was further cured at 400° C. for 30 minutes. The residual organic content was evaluated in terms of the loss weight of the object determined through thermal weight reduction (TGA, heating rate 10° C./min, highest temperature limit 600° C.)

Example 22

80 g of tetraethoxysilane (by Shin-etsu Chemical), 12 g of a hydrolyzing silyl group-containing polypropylene glycol (Asahi Glass' Exsester ESS-3630), 8 g of α,ω-diacryloyloxy-polypropylene glycol (Toa Gosei's Aronix M-270) and 3 g of a diacylphosphine oxide derivative (Ciba Specialty Chemical's Irgacure 819) were heated at about 40° C. in the dark and dissolved to be uniform.

The resulting composition was cast into a frame, width 10 mm×length 30 mm×depth 0.05 mm, formed of a steel sheet with an adhesive tape, and exposed to a high-pressure mercury lamp (365 nm, intensity 10 mW/cm$^2$×60 seconds). After thus exposed to light, this was then cured at 20° C. for 24 hours at it was. A flexible film was obtained. The resulting film was put on a fluoroethylene resin-baked iron plate, and cured in an oven at 250° C. for 10 minutes. A rigid porous plate having a residual organic content of about 5% was obtained. The resulting rigid plate was further cured at 400° C. for 30 minutes.

Comparative Example 21

A solution of 80 g of tetraethoxysilane (by Shin-etsu Chemical), 40 g of a solution of cyclohexyl acrylate (number-average molecular weight, 100,000) in ethyl acetate (solid content, 50%), and 2 g of dibutyltin dilaurate (by Wako Jun-yaku) was cast into a frame, width 10 mm×length 30 mm×depth 0.05 mm, formed of a polyethylene sheet with an adhesive tape, and cured at 20° C. for 48 hours while dried in air to evaporate ethyl acetate. The resulting film was cured in an oven at 250° C. for 10 minutes. A rigid porous plate was obtained, but it had a residual organic content of 30%. The resulting rigid porous plate was further cured at 400° C. for 30 minutes, and its residual organic content reduced to at most 5%.

Example 23

A precursor containing an alkoxysilane and a heat-decaying material is a liquid composite material where the alkoxysilane has partially hydrolyzed and condensed, and the composite material is used as an SOG (spin-on-glass) coating solution to form an interlayer insulating film between wirings of a semiconductor device. This is described in detail with reference to FIG. 1. FIG. 1 includes cross-sectional views of a process scheme of forming MOSFET on a semiconductor substrate to be processed, in which the porous material of the invention is applied to the interlayer insulating film in the two-layered wiring structure.

As in FIG. 1(a), an element separation region 2 is selectively formed on a silicon substrate 1 according to a trench element separation process. Then, a gate insulating film 3 is formed; a gate silicon layer 4 is formed of a polycrystalline silicon containing an effective impurity such as phosphorus; and impurity diffusion layers 5a and 5b to be a source/drain region are formed through ion implantation followed by subsequent heat treatment. Next, as in FIG. 1(b), a spacer 3s is formed of a silicon oxide film or the like, around the side wall of the gate silicon layer 4. Next, a high-melting-point metal such as cobalt (Co) is deposited on the entire surface of the structure according to a sputtering process, then this is subjected to heat treatment to remove the unnecessary cobalt. As in FIG. 1(c), silicide layers 6g, 6a and 6b are selectively formed on the gate silicon layer 4 and the impurity diffusion layers 5a and 5b to make a silicide structure.

Next, as in FIG. 1(d), a first interlayer insulating film 7 is formed on the entire surface of the structure. Preferably, the first interlayer insulating film 7 is formed of a silicon oxide film through chemical vapor deposition (CVD) and its surface is planarized through chemical mechanical polishing (CMP). Next, a first contact hole 9 is formed in the first interlayer insulating film 7, and a first wiring 8 is formed of a metal such as tungsten (W). The thermal oxide film of silicon has a relative dielectric constant of 3.9, and the relative dielectric constant of the first interlayer insulating film 7 could be almost 4 or so though depending on the reaction gas used in CVD.

After this, the above-mentioned SOG coating solution is applied onto the entire surface of the structure according to a spin-coating process at a rotation speed of from 1000 to 5000 rpm so that it covers the first interlayer insulating film 7 and the first wiring layer 8. The rotation speed is determined depending on the viscosity of the SOG coating solution or the thickness of the interlayer insulating film. Next, the film thus formed through the spin coating is subjected to first heat treatment in a diffusion furnace at 150° C. to 250° C. for 10 minutes or so. In that manner, a rigid and porous second interlayer insulating film 10 having a residual organic content of about 5% is formed, as in FIG. 1(e). Thus formed, the second interlayer insulating film 10 is subjected to second heat treatment in a diffusion furnace at 400° C. for 30 minutes. As a result, the second interlayer insulating film 10 becomes a porous film having a thickness of, for example, 500 nm or so and having uniform-size pores uniformly dispersing in the film. Finally, the relative dielectric constant of the second interlayer insulating film 10 could be from 1.5 to 2.5 or so.

In this, the atmosphere gas for the first and second heat treatment may be oxygen or nitrogen. When the first heat treatment is effected in an oxygen gas atmosphere, then the coating film formed by the spin coating operation could be readily porous, and even at 130° C. or so, a uniform porous layer can be formed. In the first heat treatment effected in a nitrogen gas atmosphere, the temperature for forming the intended porous structure is higher than that in the oxygen gas atmosphere. In the first heat treatment, the solvent of the SOG coating solution is removed and the sol-like coating film formed by the spin coating operation is gelled. When a readily-gelling SOG coating solution is used, then it is desirable that the first heat treatment is effected in an oxygen gas atmosphere. When a hardly-gelling SOG coating solution is used, then it is desirable that the first heat treatment is effected in a nitrogen gas atmosphere.

A contact hole 11 is formed through the first interlayer insulating film 7 and the second interlayer insulating film 10, and a second wiring layer 12 is formed of a metal such as aluminium (Al). Finally, a passivation film 13 is formed to cover the entire surface of the structure. In that manner, a two-layered wiring structure-having semiconductor device is formed, as in FIG. 1(e). Though not shown herein, many other semiconductor elements are formed on the silicon substrate 1.

In the manner as above, an interlayer insulating film having pores of high uniformity and having a low dielectric constant can be formed stably in a semiconductor device. The interlayer insulating film has good mechanical strength and good moisture absorption resistance. In addition, just as planed, a semiconductor device capable of being driven at high speed can be produced with high accuracy, and a high-reliability semiconductor device can be provided.

In Example 23, the same porous material as that for the second interlayer insulating film 10 may be applied also to the first interlayer insulating film 7. In this case, since the above-mentioned SOG coating solution is applied onto the entire surface of the structure in a mode of spin coating, the surface of the first interlayer insulating film 7 is made flat and it does not require CMP. However, in this case, it is desirable that a silicon nitride film having a thickness of at most 10 nm is formed on the entire surface, and the first interlayer insulating film 7 is formed on the silicon nitride film.

Further, in production of multi-layered wiring structure-having semiconductor devices, it is easy like in Example 23 to use a porous material formed of the above-mentioned SOG coating solution as the low-dielectric-constant interlayer insulating film in a damascene structure or dual-damascene structure that uses copper as the wiring metal. This is because the interlayer insulating film is a low-dielectric-constant insulating film formed at low temperatures and capable of undergoing heat treatment at 400° C. or so, as so mentioned hereinabove.

The embodiments mentioned hereinabove are to demonstrate the formation of a porous material by the use of a siloxane skeleton-having polycondensation compound (hydrogen or organic-containing compound with an Si—O structure as the main backbone thereof), to which, however, the invention should not be limited. Apart from these, the heat-decaying material of the invention is also applicable to production of porous materials of silicon-containing organic thin films having a main skeleton of an organic polymer. The inventors have confirmed that the organic insulating film of the type applicable to the invention include, for example, BCB films (organic film formed of divinylsiloxane-benzocyclobutene polymer) and polyallyl ether-Si bond-having organic insulating films. Further in addition to these, any other silicon-containing organic thin films having a main skeleton of organic polymer, which generally comprise organosiloxane or aromatic and/or hydrocarbon chain-containing organosiloxane, are also usable herein.

The above-mentioned porous organic thin films may be formed in any film-forming method of a spin-on-coating method or a plasma polymerization method. When a spin-on-coating method is employed, then a main skeleton material monomer is first applied onto a substrate along with a heat-decaying material thereonto in a mode of spin-on-coating. Then, the coated substrate is annealed whereby the monomer is thermally polymerized on the substrate to form a silicon-containing organic thin film having an organic polymer as the main skeleton thereof. When a plasma polymerization is employed, then a main skeleton material monomer and a monomer to give a heat-decaying material are vaporized to produce a monomer vapor. The monomer vapor is introduced into an inert gas and is further polymerized to form a silicon-containing organic thin film having an organic polymer as the main skeleton thereof.

Regarding the siloxane skeleton-having polycondensation compounds, insulating films of silsesquioxanes, or silica films containing at least one bond of Si—H bond, Si—$CH_3$ bond or Si—F bond may be formed. In this, the insulating films of silsesquioxanes include low-dielectric-constant films of methyl silsesquioxane, hydrogen silsesquioxane, methylated hydrogen silsesquioxane or fluorinated silsesquioxane.

The above-mentioned BCB film may have a silica content of about 20% and its relative dielectric constant before formed into a porous film may be 2.5 or so. A composite film of the type that comprises such an organic component and a silica component or silicon component may also be the organic insulating film. Further, a composite film that comprises the organic component and the silica component or a partly nitrided silicon component may also be the organic insulating film.

[Examples of Conductive Particles Transfer Sheets]

Example 31

A liquid resin composition prepared by adding 3 parts by weight of a diacylphosphine oxide compound (trade name, Irgacure 819, by Ciba Specialty Chemical) to 100 parts by weight of a crosslinkable silyl group-having polyoxypropylene resin (trade name, MS Polymer S303, by Kanegafuchi Chemical Industry) was cast into a sheet, exposed to UV ray and cured to obtain a resin sheet. The resulting resin sheet is an adhesive sheet having gel-like rubber elasticity.

Using a suction pad having a large number of vacuum suction nozzles, conductive fine particles (trade name, Micropearl SOL, by Sekisui Chemical Industry) were sucked, and then adhered to and disposed on an adhesive sheet to produce a conductive particles transfer sheet.

Next, the conductive particles transfer sheet was laid on a semiconductor chip packages having a large number of electrodes provided thereon, in such a manner that the position of the electrode of the semiconductor chip package could correspond to the position of the conductive fine particle and the conductive fine particle could be in direct contact with the electrode. This was processed with a solder reflow apparatus, and the conductive fine particle melt-bonded to the electrode and the adhesive sheet decayed.

[Examples of Transfer Sheets for Circuit Formation]

Example 31

A liquid resin composition prepared by adding 3 parts by weight of a diacylphosphine oxide compound (trade name, Irgacure 819, by Ciba Specialty Chemical) to 100 parts by weight of a crosslinkable silyl group-having polyoxypropylene resin (trade name, MS Polymer S303, by Kanegafuchi Chemical Industry) was applied onto the surface of a polyethylene terephthalate (PET) film having a thickness of 25 µm to form thereon a coating layer that could have a dry thickness of 10 µm. This was exposed to UV rays and cured to obtain an adhesive sheet. The resulting sheet was sticky, and have gel-like rubber elasticity. Next, an electrolytic copper foil having a thickness of 12 µm was stuck to the adhesive sheet to produce a copper foil-stuck adhesive sheet.

A dry film resist was stuck to the copper foil side of the copper foil-stuck adhesive sheet produced in the above, and this was exposed to light through a circuit-patterned photomask having a line width of 30 µm and a line-to-line distance of 30 µm, then developed and etched, and the resist was stripped away and washed to give a transfer sheet for circuit formation.

The copper foil circuit pattern side of the thus-obtained transfer sheet for circuit formation was positioned to a semi-cured, insulating substrate formed of glass epoxy, and hot-pressed in a nitrogen atmosphere at 130° C. to thereby bond the copper foil circuit pattern to the insulating substrate. Next, this was put into an oven at 180° C. in a nitrogen atmosphere, whereupon the heat-decaying resin decayed and the adhesive sheet peeled off, accordingly, the circuit pattern was accurately transferred onto the insulating substrate.

Example 32

In the same manner as in Example 31, a transfer sheet for circuit formation was fabricated which had a circuit pattern formed on the surface of an adhesive sheet but in which the line width of the circuit pattern was 20 µm.

The copper foil circuit pattern side of the thus-obtained transfer sheet for circuit formation was positioned to a semi-cured, insulating substrate formed of glass epoxy, and hot-pressed in a nitrogen atmosphere at 130° C. to thereby bond the copper foil circuit pattern to the insulating substrate. Next, this was put into an oven at 180° C. in a nitrogen atmosphere, and heated therein until the heat-decaying resin could decay and the adhesive sheet could peel off. When the hot-pressing was effected in a nitrogen atmosphere and when the structure was put into an oven, the decomposition gas was not generated all at a time and the circuit pattern having a line width of 20 μm was accurately transferred onto the insulating substrate since the oxygen concentration was kept low.

Example 33

A transfer sheet for circuit formation was fabricated in the same manner as in Example 31. The copper foil circuit pattern side of the thus-obtained transfer sheet for circuit formation was positioned to a ceramic green sheet, and hot-pressed at 130° C. whereby the copper foil circuit pattern was bonded to the ceramic green sheet. Next, this was put into an oven at 180° C. in a nitrogen atmosphere, whereupon the heat-decaying resin decayed and the adhesive sheet peeled off, accordingly, the circuit pattern was accurately transferred onto the ceramic green sheet.

Example 34

Figure 9:
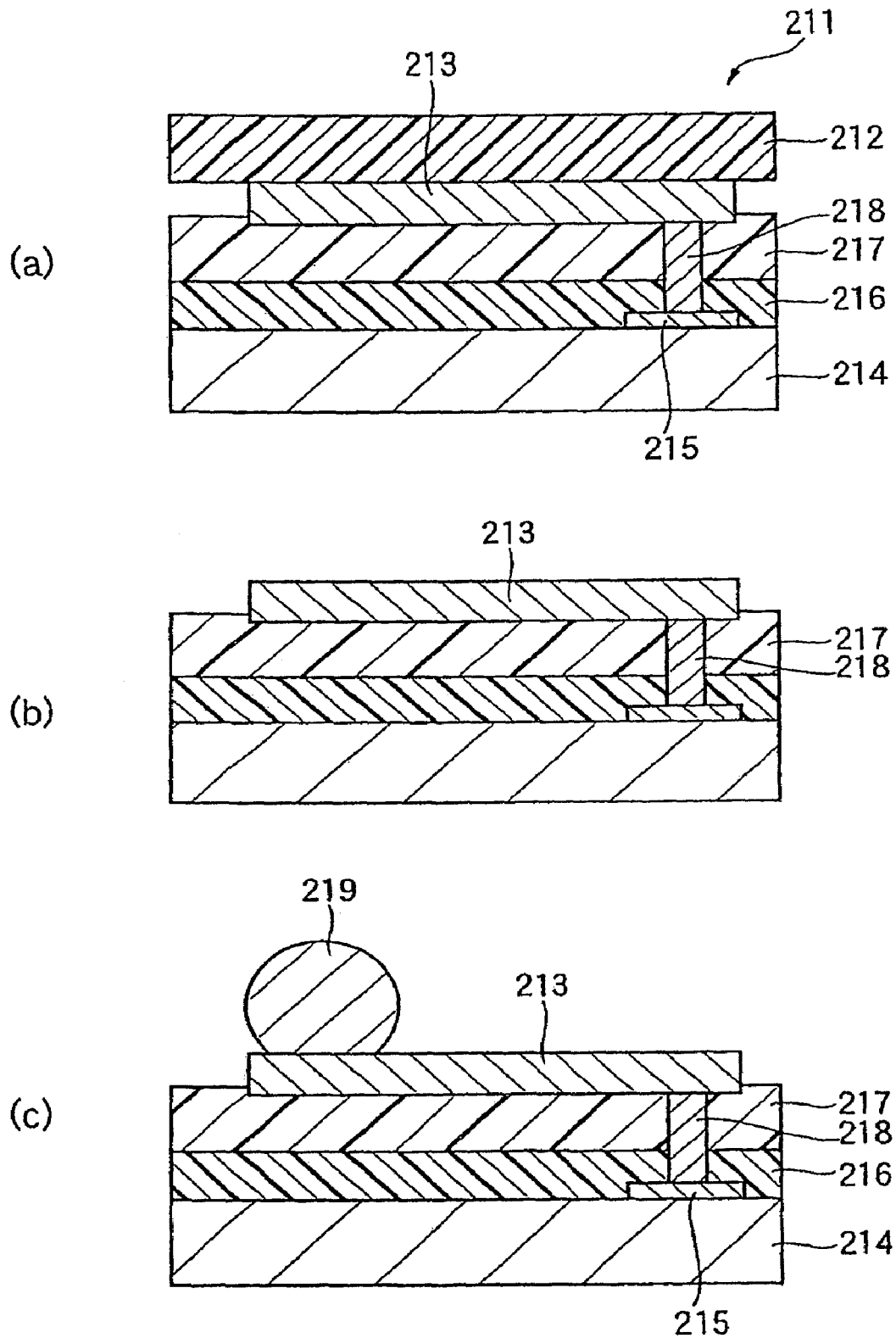
FIG. 9 includes cross-sectional views of a process scheme of forming rearranged wiring on semiconductor chips.
Figure 10:
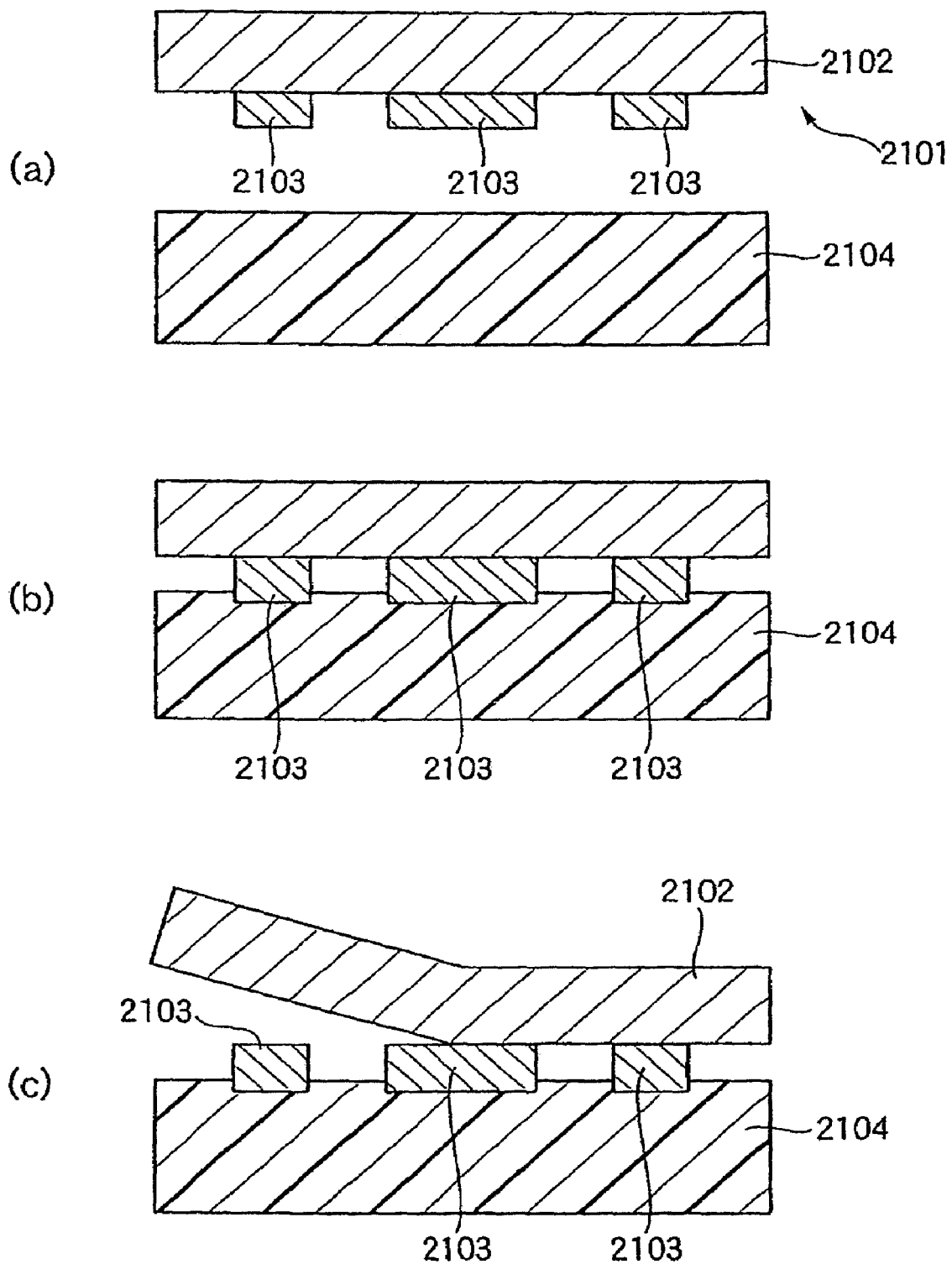
FIG. 10 includes cross-sectional views of a process scheme of producing a circuit board for explaining a prior art.

Using a transfer sheet for circuit formation that comprises a heat-decaying material of the invention, rearranged wirings are formed on a semiconductor chip to form bumps for high-density packaging. This Example is to demonstrate it. This is described with reference to FIG. 9.

As in FIG. 9(a), an adhesive sheet 212 is formed in the same manner as in Example 31, and a metal layer 213 of copper for rearrangement wiring is formed on its surface to prepare a transfer sheet 211 for circuit formation. The line width of the metal layer 213 is 10 μm or so, and the thickness thereof is 5 μm or so. A semiconductor device, which comprises a semiconductor chip 214, an electrode pad 215 connected to the wiring layer inside the semiconductor chip 214, and an insulating substrate 217 bonded to the semiconductor chip 214 via an adhesive layer 216 therebetween, and in which a through-hole is formed to run through the insulating substrate 217 and the adhesive layer 216 to reach the electrode pad 215, and is filled with a conductive substance 218, is bonded to the transfer sheet 211 for circuit formation in a mode of hot-pressing in a nitrogen atmosphere at 130° C. In this, the insulating substrate 217 is formed of a flexible material such as polyimide tape or a rigid material such as FR-4. The adhesive layer 216 is formed of a thermosetting or thermoplastic adhesive.

Next, in a nitrogen atmosphere, this is subjected to heat treatment in an oven at a temperature of 150° C. Through the heat treatment, the adhesive sheet 212 pyrolyzed and completely decayed. Then, as in FIG. 9(b), the metal layer 23 to be rearrangement wiring is connected to the conductive substance 218 and is transferred onto the surface of the insulating substrate 217, and a semiconductor device is thus constructed. Further, as in FIG. 9(c), a solder bump 219 is melt-bonded onto the rearrangement wiring of the metal layer 213, at a temperature of 190° C. or so according to a known method.

In that manner, the semiconductor device is completed, which comprises the semiconductor chip 214, the electrode pad 215 connected to the wiring layer inside the semiconductor chip 214, the insulating substrate 217 bonded to the semiconductor chip 214 via the adhesive layer 216 therebetween, the conductive substance 218 filled in the through-holes that runs through the insulating substrate 217 and the adhesive layer 216 to reach the electrode pad 215, and which further comprises the metal layer 213 for rearrangement wiring that is electrically connected to the electrode pad 215 through the conductive substance 218, and the solder bump 219 for connecting the device to an external packaging substrate. In the semiconductor device thus fabricated, the rearrangement wiring can be readily varied in accordance with the external packaging wiring substrate, and therefore the semiconductor device of the type has a broad latitude to satisfy various service conditions for various customers. Accordingly, the invention promotes fabrication of custom-made semiconductor devices in practicable packaging level. In addition, in the formation of the rearrangement wiring in the invention as above, the heating temperature is 200° C. or lower (solder bump-forming temperature) and is relatively low, and therefore, this does not change at all the properties of semiconductor chips. Accordingly, in the invention, electronic structures of CSP (chip-size package) semiconductor devices can be readily produced.

The invention has been described in detail hereinabove with reference to its specific embodiments, but it is obvious to those skilled in the art that various changes and modifications can be made on the embodiments not overstepping the sprit and the scope of the invention.

This application is based on a Japanese patent application filed on Nov. 29, 2002 (Patent Application No. 2002-349192), a Japanese patent application filed on Nov. 29, 2002 (Patent Application No. 2002-349194), a Japanese patent application filed on Nov. 29, 2002 (Patent Application No. 2002-349195), a Japanese patent application filed on Feb. 3, 2003 (Patent Application No. 2003-26330), a Japanese patent application filed on Feb. 26, 2003 (Patent Application No. 2003-49842), and a Japanese patent application filed on Nov. 25, 2003 (Patent Application No. 2003-394620), the entire contents of which are incorporated hereinto by reference.

INDUSTRIAL APPLICABILITY

The heat-decaying material of the invention hardly deteriorates and decomposes at ordinary service temperatures, and when heated at relatively low temperatures, they may decay within a short period of time.

According to the method for producing a porous material by the use of the heat-decaying material of the invention, a precursor is prepared which contains a skeleton-forming crosslinkable material (a) and the heat-decaying material (b) of the invention that comprises a polyoxyalkylene resin as the principal ingredient thereof and decomposes and evaporates when heated, and the precursor is heated at a temperature not lower than the temperature at which the heat-decaying material decays under heat, whereby the heat-decaying material is decayed to form a large number of pores, and a porous material having as the matrix thereof, a crosslinked skeleton phase of the crosslinkable material (a) can be obtained. Accordingly, a porous material can be produced in a relatively simple process.

Moreover, a precursor may be prepared by dispersing the heat-decaying material (b) in the skeleton-forming crosslinkable material (a), and when the heat-decaying material is merely uniformly dispersed therein, then a porous material having uniformly dispersed pores can be readily obtained. In addition, when the particle size of the dispersed particles of the heat-decaying material is controlled, then relatively large pores can be readily formed and a porous material having uniform-size pores can be readily produced. Further, since the heat-decaying material completely decays when heated, it leaves little residue and does not almost increase the dielectric constant of the structure where the heat-decaying material has been decayed.

Therefore, according to the production method of the invention, it is possible to readily provide a porous material having a low dielectric constant with little fluctuation of dielectric characteristics, and to readily provide electronic parts having an interlayer insulating film formed of the porous material.

When the heat-decaying material of the invention is used, then conductive fine particles may be disposed accurately on the electrodes of electronic parts, not being shifted or dropped away. In addition, multiple electroconductive fine particles may be surely and readily connected to the electrodes of electronic parts all at a time. To that effect, the invention provides a conductive particles transfer sheet and a method for connecting conductive fine particles to electrodes, satisfying the requirements.

The electronic parts are meant to include semiconductor chips, resin-encapsulated semiconductor devices, packaging substrates such as printed boards on which these electronic parts are to be mounted. However, when a CSP process is employed, conductive fine particles may be formed on a semiconductor wafer, and therefore semiconductor wafers are also within the scope of the electronic parts.

The conductive particles transfer sheet has conductive fine particles disposed in predetermined positions of a heat-decaying sheet. When heated, the sheet itself decays. Therefore, the transfer sheet is effective for bonding bumps or solder balls onto electronic parts such as semiconductor chips.

The transfer sheet for circuit formation that comprises the heat-decaying material of the invention comprises an adhesive sheet having thereon a heat-decaying resin capable of decomposing under heat, a resin composition containing such a heat-decaying resin, or a composite film comprising such a heat-decaying resin. When the circuit pattern is transferred from the sheet, then the adhesive sheet decays or its adhesive force lowers owing to the vapor generated through decomposition of the heat-decaying resin. Therefore, even when the adhesive sheet has a high adhesive force or even when it has a circuit pattern having an extremely narrow line width and when the circuit pattern is transferred from it, the circuit pattern can be well transferred onto an insulating substrate or a ceramic green sheet with no pattern disturbance. Accordingly, the invention makes it possible to produce circuit boards having further increased wiring density and enabling higher-density packaging, with high accuracy and at high producibility.

Using the transfer sheet for circuit formation of the invention, it is possible to transfer circuit patterns even onto substrates for liquid-crystal display panels, plasma display panels, etc.

According to the patterning method to be attained by the use of the heat-decaying material of the invention, pattern formation may be significantly simplified as compared with conventional photolithography. Accordingly, the invention makes it possible to further improve the accuracy in patterning technology for various materials and to further reduce the cost of patterning. As a result, the production costs of semiconductor devices can be thereby significantly reduced.

The invention claimed is:

1. A heat-decaying material comprising a polyoxyalkylene resin as the principal ingredient thereof, which has an oxygen atom content of from 15 to 55% by mass, and a decomposition promoter;
and of which at least 95% by weight decays within 10 minutes when heated at a predetermined temperature falling between 150 and 350° C.

2. The heat-decaying material as claimed in claim 1, wherein the polyoxyalkylene resin is polyoxypropylene, polyoxyethylene, polyoxytetramethylene, or a mixed resin of polyoxypropylene, polyoxyethylene and/or polyoxytetramethylene.

3. The heat-decaying material as claimed in claim 2, wherein the polyoxypropylene content of the mixed resin is at least 50% by mass.

4. The heat-decaying material as claimed in claim 1, wherein the polyoxyalkylene resin has a number-average molecular weight of from 500 to 5,000,000.

5. The heat-decaying material as claimed in claim 1, wherein the decomposition promoter is a peroxide.

6. The heat-decaying material as claimed in claim 1, wherein the decomposition promoter is an azo compound.

7. The heat-decaying material as claimed in claim 1, wherein the decomposition promoter is tin oxide.

8. The heat-decaying material as claimed in claim 1, which decays when heated in an oxygen-containing atmosphere at a predetermined temperature falling between 150 and 300° C.

9. The heat-decaying material as claimed in claim 1, which decays when heated in an anaerobic atmosphere at a predetermined temperature falling between 150 and 350° C.

10. The heat-decaying material as claimed in claim 1, which decays when heated under reduced pressure within 5 minutes at a predetermined temperature falling between 150 and 350° C.

11. A heat-decaying material of a heat-decaying sheet which is composed of the heat-decaying material of claim 1 and which keeps its sheet form at a temperature of 100° C. or lower.

12. The heat-decaying material as claimed in claim 11, wherein the polyoxyalkylene resin is not crosslinked and has a number-average molecular weight of from 5000 to 5,000,000.

13. The heat-decaying material as claimed in claim 11, wherein the heat-decaying sheet contains a crosslinked polyoxyalkylene resin.

14. The heat-decaying material as claimed in claim 13, wherein the crosslinked polyoxyalkylene resin is formed by crosslinking a crosslinkable functional group-having polymer that contains segments of a crosslinkable functional group-having polyalkylene glycol or polyoxyalkylene, with a crosslinking agent.

15. The heat-decaying material as claimed in claim 14, wherein the crosslinkable functional group is at least one selected from a hydrolyzing silyl group, an isocyanate group, an epoxy group, an oxetanyl group, an acid anhydride group, a carboxyl group, a hydroxyl group, and a polymerizable unsaturated hydrocarbon group.

16. The heat-decaying material as claimed in claim 11, wherein the heat-decaying sheet contains an uncrosslinked polymer that contains segments of an uncrosslinked polyalkylene glycol or polyoxyalkylene.

17. The heat-decaying material as claimed in claim 11, wherein the heat-decaying sheet is reinforced with a substrate.

18. The heat-decaying material as claimed in claim 11, which decays at a temperature falling between 150 and 220° C.

19. The heat-decaying material as claimed in claim 11, which decays at a temperature falling between 220 and 280° C.

20. The heat-decaying material as claimed in claim 11, which decays at a temperature falling between 280 and 350° C.

21. A heat-decaying material comprising the heat-decaying material of claim 1, which contains a crosslinkable functional group-having polymer that contains segments of a crosslinkable functional group-having polyoxyalkylene glycol or polyoxyalkylene, and a crosslinking agent, and which has a viscosity at 20° C. of from 1 to 5,000,000 mPa's.

22. The heat-decaying material as claimed in claim 21, which contains at most 30% by mass of a polymerizable unsaturated group-having compound.

23. The heat-decaying material as claimed in claim 21, which has a viscosity at 20° C. of from 1 to 100 mPas.

24. The heat-decaying material as claimed in claim 21, which has a viscosity at 20° C. of from 500 to 100,000 mPas.

25. The heat-decaying material as claimed in claim 21, which has a viscosity at 20° C. of from 20 to 1000 mPas.

26. The heat-decaying material as claimed in claim 21, wherein a cured product of the material decays at a temperature falling between 150 and 220° C.

27. The heat-decaying material as claimed in claim 21, wherein a cured product of the material decays at a temperature falling between 220 and 280° C.

28. The heat-decaying material as claimed in claim 21, wherein a cured product of the material decays at a temperature falling between 280 and 350° C.

29. The heat-decaying material as claimed in claim 21, wherein the crosslinkable functional group is at least one selected from a hydrolyzing silyl group, an isocyanate group, an epoxy group, an oxetanyl group, an acid anhydride group, a carboxyl group, a hydroxyl group, and a polymerizable unsaturated hydrocarbon group.

30. A method for producing a porous material, which comprises:
a step of preparing a precursor that contains a skeleton-forming crosslinkable material (a) and the heat-decaying material (b) of claim 1 that comprises a polyoxyalkylene resin as the principal ingredient thereof and decomposes and evaporates when heated;
a step of heating the precursor at a temperature not lower than the temperature at which the heat-decaying material (b) decays under heat;
a step of crosslinking the crosslinkable material before or during the heating to form a skeleton phase,
and in which the heat-decaying material (b) decays in the crosslinked material to give a porous material having a large number of pores surrounded by the skeleton phase.

31. A transfer sheet constructed by adhering a transfer object on a heat-decaying adhesive resin layer that comprises the heat-decaying material of claim 1.

32. A patterning method, which comprises a step of forming a heat-decaying resin film of the heat-decaying material of claim 1 on the surface of a substrate to be processed, and a step of selectively applying thermal energy to the heat-decaying resin film so as to decay the heat-decaying resin film in the thermal energy-irradiated area to thereby form a pattern of the heat-decaying resin film.

33. A patterning method, which comprises:
a step of forming a heat-decaying resin film of the heat-decaying material of claim 1 on the surface of a substrate to be processed;
a step of transferring a pattern formed in a photomask to the heat-decaying resin material through exposure of the material to light; and
a step of heating the heat-decaying resin film after the exposure transfer step for selectively decaying the heat-decaying resin film in the region not exposed to light in the previous exposure transfer step to thereby form a pattern of the heat-decaying resin film.

\* \* \* \* \*